(12) United States Patent
Yamazaki et al.

(10) Patent No.: US 6,891,195 B2
(45) Date of Patent: *May 10, 2005

(54) SEMICONDUCTOR DEVICE AND METHOD OF FABRICATING THE SAME

(75) Inventors: Shunpei Yamazaki, Atsugi (JP); Jun Koyama, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/207,822

(22) Filed: Jul. 31, 2002

(65) Prior Publication Data

US 2002/0190321 A1 Dec. 19, 2002

Related U.S. Application Data

(62) Division of application No. 09/464,200, filed on Dec. 16, 1999, now Pat. No. 6,469,317.

(30) Foreign Application Priority Data

Dec. 18, 1998 (JP) .......................................... 10-361535

(51) Int. Cl.[7] ...................... H01L 31/036; H01L 31/20; H01L 29/04; H01L 31/0376; H01L 31/112
(52) U.S. Cl. ...................... 257/59; 257/288; 257/289; 257/290; 257/291
(58) Field of Search .......................... 257/59, 288, 289, 257/290

(56) References Cited

U.S. PATENT DOCUMENTS

| 3,933,529 A | 1/1976 | Goser |
| 4,963,504 A | 10/1990 | Huang |
| 5,015,599 A | 5/1991 | Verhaar |
| 5,182,619 A | 1/1993 | Pfiester |
| 5,247,190 A | 9/1993 | Friend et al. |
| 5,323,042 A | * 6/1994 | Matsumoto ................. 257/350 |
| 5,399,502 A | 3/1995 | Friend et al. |
| 5,412,240 A | 5/1995 | Inoue et al. |
| 5,482,871 A | 1/1996 | Pollack |
| 5,532,175 A | 7/1996 | Racanelli et al. |

(Continued)

FOREIGN PATENT DOCUMENTS

| JP | 03-250632 | 11/1991 |
| JP | 04-369271 | 12/1992 |
| JP | 05-055477 | 3/1993 |
| JP | 05-102483 | 4/1993 |
| JP | 05-188401 | 7/1993 |

(Continued)

OTHER PUBLICATIONS

Hermann Schenk et al., "Polymers for Light Emitting Diodes," EuroDisplay '99 Proceedings, pp. 33–37.

(Continued)

Primary Examiner—Jerome Jackson
Assistant Examiner—Jesse A. Fenty
(74) Attorney, Agent, or Firm—Eric J. Robinson; Robinson Intellectual Property Law Office, P.C.

(57) ABSTRACT

The purpose of the present invention is to provide a reliable semiconductor device comprising TFTs having a large area integrated circuit with low wiring resistance. One of the features of the present invention is that an LDD region including a region which overlaps with a gate electrode and a region which does not overlap with the gate electrode is provided in one TFT. Another feature of the present invention is that gate electrode comprises a first conductive layer and a second conductive layer and portion of the gate wiring has a clad structure comprising the first conductive layer and the second conductive layer with a low resistance layer interposed therebetween.

144 Claims, 32 Drawing Sheets

U.S. PATENT DOCUMENTS

| | | |
|---|---|---|
| 5,543,340 A | 8/1996 | Lee |
| 5,543,947 A | 8/1996 | Mase et al. |
| 5,567,966 A | 10/1996 | Hwang |
| 5,581,092 A | 12/1996 | Takemura |
| 5,594,569 A | 1/1997 | Konuma et al. |
| 5,616,506 A | 4/1997 | Takemura |
| 5,623,157 A | 4/1997 | Miyazaki et al. |
| 5,643,826 A | 7/1997 | Ohtani et al. |
| 5,686,328 A | 11/1997 | Zhang et al. |
| 5,693,959 A | 12/1997 | Inoue et al. |
| 5,719,588 A | 2/1998 | Johnson |
| 5,767,930 A | 6/1998 | Kobayashi et al. |
| 5,773,330 A | 6/1998 | Park |
| 5,841,170 A | 11/1998 | Adan et al. |
| 5,858,820 A | 1/1999 | Jung et al. |
| 5,903,249 A | 5/1999 | Koyama et al. |
| 5,912,492 A | 6/1999 | Chang et al. |
| 5,923,961 A | 7/1999 | Shibuya et al. |
| 5,923,962 A | 7/1999 | Ohtani et al. |
| 5,981,367 A | 11/1999 | Gonzalez |
| 6,160,279 A | 12/2000 | Zhang et al. |
| 6,165,824 A | 12/2000 | Takano et al. |
| 6,166,396 A | 12/2000 | Yamazaki |
| 6,180,957 B1 | 1/2001 | Miyasaka et al. |
| 6,198,133 B1 | 3/2001 | Yamazaki et al. |
| 6,259,120 B1 | 7/2001 | Zhang et al. |
| 6,259,138 B1 | 7/2001 | Ohtani et al. |
| 6,259,144 B1 | 7/2001 | Gonzalez |
| 6,281,552 B1 | 8/2001 | Kawasaki et al. |
| 6,285,042 B1 | 9/2001 | Ohtani et al. |
| 6,335,541 B1 | 1/2002 | Ohtani et al. |
| 6,365,933 B1 | 4/2002 | Yamazaki et al. |
| 6,469,317 B1 * | 10/2002 | Yamazaki et al. ............ 257/59 |
| 6,501,098 B2 | 12/2002 | Yamazaki |
| 2002/0163049 A1 | 11/2002 | Yamazaki et al. |
| 2003/0054653 A1 | 3/2003 | Yamazaki et al. |
| 2003/0122132 A1 | 7/2003 | Yamazaki |

FOREIGN PATENT DOCUMENTS

| | | |
|---|---|---|
| JP | 07-130652 | 5/1995 |
| JP | 07-202210 | 8/1995 |
| JP | 08-078329 | 3/1996 |
| JP | 10-092576 | 4/1998 |
| JP | 10-135468 | 5/1998 |
| JP | 10-135469 | 5/1998 |
| JP | 10-247735 | 9/1998 |
| WO | WO 90/13148 | 11/1990 |

OTHER PUBLICATIONS

Furue et al., Characteristics and Driving Scheme of Polymer–Stablized Monostable FLCD Exhibiting Fast Response Time and High Contrast Ratio with Gray–Scale Capability, SID 98 DIGEST, pp. 782–785.

Yoshida et al., "A Full–Color Thresholdless Antiferroelectric LCD Exhibiting Wide Viewing Angle with Fast Response Time," SID 97 DIGEST, pp. 841–844.

Inui et al., "Thresholdless Antiferroelectricity in Liquid Crystals and its Application to Displays," J. Mater. Chem., 1996, 6(4), pp. 671–673.

Hatano et al., "A Novel Self–aligned Gate–overlapped LDD Poly–Si TFT with High Reliability and Performance," IEDM Technical Digest 97, pp. 523–526.

Specification, claims, abstract and drawings of U.S. Appl. No. 08/951,193 entitled Semiconductor Device and Manufacturing Method Thereof.

* cited by examiner

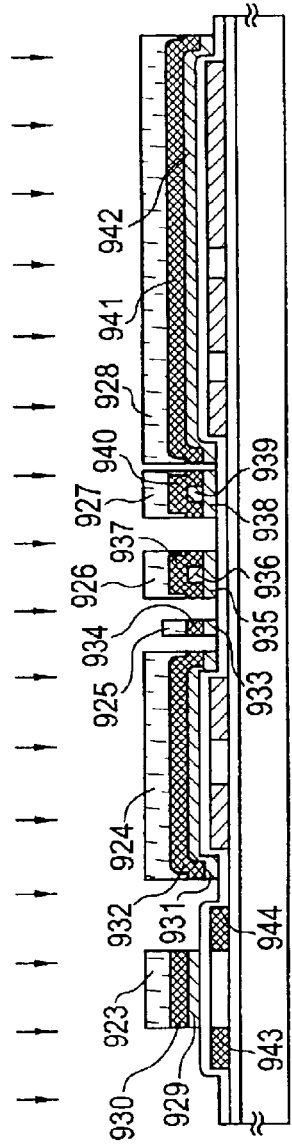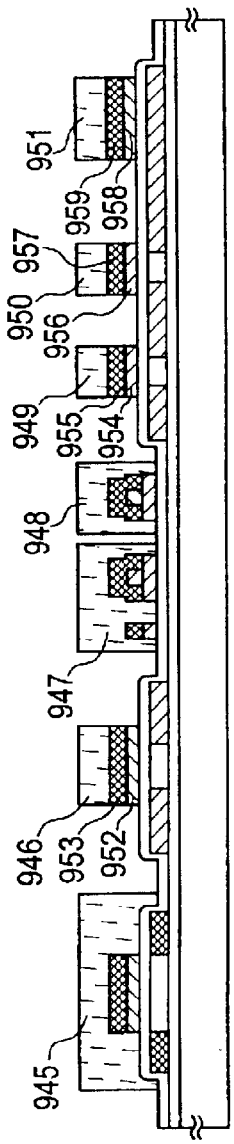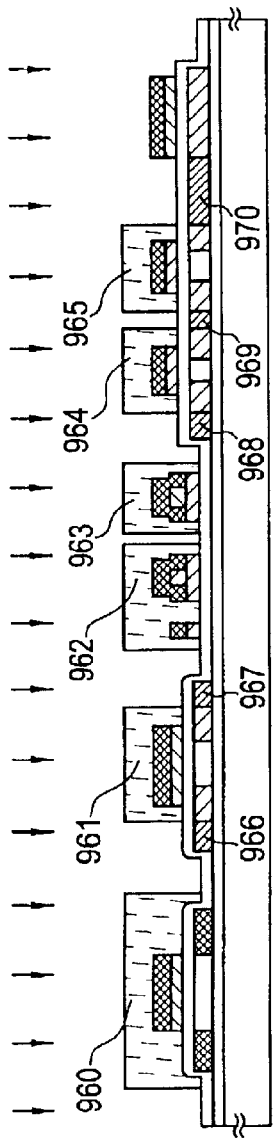

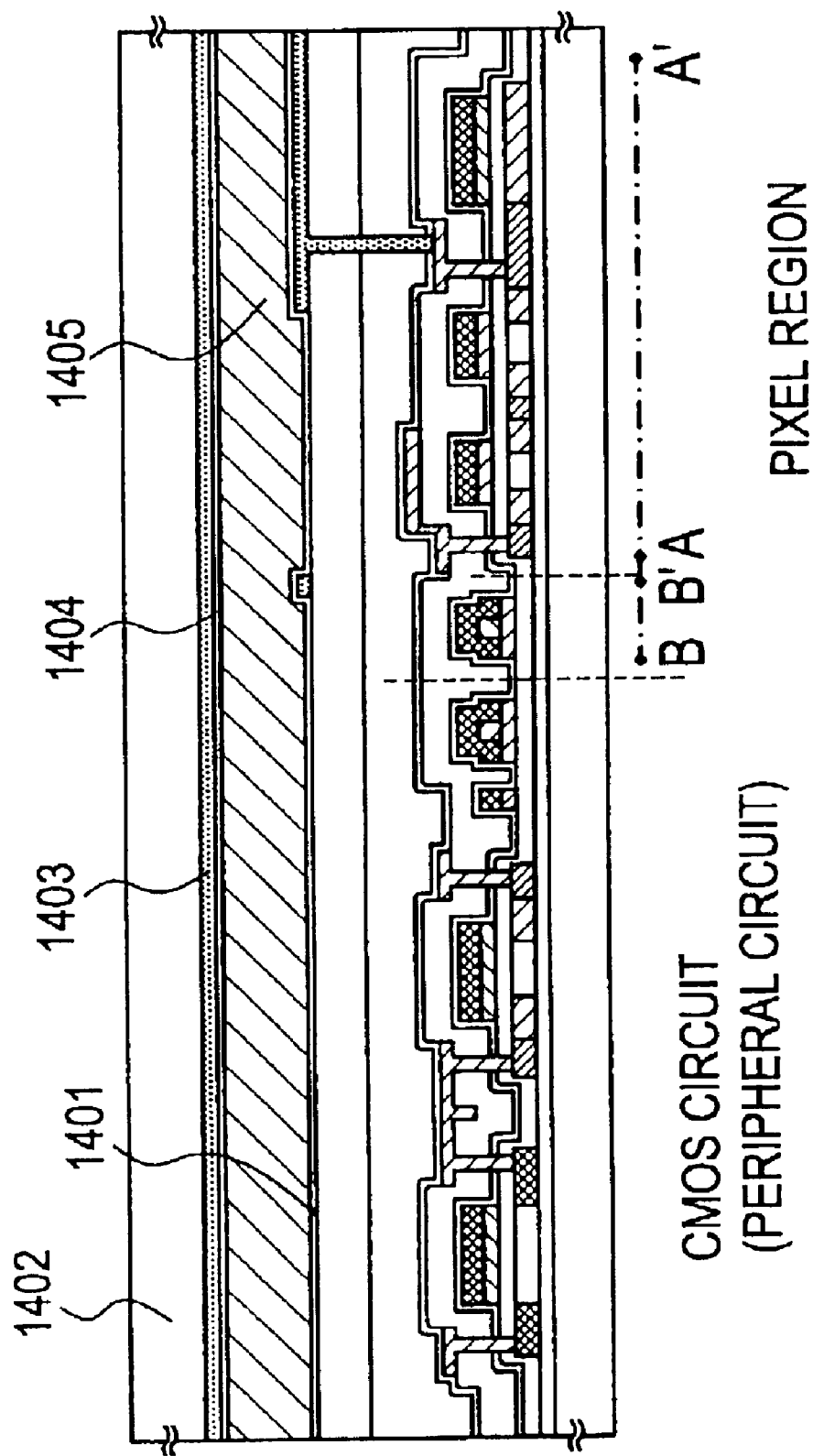

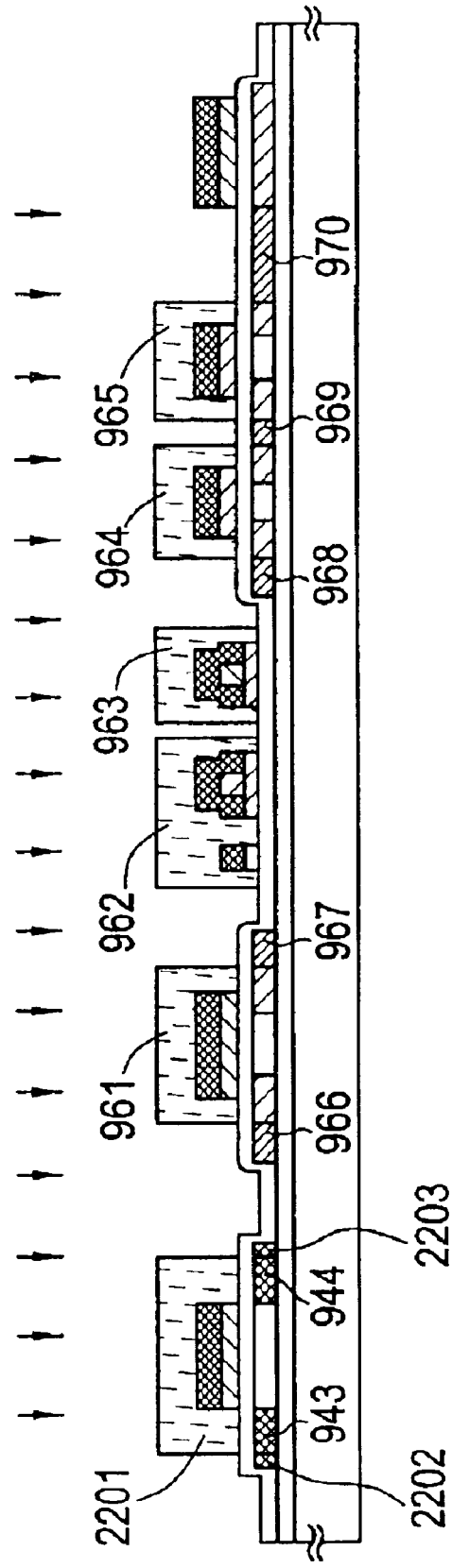
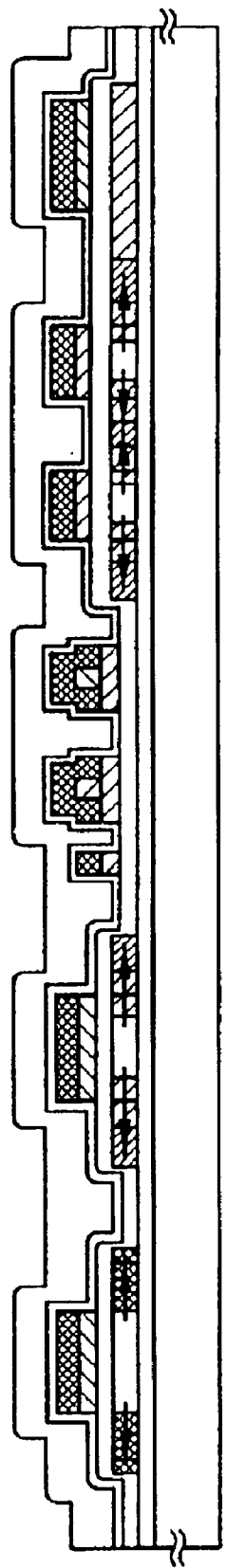
FIG. 22A
FIG. 22B

FIG. 26A
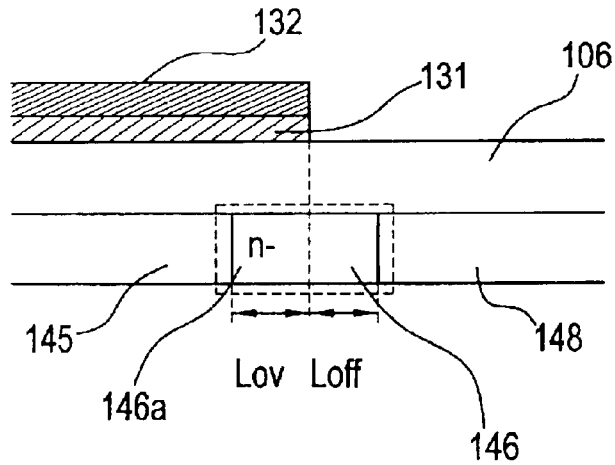
FIG. 26B
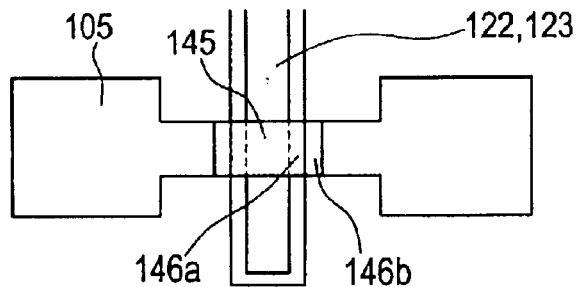
FIG. 26C
| | TFT Driving Voltage (V) | Channel Length (μm) | Lov (μm) | Loff (μm) |
|---|---|---|---|---|
| Driver Circuit TFT (Buffer Circuit) | 16 ± 2 | 5.0 ± 1.5 | 2.5 ± 0.3 | 2.5 ± 0.5 |
| | 20 ± 3 | 5.0 ± 2.0 | 3.0 ± 0.5 | 3.0 ± 0.5 |
| Driver Circuit TFT (Shift Register Circuit) | 5 ± 1 | 3.0 ± 1.0 | 0.5 ± 0.3 | 0.5 ± 0.3 |
| | 10 ± 1 | 3.5 ± 1.0 | 2.0 ± 0.3 | 1.0 ± 0.5 |
| Analog Switch TFT | 16 ± 2 | 3.0 ± 1.0 | 1.5 ± 0.5 | 1.5 ± 0.5 |
| Pixel Circuit TFT | 16 ± 2 | 3.0 ± 1.0 | 1.5 ± 0.5 | 1.5 ± 0.5 |

SEMICONDUCTOR DEVICE AND METHOD OF FABRICATING THE SAME

This application is a divisional application of Ser. No. 09/464,200, filed Dec. 16, 1999, which is now U.S. Pat. No. 6,469,317.

BACKGROUND OF THE INVENTION

1. Field of the Invention

The present invention relates to a semiconductor device including a circuit comprising a thin film transistor (hereinafter referred to as a TFT) over a substrate having an insulating surface and a method of fabricating the same. Particularly, the invention relates to a structure of an electro-optical device typified by a liquid crystal display device, and an electronic equipment incorporating the electro-optical device, or relates to a structure of an electro-optical device typified by an EL (electro luminescence) display device using an EL material capable of obtaining electro luminescence, and an electronic equipment incorporating the electro-optical device.

Incidentally, in the present specification, the term "semiconductor device" indicates any devices functioning by using semiconductor characteristics, and includes the foregoing electro-optical device and the electronic equipment incorporating the electro-optical device in its category.

2. Description of the Related Art

A semiconductor device including a large area integrated circuit made of TFTs is under development. An active matrix type liquid crystal display device, an EL display device, and a contact type image sensor are its typical examples.

The TFT can be classified according to its structure and fabricating method. Particularly, since a TFT (crystalline TFT) including a semiconductor film having crystal structure as an active layer has a high field effect mobility, it has been possible to form various functional circuits.

In the present specification, the semiconductor film having the crystal structure includes a single crystal semiconductor, a polycrystal semiconductor, and a microcrystal semiconductor, and further, includes a semiconductor disclosed in Japanese Patent Application Laid-open No. Hei. 7-130652, No. Hei. 8-78329, No. Hei. 10-135468, No. Hei. 10-247735, or No. Hei. 10-135469. The disclosure of the above Japanese Patent Applications is incorporated with herein by reference.

In an active matrix type liquid crystal display device, for every functional block, a pixel region (also called a pixel matrix circuit) comprising n-channel TFTs and a driver circuit including a CMOS circuit as a basic unit, such as a shift register circuit, a level shifter circuit, a buffer circuit, and a sampling circuit, are formed over one substrate.

In the contact type image sensor, an integrated circuit such as a sample-and-hold circuit, a shift register circuit, and a multiplexer circuit is formed by using TFTs.

Since these circuits do not necessarily have the same operation condition, characteristics required for TFTs have been naturally different not a little from one another.

The characteristics of a field effect transistor such as a TFT can be considered by dividing them into a linear region where a drain current increases in proportion to a drain voltage, a saturation region where even if a drain voltage is increased, a drain current is saturated, and a cut-off region where even if a drain voltage is applied, a current does not flow ideally. In the present specification, the linear region and the saturation region are referred to as an ON region of a TFT, and the cut-off region is referred to as an OFF region. For convenience, a drain current in the ON region is referred to as an ON current, and a current in the OFF region is referred to as an OFF current.

A pixel portion comprises a switching element made of an n-channel TFT (hereinafter referred to as a pixel TFT) and an auxiliary holding capacitance, and applies a voltage to a liquid crystal to drive it. Here, the liquid crystal is required to be driven by an alternating current, and a system called frame inversion driving has been adopted. Thus, as characteristics of TFTs to be required, it has been necessary that the OFF current is sufficiently reduced.

Since a buffer circuit of a driver circuit is applied with a high driving voltage, it has been necessary to increase withstand voltage. Besides, in order to increase current driving performance, it has been necessary to sufficiently secure the ON current.

However, there has been a problem that the OFF current of a crystalline TFT is apt to become high. The crystalline TFT has been regarded as being inferior to a MOS transistor (transistor fabricated on a single crystal semiconductor substrate) used for an LSI or the like in reliability. For example, a deterioration phenomenon such as a lowering of ON current has been sometimes observed in the crystalline TFT. It has been considered that this cause is a hot carrier effect, and hot carriers generated by a high electric field in the vicinity of a drain cause the deterioration phenomenon.

As a structure of a TFT, a low concentration drain (LDD: Lightly Doped Drain) structure has been known. In this structure, an impurity region having a low concentration is provided between a channel forming region and a source region or drain region added with an impurity at a high concentration, and this low concentration impurity region is called an LDD region.

According to positional relation to a gate electrode, the LDD structure includes a GOLD (Gate-drain Overlapped LDD) structure where it overlaps with the gate electrode, an LDD structure where it does not overlap with the gate electrode, and the like. The GOLD structure has been able to relieve a high electric field in the vicinity of a drain, to prevent the hot carrier effect, and to improve the reliability. For example, in "Mutsuko Hatano, Hajime Akimoto and Takeshi Sakai, IDEM 97 TECHNICAL DIGEST, p 523-526, 1997", it is ascertained that extremely excellent reliability can be obtained in the GOLD structure of a side wall comprising silicon as compared with TFTs of other structures.

On the other hand, as another problem in relation to a large area integrated circuit, there has been a problem of wiring. An integrated circuit comprising TFTs is provided with a gate wiring line connected to a gate electrode and a data wiring line connected to a source electrode or drain electrode. Particularly, the gate wiring line has a problem of a wiring delay due to influence of parasitic capacitance and wiring resistance. Although a material such as molybdenum (Mo), tantalum (Ta), or tungsten (W) has been used for the gate electrode and the gate wiring line in view of heat resistance, these have a sheet resistivity of about 10 Ů, and have not been suitable for a large area integrated circuit. It has been originally preferable to use a low resistance material such as aluminum (Al) or copper (Cu).

However, the GOLD structure has a problem that the OFF current becomes high as compared with a normal LDD structure, and it has not been necessarily preferable to form all TFTs with the GOLD structure in a large area integrated circuit. For example, in a pixel TFT, if the OFF current is increased, a power consumption is increased and an abnormality appears on image display. Thus, it has not been preferable to apply a crystalline TFT of the GOLD structure as it is.

Moreover, the LDD structure has a problem that the ON current is decreased by an increase of series resistance. Although the ON current can be freely designed through a channel width of a TFT and the like, for example, it has not been always necessary to provide the LDD structure in the TF1 constituting a buffer circuit.

SUMMARY OF THE INVENTION

The present invention has a problem of providing a TFT with an optimum structure for every functional circuit in a semiconductor device including a large area integrated circuit typified by an active matrix type liquid crystal display device, an EL display device, and an image sensor. Besides, the invention has a problem of providing a method of fabricating such TFTs on the same substrate through the same steps.

Moreover, the invention has a problem of providing a wiring structure in which a reduction in wiring resistance is compatible with an increase in integration in a semiconductor device including a large area integrated circuit typified by an active matrix type liquid crystal display device, an EL display device, and an image sensor.

The present invention relates to a technique to solve such problems, and has an object to realize a crystalline TFT capable of obtaining reliability comparable to or superior to a MOS transistor. Another object of the invention is to increase reliability of a semiconductor device including a large area integrated circuit in which various functional circuits comprise such TFTs.

In order to solve the above problems, the present invention is characterized by making such a structure that an LDD region including a region which overlaps with a gate electrode and a region which does not overlap with the gate electrode is provided in one TFT.

Moreover, in a semiconductor device including a large area integrated circuit typified by an active matrix type liquid crystal display device, an EL display device, and an image sensor, for the purpose of realizing a TFT having an optimum structure for every functional circuit, the present invention makes it possible to differentiate a ratio of a region of an LDD region overlapping with a gate electrode to a region not overlapping with the gate electrode for every TFT.

Moreover, in a semiconductor device including a large area integrated circuit typified by an active matrix type liquid crystal display device, an EL display device, and an image sensor, for the purpose of realizing a gate wiring line effectively using Al or Cu of a low resistance material, such a wiring structure is made that a wiring line of a clad structure is partially formed.

Thus, the structure of the present invention is such that in a semiconductor device including, over a substrate having an insulating surface, a semiconductor layer, a gate insulating film, a gate electrode, and a gate wiring line connected to the gate electrode, the gate electrode comprises a first conductive layer or a first conductive layer and a second conductive layer, and the gate wiring line is constructed by a region comprising the same conductive layer as the gate electrode and a region having a clad structure where a third conductive layer is covered with the first conductive layer and the second conductive layer.

The semiconductor layer includes a channel forming region, a first impurity region of one conductivity type, and a second impurity region of the one conductivity type sandwiched between the channel forming region and the first impurity region of the one conductivity type and being in contact with the channel forming region, and a part of the second impurity region of the one conductivity type overlaps with the gate electrode through the gate insulating film.

The first conductive layer and the second conductive layer applied to the present invention use one kind or plural kinds of elements selected from titanium (Ti), tantalum (Ta), tungsten (W), and molybdenum (Mo), or a compound containing the element as its main material. The third conductive layer comprises a low resistance conductive material typified by a kind of or plural kinds of elements selected from aluminum (Al) and copper (Cu), or a compound containing the foregoing element as its main material.

The present invention can be applied to a semiconductor device including a pixel region comprising an n-channel thin film transistor and a CMOS circuit comprising an n-channel thin film transistor and a p-channel thin film transistor.

However, in the foregoing CMOS circuit, it is not always necessary to apply the structure of the present invention to the p-channel TFT.

Moreover, another structure of the present invention is characterized by comprising a step of forming a semiconductor layer over a substrate having an insulating surface, a step of forming a gate insulating film to be in contact with the semiconductor layer, a step of forming a first conductive layer to be in contact with the gate insulating film, a step of forming a second impurity region by selectively adding an impurity element of one conductivity type to the semiconductor layer, a step of forming a third conductive layer to be in contact with the first conductive layer, a step of forming a second conductive layer to be in contact with the first conductive layer and the third conductive layer, a step of forming a gate electrode from the first conductive layer and the second conductive layer, a step of forming a gate wiring line from the first conductive layer, the second conductive layer, and the third conductive layer, a step of forming a first impurity region by selectively adding an impurity element of the one conductivity type to the semiconductor layer, and a step of removing a part of the gate electrode.

Moreover, the structure of the present invention is characterized by comprising a step of forming a semiconductor layer over a substrate having an insulating surface, a step of forming at least a first island-like semiconductor layer and a second island-like semiconductor layer by removing a part of the semiconductor layer, a step of forming a gate insulating film to be in contact with the first island-like semiconductor layer and the second island-like semiconductor layer, a step of forming a first conductive layer to be in contact with the gate insulating film, a step of forming a second impurity region by adding an impurity element of one conductivity type to at least a selected region of the first island-like semiconductor layer, a step of forming a third conductive layer to be in contact with the first conductive layer, a step of forming a second conductive layer to be in contact with the first conductive layer and the third conductive layer, a step of forming a gate electrode from the first conductive layer and the second conductive layer, a step of forming a gate wiring line from the first conductive layer, the second conductive layer, and the third conductive layer, a step of forming a first impurity region by adding an impurity element of the one conductivity type to a selected region of the first island-like semiconductor layer, a step of forming a third impurity region by adding an impurity element of a conductivity type opposite to the one conductivity type to a selected region of the second island-like semiconductor layer, and a step of removing a part of the gate electrode.

BRIEF DESCRIPTION OF THE DRAWINGS

FIGS. 10A to 10C are sectional views showing fabricating steps of a TFT.

FIG. 14 is a sectional view of a liquid crystal display device.

FIGS. 22A and 22B are views showing fabricating steps of a TFT.

FIGS. 26A to 26C are views for explaining the relation between a gate electrode and an LDD region of the invention.

DETAILED DESCRIPTION OF THE INVENTION

Figure 1A:
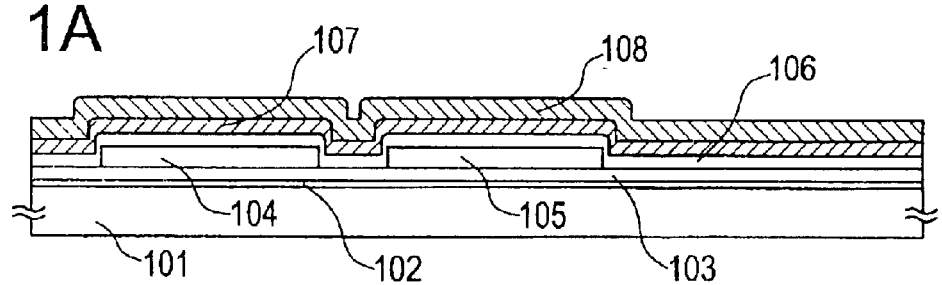
FIGS. 1A to 1E are sectional views showing fabricating steps of a TFT.

First, embodiment modes for carrying out the present invention will be described below with reference to the drawings.

[Embodiment Mode 1]

An embodiment mode for carrying out the present invention will be described with reference to FIGS. 1A to 1E and FIGS. 2A and 2C. Here, a description will be made on an embodiment mode in which an n-channel TFT and a p-channel TFT are fabricated over the same substrate to form an inverter circuit as a basic structure of a CMOS circuit.

As a substrate 101, a glass substrate, a plastic substrate, a ceramic substrate, or the like may be used. Besides, a silicon substrate in which an insulating film such as a silicon oxide film or a silicon nitride film is formed on its surface, or a metal substrate typified by stainless may be used. Of course, a quartz substrate may be used.

An underlayer film 102 made of a silicon nitride film and an underlayer film 103 made of a silicon oxide film are formed on a main surface of the substrate 101 on which a TFT is to be formed. These underlayer films may be formed by a plasma CVD method or a sputtering method, and are provided in order to prevent a harmful impurity from diffusing from the substrate 101 to the TFT. For that purpose, it was appropriate that the underlayer film 102 made of the silicon nitride film has a thickness of 20 to 100 nm, typically 50 nm, and the underlayer film 103 made of the silicon oxide film has a thickness of 50 to 500 nm, typically 150 to 200 nm.

In addition to the above, in view of stress balance, two-layer structure may be formed such that the underlayer film 102 comprises a first silicon nitride oxide film having a thickness of 10 to 100 nm and fabricated from $SiH_4$, $NH_3$, and $N_2O$ by a plasma CVD method, and the underlayer film 103 comprises a second silicon nitride oxide film having a thickness of 100 to 200 nm and fabricated from $SiH_4$ and $N_2O$ to be laminated.

Of course, although the underlayer film may be comprising only one of the underlayer film 102 made of the silicon nitride film and the underlayer film 103 made of the silicon oxide film, it was most preferable to make the two-layer structure in view of reliability of the TFT.

As a semiconductor layer formed to be in contact with the underlayer film 103, it is desirable to use a crystalline semiconductor obtained by forming an amorphous semiconductor by such as a plasma CVD method, a low pressure CVD method, or a sputtering method and crystallizing it by a laser annealing method or a thermal annealing method. It is also possible to apply a microcrystalline semiconductor formed by the film formation method. As a semiconductor material which can be applied here, silicon (Si), germanium (Ge), silicon germanium alloy, and silicon carbide can be enumerated, and in addition, a compound semiconductor material such as gallium arsenide may be used.

Alternatively, as a semiconductor layer formed over the substrate 101, an SOI (Silicon On Insulators) substrate in which a single crystal silicon layer is formed may be used. Some kinds are known for the SOI substrate according to its structure and fabricating method, and typically, SIMOX (Separation by Implanted Oxygen), ELTRAN (Epitaxial Layer Transfer: registered trademark by Canon Inc.), Smart-Cut (registered trademark by SOITEC Inc.) or the like may be used. Of course, other SOI substrates may be used.

The semiconductor layer is formed to a thickness of 10 to 100 nm, typically 50 nm. Although hydrogen at a ratio of 10 to 40 atm % is contained in an amorphous semiconductor film fabricated by a plasma CVD method, it is desirable that prior to a step of crystallization, a step of heat treatment at 400 to 500° C. is carried out to remove hydrogen from the film so that the hydrogen content is made 5 atom % or less. Although an amorphous silicon film may be formed by another fabricating method such as a sputtering method or an evaporation method, it is desirable that the content of an impurity element contained in the film, such as oxygen or nitrogen, is sufficiently reduced.

Since the underlayer film and the amorphous semiconductor film can be formed by the same film formation method, it is appropriate that the underlayer film 102, the underlayer film 103, and the semiconductor layer are continuously formed. After the respective films are formed, the surfaces are not exposed to the air atmosphere, so that pollution of the surfaces can be prevented. As a result, it was possible to eliminate one of factors to cause fluctuation in characteristics of TFTs.

As a step of crystallizing the amorphous semiconductor film, a technique of a well-known laser annealing method or thermal annealing method may be used. If a crystalline semiconductor film is formed by the technique of the thermal annealing method using a catalytic element, excellent TFT characteristics can be obtained.

A resist mask was formed by a well-known patterning method using a first photomask on the thus formed crystalline semiconductor film, and island-like semiconductor layers 104 and 105 were formed by a dry etching method.

Next, a gate insulating film 106 containing silicon oxide or silicon nitride as its main material is formed on the surfaces of the island-like semiconductor layers 104 and 105. The gate insulating film 106 is formed by a plasma CVD method or a sputtering method, and it is appropriate that the thickness is made 10 to 200 nm, preferably 50 to 150 nm.

A first conductive layer 107 and a third conductive layer 108 are formed on the surface of the gate insulating film 106. For the first conductive layer 107, a conductive material containing an element selected from Ta, Ni, Mo and W as its main material is used. It is appropriate that the thickness of the first conductive layer 107 is made 5 to 50 nm, preferably 10 to 25 nm.

The thicknesses of the gate insulating film 106 and the first conductive layer 107 are important. This is because in a doping step subsequently carried out, an impurity to give an n type is added to the semiconductor layers 104 and 105 through the gate insulating film 106 and the first conductive layer 107. Actually, in view of the thicknesses of the gate insulating film 106 and the first conductive layer 107, the condition of a doping step is determined. Here, if the thicknesses of the gate insulating film 106 and the first conductive layer 107 are varied by 10% or more of a predetermined value, the concentration of an add impurity is reduced.

As the third conductive layer 108, a conductive material containing Al or Cu as its main material is used. For example, in the case where Al is used, an Al alloy in which an element selected from Ti, Si, and Sc is added at a concentration of 0.1 to 5 atom % may be used. It is appropriate that the thickness of the third conductive layer is made 100 to 1,000 nm, preferably 200 to 400 nm. This is formed as a wiring material to reduce a wiring resistance of agate wiring line or a gate bus line (FIG. 1A).

In the present invention, the gate wiring line is a wiring line which comprises the same material as the gate electrode on the gate insulating film 106 and is connected to the gate electrode, and in the structure of connection to the gate electrode, the gate bus line is also regarded as part of the gate wiring line.

Figure 1B:
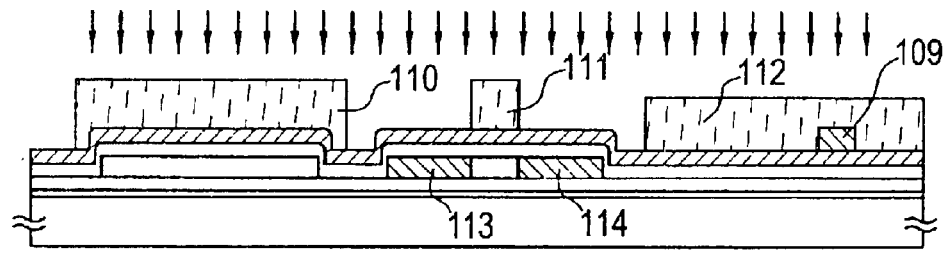

Next, a second photomask was used to form a resist mask, and an unnecessary portion of the third conductive layer was removed, so that part of the gate bus line was formed (109 in FIG. 1B). In the case where the third conductive layer was made of Al, by a wet etching method using a phosphoric acid solution, it was possible to remove the third conductive layer with good selectivity against the first conductive layer as an under layer.

Then resist masks 110 and 111 covering channel forming regions of the semiconductor layer 104 and the semiconductor layer 105 were formed through a third photomask. At this time, a resist mask 112 may be formed also in a region where the wiring line is formed.

Then, a doping step for giving an n type was carried out. As an impurity element to give the n type to a crystalline semiconductor material, phosphorus (P), arsenic (As), antimony (Sb) and the like are known. Here, phosphorus was used and the step was carried out by an ion doping method using phosphine ($PH_3$). In this step, for the purpose of adding phosphorus through the gate insulating film 106 and the first conductive layer 107 to the semiconductor layer thereunder, an acceleration voltage was set as high as 80 keV. It is preferable that the concentration of phosphorus added to the semiconductor layer is within the range of $1 \times 10^{16}$ to $1 \times 10^{19}$ atoms/cm$^3$, and here, it was made $1 \times 10^{18}$ atoms/cm$^3$. Then, regions 113 and 114 where phosphorus was added into the semiconductor layer 105 were formed. A part of the region formed here where phosphorus was added is made a second impurity region functioning as an LDD region (FIG. 1B).

Figure 1C:
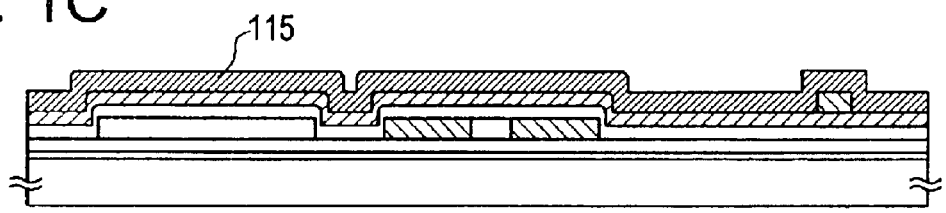

Thereafter, the resist masks 110, 111, and 112 were removed, and a second conductive layer 115 was formed on the whole surface. The second conductive layer 115 may be comprising the same material as the first conductive layer 107, and a conductive material containing an element selected from Ta, Ti, Mo, and W is used. It is appropriate that the thickness of the second conductive layer 115 is made 100 to 1,000 nm, preferably 200 to 500 nm (FIG. 1C).

Next, resist masks 116, 117, 118, and 119 were formed through a fourth photomask. The fourth photomask is for forming a gate electrode, a gate wiring line, and a gate bus line of a p-channel TFT. Since a gate electrode of an n-channel TFT is formed in a later step, the resist mask 117 was formed such that a first conductive layer 122 and a second conductive layer 123 remained on the semiconductor layer 105.

Unnecessary portions of the first conductive layer and the second conductive layer were removed by a dry etching method. Then, gate electrodes 120 and 121, gate wiring lines 124 and 125, and gate bus lines 126 and 127 were formed.

The gate bus line is formed in such a clad structure that the third conductive layer 109 is covered with the first conductive layer 126 and the second conductive layer 127. The third conductive layer comprises a low resistance material containing Al or Cu as its main material, and it was possible to reduce wiring resistance.

Figure 1D:
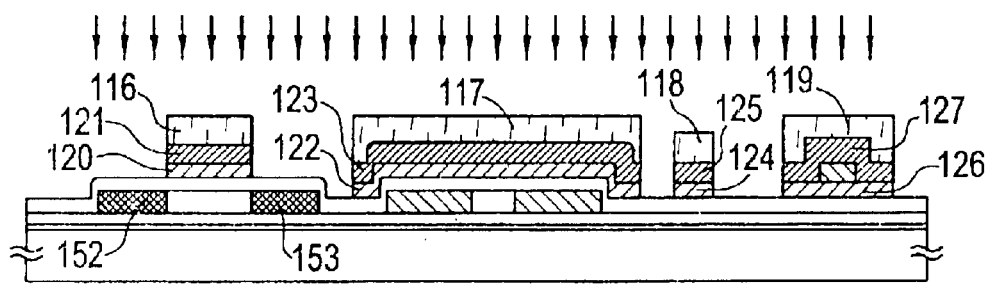

A doping step was carried out to add an impurity element to give the p type into a part of the semiconductor layer 104 where the p-channel TFT was to be formed while the resist masks 116, 117, 118, and 119 were made to remain as they were. As an impurity element to give the p type, boron (B), aluminum (Al), and gallium (Ga) are known. Here, boron was added as the impurity element by an ion doping method using diborane ($B_2H_6$). Also in this step, an acceleration voltage was made 80 keV, and boron was added at a concentration of $2\times10^{20}$ atoms/cm$^3$. As shown in FIG. 1D, third impurity regions 152 and 153 where boron was added at a high concentration were formed.

Figure 1E:
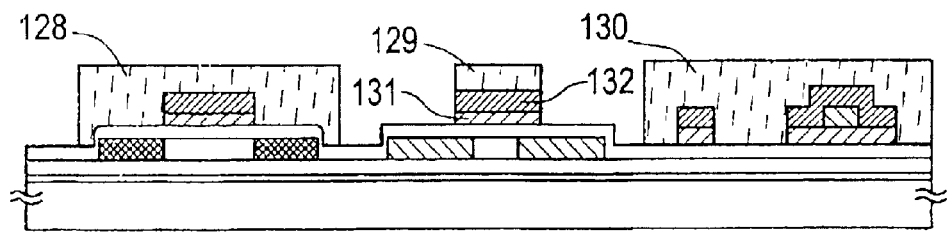

After the resist masks provided in FIG. 1D were removed, resist masks 128, 129, and 130 were newly formed through a fifth photomask. The fifth photomask is for forming a gate electrode of the n-channel TFT, and gate electrodes 131 and 132 are formed by a dry etching method. At this time, the gate electrodes 131 and 132 are formed to overlap with part of the second impurity regions 113 and 114 (FIG. 1E).

After the resist masks 128, 129, and 130 were completely removed, resist masks 133, 134, and 135 were formed. The resist mask 134 is formed in such a shape as to cover the gate electrodes 131 and 132 of the n-channel TFT and a part of the second impurity region. The resist mask 134 determines an offset amount of the LDD region.

Figure 2A:
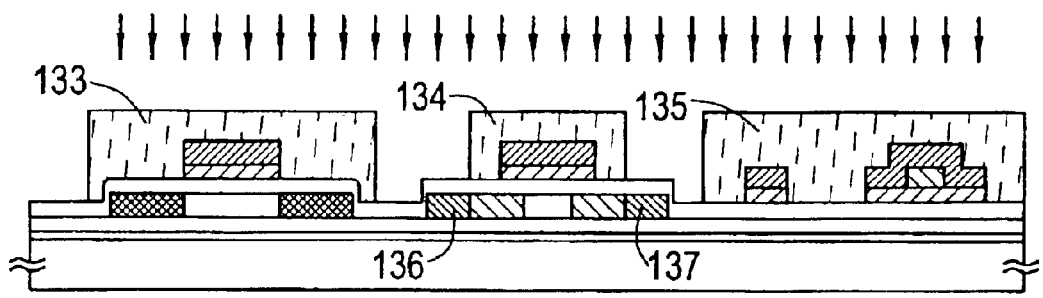
FIGS. 2A to 2C are sectional views showing fabricating steps of a TFT and a plan view of a CMOS circuit.

Then, a doping step of giving the n type was carried out. A first impurity region 137 which became a source region and a first impurity region 136 which became a drain region were formed. Here, the step was carried out by an ion doping method using phosphine ($PH_3$). Also in this step, for the purpose of adding phosphorus through the gate insulating film 106 to the semiconductor layer thereunder, an acceleration voltage was set as high as 80 keV. The concentration of phosphorus added in this region is high as compared with the prior doping step to give the n type, and it is preferable that the concentration is made $1\times10^{19}$ to $1\times10^{21}$ atoms/cm$^3$, and here, it was made $1\times10^{20}$ atoms/cm$^3$ (FIG. 2A).

Then, first interlayer insulating films 138 and 150 were formed on the surfaces of the gate insulating film 106, the gate electrodes 120, 121, 131, 132, the gate wiring lines 124 and 125, and the gate bus lines 126 and 127. One of the first interlayer insulating films 150 was a silicon nitride film and was formed to a thickness of 50 nm. The other one of the first interlayer insulating films 138 was a silicon oxide film and was formed to a thickness of 950 nm.

The one of the first interlayer insulating films 150 made of the silicon nitride film formed here was needed to carry out a subsequent heat treatment. This was effective to prevent oxidation of the surfaces of the gate electrodes 120, 121, 131, and 132, the gate wiring lines 124 and 125, and the gate bus lines 126 and 127.

It was necessary to carry out the step of the heat treatment so that the impurity element added at each concentration to give the n type or p type was activated. This step may be carried out by a thermal annealing method using an electric heating furnace, the foregoing laser annealing method using an excimer laser, or a rapid thermal annealing method (RTA) using a halogen lamp. However, although the laser annealing method can make activation at a low substrate heating temperature, it has been difficult to make activation up to a region concealed under the gate electrode. Thus, here, the step of activation was carried out by the thermal annealing method. The heat treatment was carried out in a nitrogen atmosphere at 300 to 700° C., preferably 350 to 550° C., here 450° C. for 2 hours.

Thereafter, after a predetermined resist mask was formed using a seventh photomask, the first interlayer insulating films 138 and 150 were etched to form contact holes reaching a source region and a drain region of each TFT. Then, source electrodes 139 and 140 and a drain electrode 141 were formed. Although not shown, in this embodiment mode, the respective electrodes were used as a three-layer electrode in which a Ti film having a thickness of 100 nm, an Al film containing Ti and having a thickness of 300 nm, and a Ti film having a thickness of 150 nm were continuously laminated by a sputtering method.

Through the foregoing steps, a channel forming region 145, first impurity regions 148 and 149, and second impurity regions 146 and 147 were formed in the n-channel TFT of the CMOS circuit. Here, in the second impurity regions, regions (GOLD regions) 146a and 147a overlapping with the gate electrode and regions (LDD regions) 146b and 147b not overlapping with the gate electrode were formed, respectively. The first impurity region 148 functioned as a source region, and the first impurity region 149 functioned as a drain region.

On the other hand, in the p-channel TFT, a channel forming region 142, and third impurity regions 143 and 144 were formed. The third impurity region 143 became a source region, and the third impurity region 144 became a drain region (FIG. 2B).

Figure 2B:
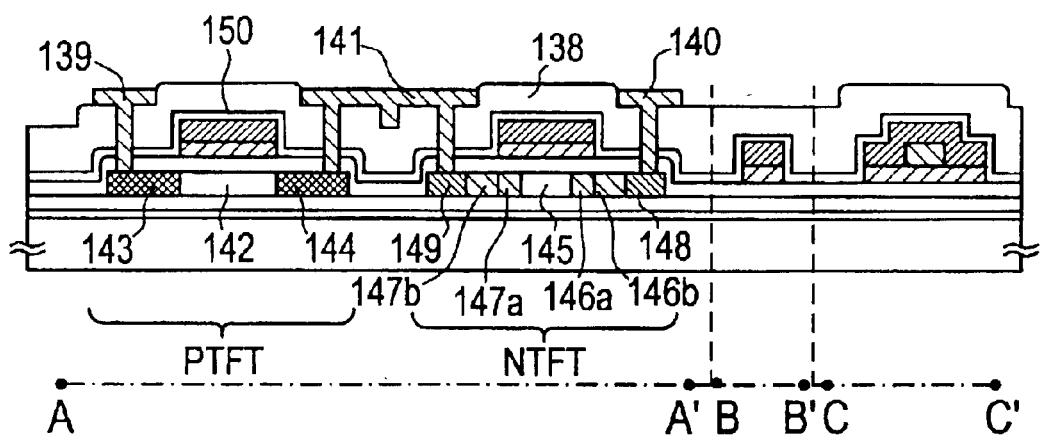
Figure 2C:
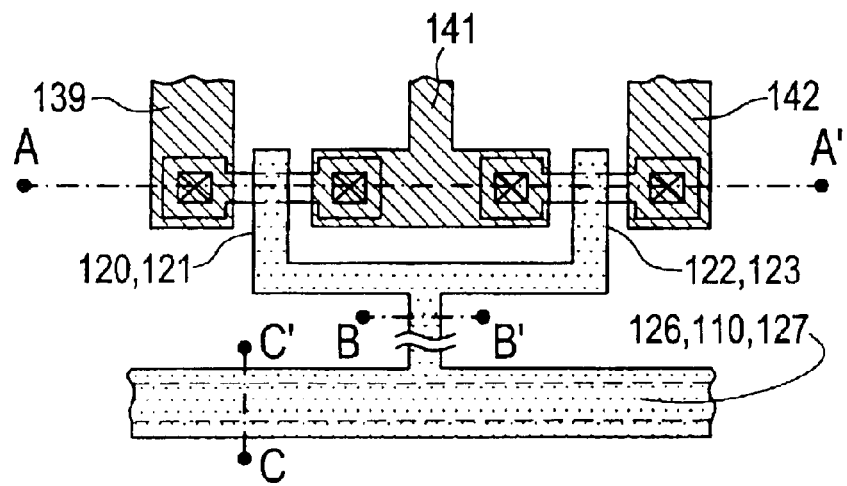

FIG. 2C is a top view of an inverter circuit, and an A–A' sectional structure of a TFT portion, a B–B' sectional structure of a gate wiring line portion, and a C–C' sectional structure of a gate bus line portion correspond to FIG. 2B. In the present invention, the gate electrode and the gate wiring line comprise the first conductive layer and the second conductive layer, and the gate bus line has a clad structure comprising the first conductive layer, the second conductive layer, and the third conductive layer.

Although FIGS. 1A to 1E and FIGS. 2A to 2C show the CMOS circuit formed by complementarily combining the n-channel TFT and the p-channel TFT as an example, the present invention can also be applied to an NMOS circuit using an n-channel TFT or a pixel region of a display device.

[Embodiment Mode 2]

A structure of a TFT of the invention will be described in more detail with reference to FIGS. 26A to 26C. Individual reference characters in FIGS. 26A and 26B are used to correspond to those of FIGS. 1A to 1E and FIGS. 2A to 2C. The second impurity region as the LDD region can be divided into the second impurity region 146a overlapping with the gate electrodes 131 and 132 and the second impurity region 146b not overlapping with the gate electrodes. That is, the LDD region (Lov) overlapping with the gate electrode and the LDD region (Loff) not overlapping with the gate electrode are formed.

The lengths of the regions Lov and Loff in the LDD region can be easily realized by pattering with three photomasks as shown in the embodiment mode 1. In the step shown in the embodiment mode 1, the LDD region is formed by the doping step in which the resist mask is formed with the third photomask, and the overlap region (Lov) of the LDD is formed at the same time as formation of the gate electrode using the fifth photomask. Further, the LDD region (Loff) not overlapping is formed by a resist mask formed with a sixth photomask.

However, these three photomasks are also masks for patterning the gate electrodes in addition to the object to form the resist masks, and the number of steps was not necessarily increased by making both the functions performed.

Thus, the freedom in design is given to the lengths of the regions Lov and Loff, and it was possible to set the lengths arbitrarily in view of the size of a TFT to be fabricated. This was a very effective method in the case where TFTs with different driving voltages were fabricated for every functional circuit in a large area integrated circuit. FIG. 26C shows an example of design values of TFTs used for a logic circuit portion, a buffer circuit portion, an analog switch portion, and a pixel region of an active matrix type liquid crystal display device. At this time, in view of driving voltage of each TFT, it was possible to suitably set, in addition to the channel length, the lengths of the second impurity region 146a overlapping with the gate electrode and the second impurity region 146b not overlapping with the gate electrode.

For example, in a TFT of a shift register circuit of a driver circuit of a liquid crystal display device or a TFT of a buffer circuit, since importance is basically attached to an ON characteristic, only the so-called GOLD structure may be adopted, and the second impurity region 146b not overlapping with the gate electrode was not necessarily needed to be provided. However, in the case of providing the region, it was satisfactory if the value of the region Loff was set within the range of 0.5 to 3 μm in view of the driving voltage. In view of the withstand voltage, it was desirable that the value of the second impurity region 146b not overlapping with the gate electrode was made large as the driving voltage became high.

In a TFT provided in a sampling circuit or a pixel region, for the purpose of preventing an increase of an OFF current, in the case where the channel length was, for example, 3 μm, it was satisfactory if the length of the second impurity region 146a overlapping with the gate electrode was made 1.5 μm and that of the second impurity region not overlapping with the gate electrode was made 1.5 μm. Of course, the present invention is not limited to the design values indicated here, but the values may be suitably determined.

On the other hand, in the p-channel TFT, it was satisfactory if only the channel forming region, the source region, and the drain region were formed. Of course, the same structure as the n-channel TFT of the present invention may be adopted, since the PTFT has originally high reliability, it is preferable to secure an ON current and to take a balance to the n-channel TFT. In the case where the present invention is applied to the CMOS circuit as shown in FIGS. 1A to 1E, it is especially important to take this characteristic balance. However, there is no problem even if the structure of the present invention is applied to the p-channel TFT.

[Embodiment Mode 3]

Figure 3A:
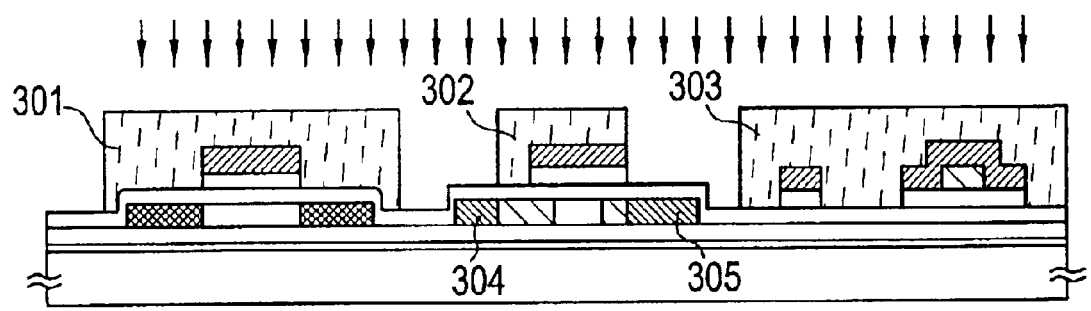
FIGS. 3A and 3B are sectional views showing fabricating steps of a TFT.

First, in accordance with the same steps as those of the embodiment mode 1, the state shown in FIG. 1E was obtained. As shown in FIG. 3A, after the resist masks 128, 129, and 130 were completely removed, resist masks 301, 302, and 303 were formed. Although the resist mask 302 is formed in such a shape as to cover a gate electrode of an n-channel TFT and a part of a second impurity region, and is for forming an LDD, it was designed here that the resist mask was formed at only the drain side of the n-channel TFT. Although the LDD region not overlapping with the gate electrode prevents an increase of an OFF current, it was possible to obtain a sufficient effect even when the LDD was provided at only the drain side (FIG. 3A).

Figure 3B:
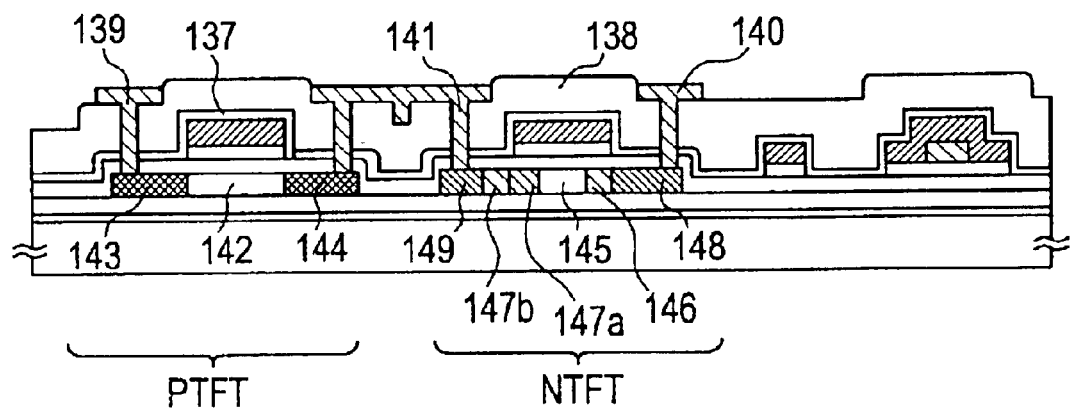

The CMOS circuit shown in FIG. 3B was obtained by carrying out subsequent steps similarly to the embodiment mode 1. A channel forming region 145, first impurity regions 148 and 149, and a second impurity region 147 were formed in the n-channel TFT. In the second impurity region, a region (GOLD region) 147a overlapping with the gate electrode and a region (LDD region) 147b not overlapping with the gate electrode were formed. The first impurity region 148 became a source region and the first impurity region 149 became a drain region.

[Embodiment Mode 4]

Figure 4A:
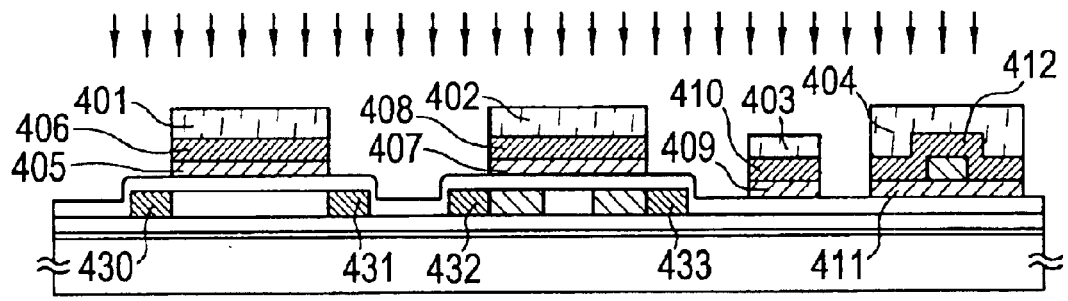
FIGS. 4A to 4C are sectional views showing fabricating steps of a TFT.
Figure 4B:
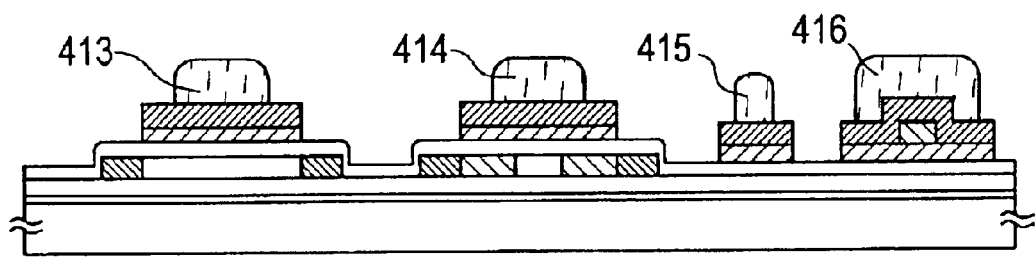
Figure 4C:
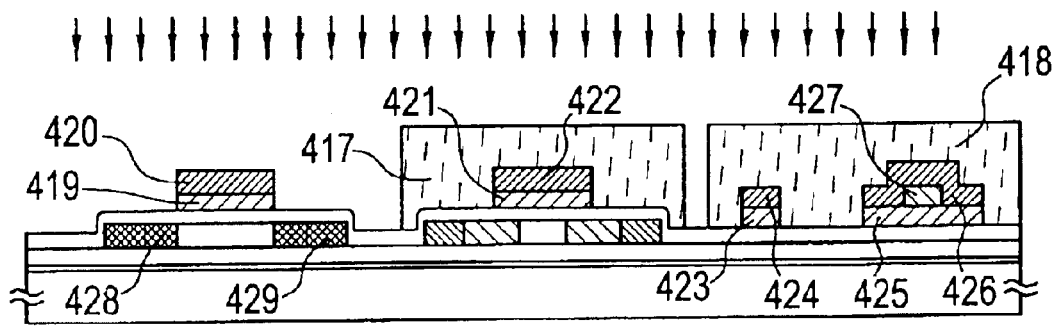

This embodiment mode of carrying out the present invention will be described with reference to FIGS. 4A to 4C. First, in accordance with the same steps as those in the embodiment mode 1, the state shown in FIG. 1C was obtained.

A photomask was used to form resist masks 401, 402, 403, and 404, and part of the first conductive layer 107 and the second conductive layer 108 were removed by a dry etching method. Thereafter, a doping step of giving an n type was carried out while the resist masks were used as they were, so that regions 430, 431, 432, and 433 where phosphorus was added in the semiconductor layers 104 and 105 were formed.

Here, the resist masks were completely removed by using ashing and an alkaline release solution. A photoresist mask was again formed and a patterning step by exposure from the rear side was carried out. At this time, patterns of a gate electrode, a gate wiring line, and a gate bus line played the same role as a photomask, so that resist masks 413, 414, 415, and 416 were formed on the respective patterns. The exposure from the rear side is carried out using direct light and scattered light, and it was possible to form each of the resist masks on the gate electrode and at its inside as shown in FIG. 4B by adjusting exposure conditions such as light intensity and an exposure time.

Then, part of the gate electrode, the gate wiring line, and the gate bus line were removed by a dry etching method, so that gate electrodes 419, 420, 421, and 422, gate wiring lines 423 and 424, and gate bus lines 425, 426 and 427 were formed.

Then, resist masks 417 and 418 were formed and a doping step of giving the p type was carried out using the gate electrodes 419 and 420 as masks.

The CMOS circuit shown in FIG. 2B was formed by carrying out subsequent steps similarly to the embodiment mode 1. A channel forming region 145, first impurity regions 148 and 149, and second impurity regions 146 and 147 were formed in the n-channel TFT. Here, in the second impurity regions, regions (GOLD regions) 146a and 147a overlapping with the gate electrode and regions (LDD regions) 146b and 147b not overlapping with the gate electrode were formed. The first impurity region 148 functioned as a source region and the first impurity region 149 functioned as a drain region.

[Embodiment Mode 5]

Another embodiment mode for carrying out the present invention will be described with reference to FIGS. 5A to 5F and FIGS. 6A to 6C. Here, a description will be made on an embodiment mode in which an n-channel TFT and a p-channel TFT are fabricated on the same substrate so that an inverter circuit as a basic structure of a CMOS circuit is formed.

First, similarly to the embodiment mode 1, underlayer films 502 and 503 were formed on a substrate 501, and further, island-like semiconductor layers 504 and 505 made of crystalline semiconductor were formed. Further, a gate insulating film 506, a first conductive layer 507, and a third conductive layer 508 were formed, so that the state of FIG. 5A was obtained.

Figure 5A:
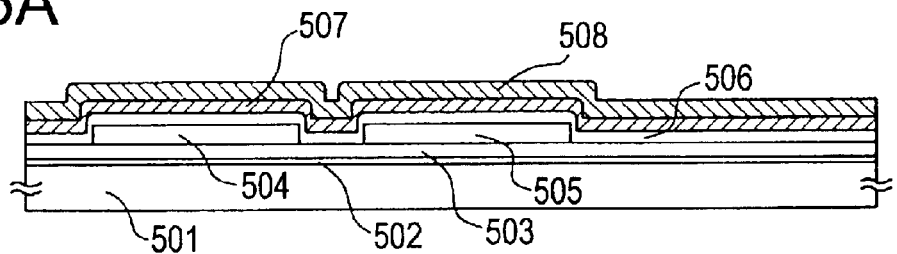
FIGS. 5A to 5F are sectional views showing fabricating steps of a TFT.
Figure 5B:
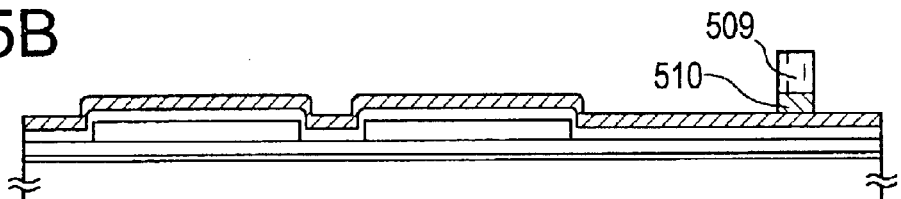

Next, a resist mask was formed using a second photomask, and an unnecessary portion of the third conductive layer was removed, so that a part of a gate bus line was formed (510 in FIG. 5B). In the case where the third conductive layer comprises Al, it was possible to remove the portion with good selectivity against the first conductive layer as an under layer by a wet etching method using a phosphoric acid solution.

Then, resist masks 511 and 512 covering channel forming regions of the semiconductor layer 504 and the semiconductor layer 505 were formed with a third photomask. At this time, a resist mask 513 may be formed in a region where a wiring line is formed.

Figure 5C:
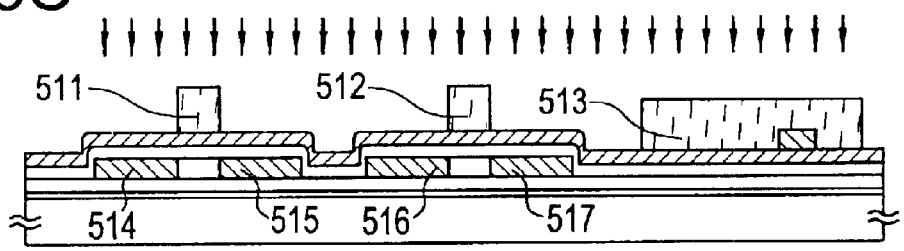

A doping step of giving an n type was carried out by an ion doping method using phosphine ($PH_3$). In this step, for the purpose of adding phosphorus through the gate insulating film 506 and the first conductive layer 507 to the semiconductor layer thereunder, an acceleration voltage was set as high as 80 keV. It is preferable that the concentration of phosphorus added in the semiconductor layer is made $1\times10^{16}$ to $1\times10^{19}$ atoms/cm$^3$, and here, it was made $1\times10^{18}$ atoms/cm$^3$. Regions 514, 515, 516, and 517 where phosphorus was added into the semiconductor layer were formed. Part of the regions which were formed here and were added with phosphorus are made second impurity regions functioning as LDD regions (FIG. 5C).

Figure 5D:
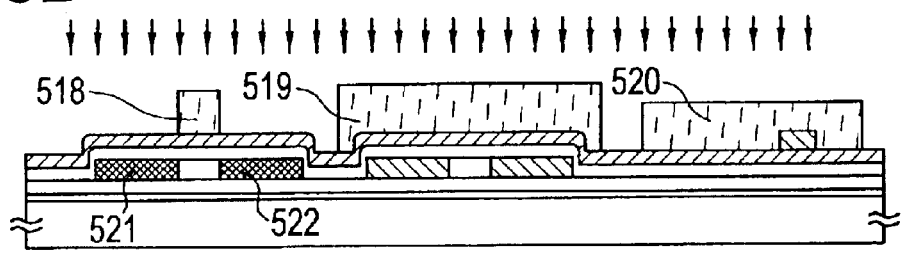

A doping step of giving a p type to a part of the semiconductor layer 504 where a p-channel TFT was to be formed was carried out using a fourth photomask while the resist masks 518, 519, and 520 were made to remain as they were. Although boron (B), aluminum (Al), and gallium (Ga) are known as an impurity element to give the p type, boron was used here as the impurity element and was added by an ion doping method using diborane ($B_2H_6$). Also in this step, an acceleration voltage was made 80 keV, and boron was added at a concentration of $2\times10^{20}$ atoms/cm$^3$. As shown in FIG. 5D, third impurity regions 521 and 522 where boron was added at a high concentration were formed.

Figure 5E:
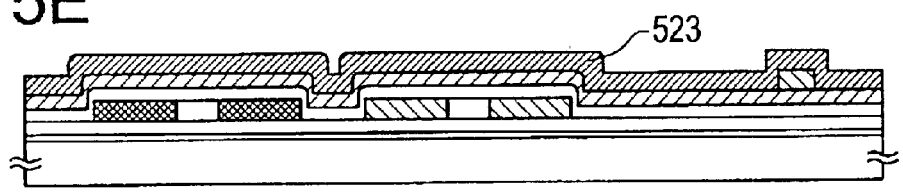
Figure 5F:
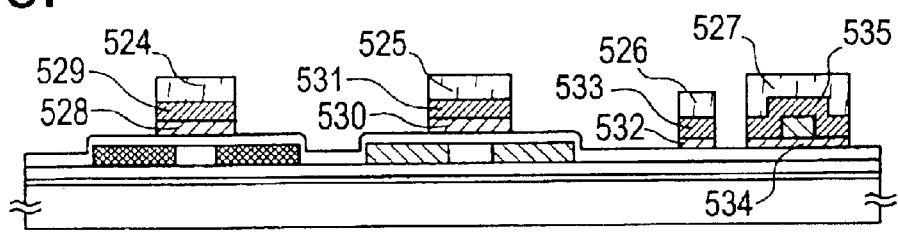

Thereafter, the resist masks 518, 519, and 520 were removed and a second conductive layer 523 was formed on the whole surface. The second conductive layer 523 may be comprising the same material as the first conductive layer 507, and uses a conductive material containing an element selected from Ta, Ti, Mo, and W as its main material. It is appropriate that the thickness of the second conductive layer 523 is made 100 to 1,000 nm, preferably 200 to 500 nm (FIG. 5E).

Next, resist masks 524, 525, 526, and 527 were formed with a fifth photomask. The first conductive layer and the second conductive layer were subjected to a dry etching method so that unnecessary portions were removed. Then, gate electrodes 528, 529, 530 and 531, gate wiring lines 532 and 533, and gate bus lines 534 and 535 were formed.

The gate bus line was formed in such a clad structure that the third conductive layer 510 was covered with the first conductive layer 534 and the second conductive layer 535. The third conductive layer was made of a low resistance material containing Al or Cu as its main material, and it was possible to reduce wiring resistance.

Then, resist masks 536, 537, and 538 were formed with a sixth photomask. The resist mask 537 was formed to cover the gate electrodes 530 and 531 and a part of the second impurity region. The resist mask 537 was for determining the offset amount of the LDD region.

Figure 6A:
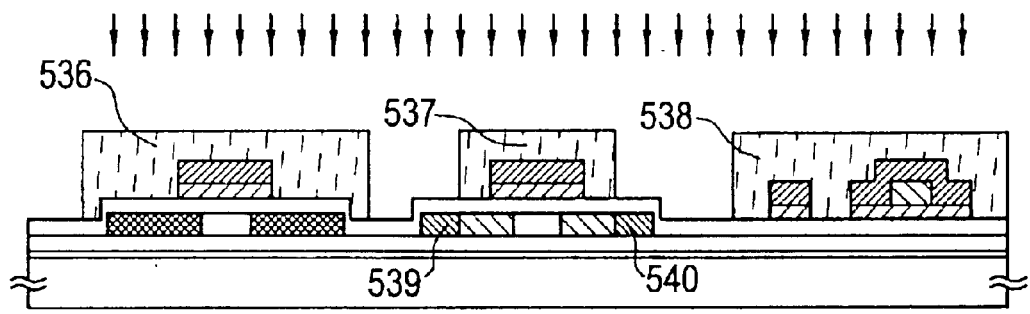
FIGS. 6A to 6C are sectional views showing fabricating steps of a TFT and a plan view of a CMOS circuit.
Figure 6B:
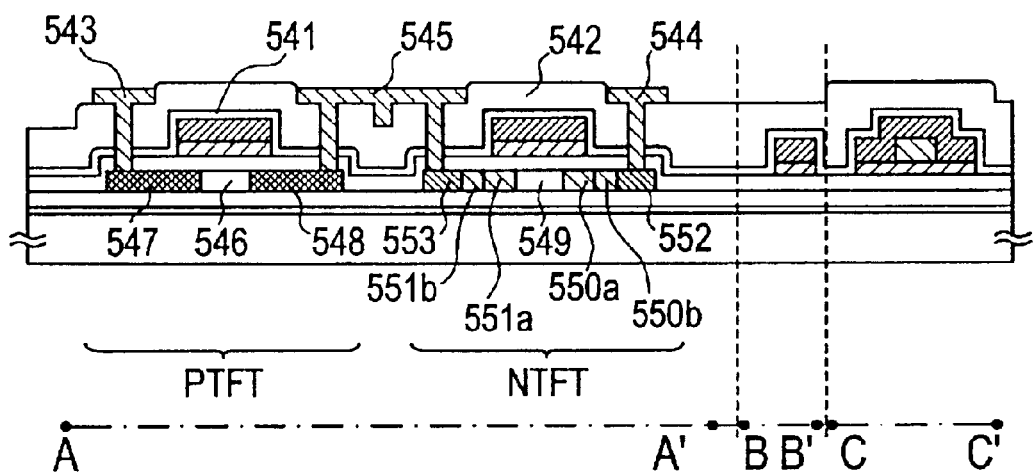
Figure 6C:
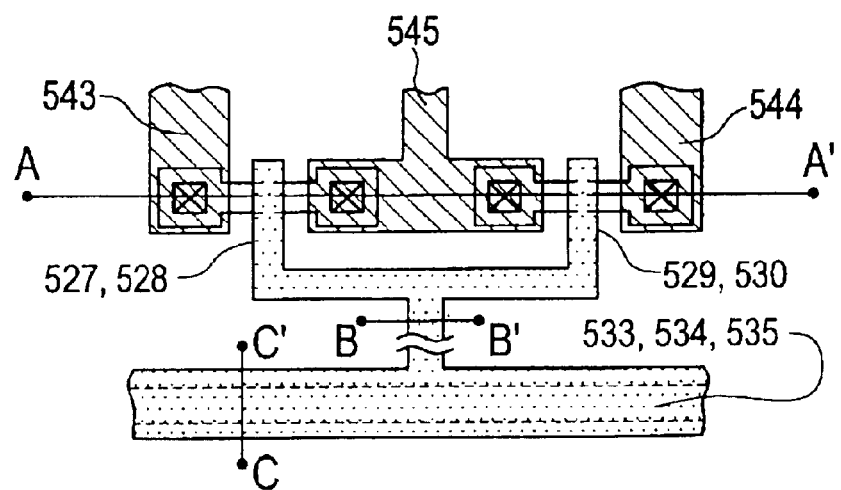

Then, a doping step of giving the n type was carried out. A first impurity region 540 which became a source region and a first impurity region 541 which became a drain region were formed. Here, the step was carried out by an ion doping method using phosphine ($PH_3$). Also in this step, for the purpose of adding phosphorus through the gate insulating film 506 to the semiconductor layer thereunder, an acceleration voltage was set as high as 80 keV. The concentration of phosphorus in this region is high as compared with the prior doping step of giving the n type, and it is preferable that the concentration is made $1\times10^{19}$ to $1\times10^{20}$ atoms/cm$^3$, and here, it was made $1\times10^{20}$ atoms/cm$^3$ (FIG. 6A).

Then, fifth interlayer insulating films 541 and 542 were formed on the surfaces of the gate insulating film 506, the gate electrodes 528, 529, 530, and 531, the gate wiring lines 532 and 533, and the gate bus lines 534 and 535. The first interlayer insulating film 541 was a silicon nitride film and was formed to a thickness of 50 nm. The first interlayer insulating film 542 was made of a silicon oxide film and was formed to a thickness of 950 nm.

It was necessary to carry out a step of heat treatment to activate the impurity element added at each concentration to give the n type or p type. This step may be carried out by a thermal annealing method using an electric heating furnace, the foregoing laser annealing method using an excimer laser, or a rapid thermal annealing method (RTA method) using a halogen lamp. However, although the laser annealing method can make activation at a low substrate heating temperature, it has been difficult to make activation up to a region concealed under the gate electrode. Thus, here, the step of activation was carried out by the thermal annealing method. The heat treatment was carried out in a nitrogen atmosphere at 300 to 700° C., preferably 350 to 550° C., here 450° C. for 2 hours.

After a predetermined resist mask was formed, the first interlayer insulating films 541 and 542 were etched to form contact holes reaching a source region and a drain region of each TFT. Then, source electrodes 543 and 544 and a drain electrode 545 were formed. Although not shown, in this embodiment mode, this electrode was used as an electrode of three-layer structure in which a Ti film having a thickness of 100 nm, an Al film containing Ti and having a thickness of 300 nm, and a Ti film having a thickness of 150 nm were continuously formed by a sputtering method.

Through the foregoing steps, a channel forming region 549, first impurity regions 552 and 553, and second impurity regions 550 and 551 were formed in the n-channel TFT of the CMOS circuit. Here, in the second impurity regions, regions (GOLD regions) 550a and 551a overlapping with the gate electrode and regions (LDD regions) 550b and 551b not overlapping with the gate electrode were formed, respectively. The first impurity region 552 became a source region and the first impurity region 553 became a drain region.

On the other hand, in the p-channel TFT, a channel forming region 546 and third impurity regions 547 and 548 were formed. The third impurity region 547 became a source region and the third impurity region 548 became a drain region (FIG. 5B).

FIG. 5C is a top view of an inverter circuit, and an A–A' sectional structure of a TFT portion, a B–B' sectional structure of a gate wiring line portion, and a C–C' sectional structure of a gate bus line portion correspond to FIG. 5B. In the present invention, the gate electrode and the gate wiring line comprise the first conductive layer and the second conductive layer, and the gate bus line has a clad structure comprising the first conductive layer, the second conductive layer, and the third conductive layer.

Although FIGS. 5A to 5F and FIGS. 6A to 6C show the CMOS circuit formed by complementarily combining the n-channel TFT and the p-channel TFT as an example, the present invention can also be applied to an NMOS circuit using an n-channel TFT or a pixel region of a liquid crystal display device.

[Embodiment Mode 6]

Another embodiment mode for carrying out the present invention will be described with reference to FIGS. 7A to 7F and FIGS. 8A to 8C. Here, a description will be made on an embodiment mode in which an n-channel TFT and a p-channel TFT are fabricated on the same substrate and an inverter circuit as a basic structure of a CMOS circuit is formed.

First, similarly to the embodiment mode 5, underlayer films 702 and 703 were formed on a substrate 701, and island-like semiconductor layers 704 and 705 made of crystalline semiconductor were formed. Further, a gate insulating film 706, a first conductive layer 707, and a third conductive layer 708 were formed to obtain the state of FIG. 7A.

Figure 7A:
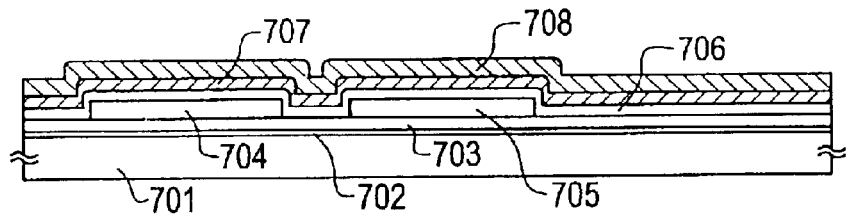
FIGS. 7A to 7F are sectional views showing fabricating steps of a TFT.
Figure 7B:
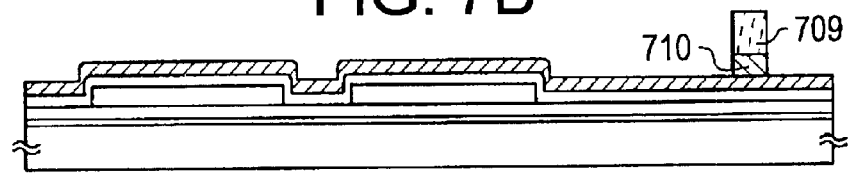

Next, a resist mask was formed, and an unnecessary portion of the third conductive layer was removed, so that a part of a gate bus line was formed (710 in FIG. 7B). In the case where the third conductive layer was made of Al, it was possible to remove the portion with good selectivity against the first conductive layer as an under layer by a wet etching method using a phosphoric acid solution.

Then, resist masks 711 and 712 covering channel forming regions of the semiconductor layer 704 and the semiconductor layer 705 were formed. At this time, a resist mask 713 may be formed in a region where a wiring line is formed.

Figure 7C:
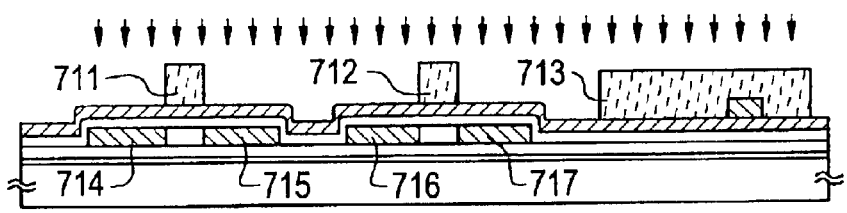

Then, a doping step of giving the n type was carried out by an ion doping method using phosphine ($PH_3$). In this step, for the purpose of adding phosphorus through the gate insulating film 706 and the first conductive layer 707 to the semiconductor layer thereunder, an acceleration voltage was set as high as 80 keV. It is preferable that the concentration of phosphorus added into the semiconductor layer is made $1 \times 10^{16}$ to $1 \times 10^{19}$ atoms/cm$^3$, and here, it was made $1 \times 10^{18}$ atoms/cm$^3$. Then, regions 714, 715, 716, and 717 where phosphorus was added into the semiconductor layer were formed. Part of the regions which were formed here and were added with phosphorus are made second impurity regions functioning as LDD regions (FIG. 7C).

Figure 7D:
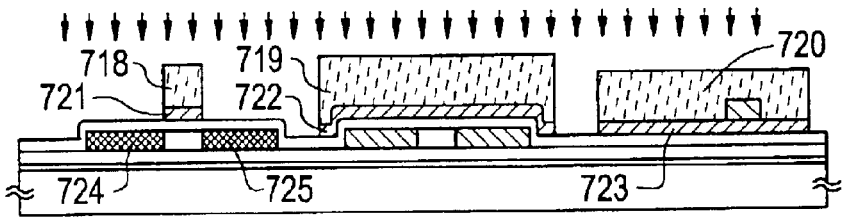
Figure 7E:
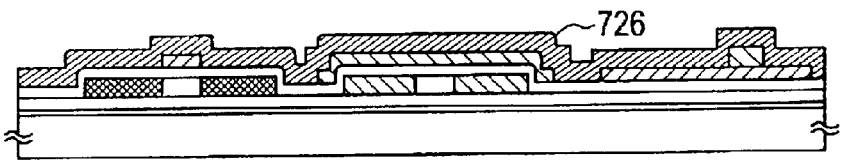
Figure 7F:
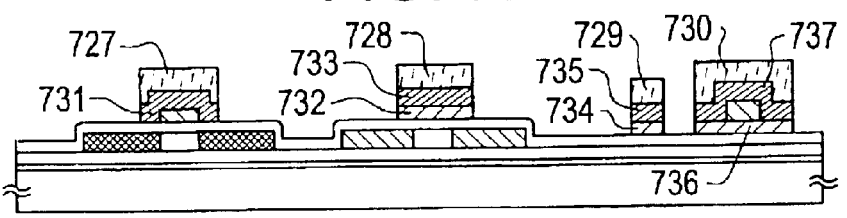

Then, resist masks 718, 719 and 720 were formed and prior to a doping step to give a p type, a portion where the first conductive layer was exposed was removed by an etching method. Then a doping step of giving the p type was carried out. Since the first conductive layer was removed here, it was possible to lower the acceleration voltage in the ion doping method. Boron was used as the impurity element and was added by the ion doping method using diborane ($B_2H_6$). The acceleration voltage was made 40 keV, and boron was added at a concentration of $2 \times 10^{20}$ atoms/cm$^3$. As shown in FIG. 7D, third impurity regions 724 and 725 where boron was added at a high concentration were formed.

Figure 8A:
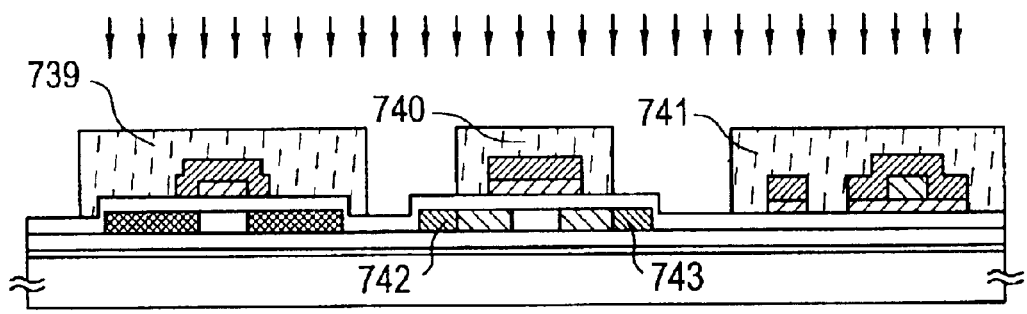
FIGS. 8A to 8C are sectional views showing fabricating steps of a TFT and a plan view showing a CMOS circuit.

The subsequent steps may be carried out in accordance with the embodiment mode 5, and as shown in FIG. 8A, resist masks 739, 740, and 741 were formed, and first impurity regions 742 and 743 were formed by a doping step to give the n type. Then, a channel forming region 752, first impurity regions 755 and 756, and second impurity regions 753 and 754 were formed in the n-channel TFT of the CMOS circuit Here, in the second impurity regions, regions (GOLD regions) 753a and 754a overlapping with gate electrode and regions (LDD regions) 753b and 754b not overlapping with the gate electrode were formed, respectively. The first impurity region 755 became a source region and the first impurity region 756 became a drain region.

On the other hand, in the p-channel TFT, a channel forming region 749 and third impurity regions 750 and 751 were formed. The third impurity region 750 became a source region and the third impurity region 751 became a drain region (FIG. 8B).

Figure 8B:
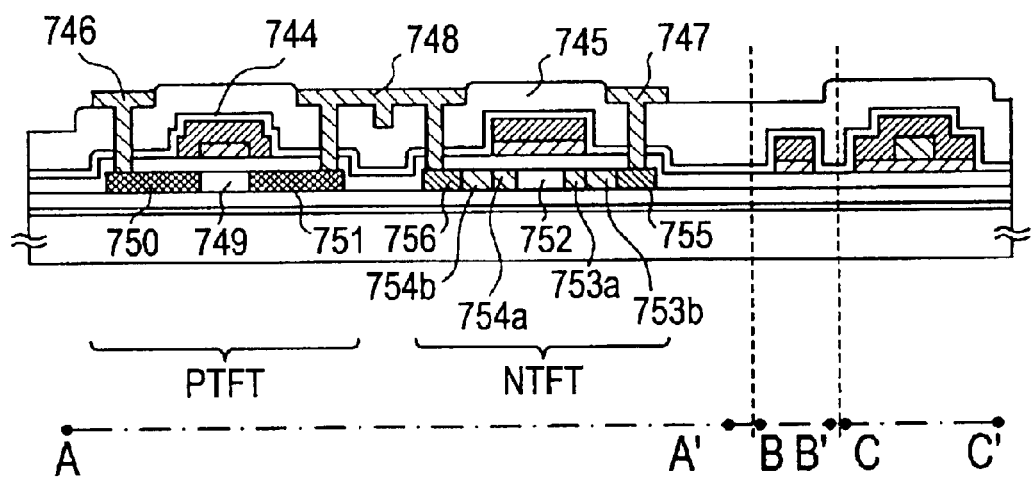
Figure 8C:
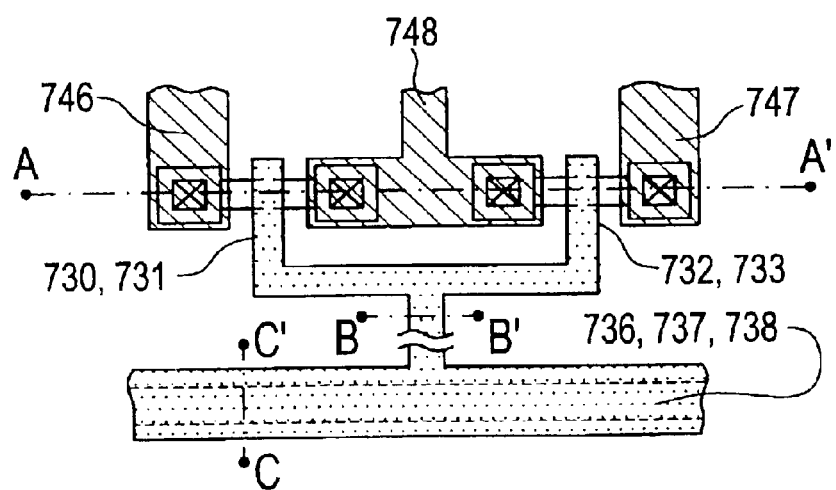

FIG. 8C is a top view of an inverter circuit, and an A–A' sectional structure of a TFT portion, a B–B' sectional structure of a gate wiring line portion, and a C–C' sectional structure of a gate bus line portion correspond to FIG. 8B. In the present invention, the gate electrode and the gate wiring line comprise the first conductive layer and the second conductive layer, and the gate bus line has a clad structure comprising the first conductive layer, the second conductive layer, and the third conductive layer.

Although FIGS. 7A to 7F and FIGS. 8A to 8C show the CMOS circuit formed by complementarily combining the n-channel TFT and the p-channel TFT as an example, the present invention can also be applied to an NMOS circuit using an n-channel TFT or a pixel region of a liquid crystal display device.

Next, embodiments of the present invention will be described below with reference to the drawings.

[Embodiment 1]

In this embodiment, a structure of the present invention will be described with reference to FIGS. 9A to 11 and a description will be made on a method of simultaneously fabricating a pixel region and a CMOS circuit as a basic structure of a driver circuit provided on its periphery.

Figure 9A:
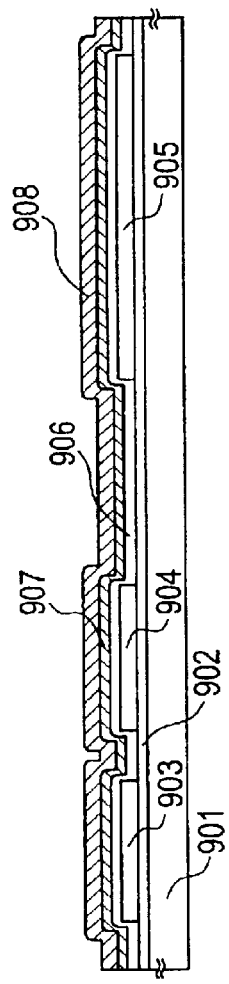
FIGS. 9A to 9C are sectional views showing fabricating steps of a TFT.
Figure 9B:
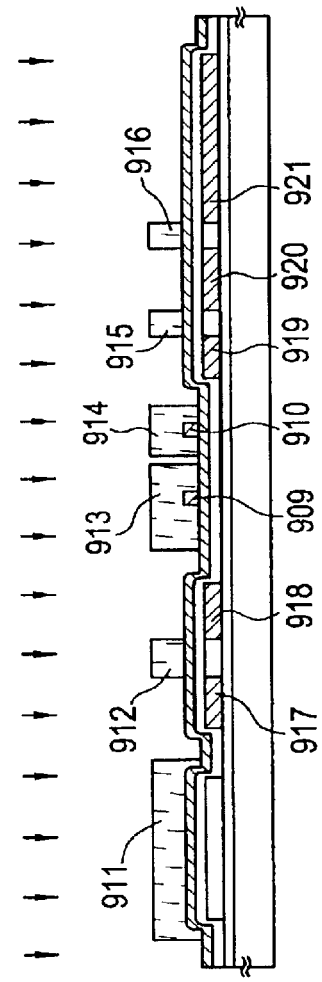
Figure 9C:
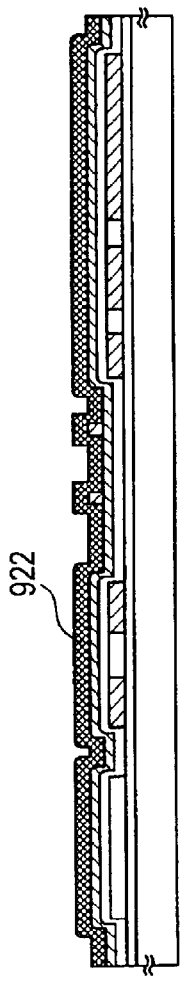

In FIGS. 9A to 9C, as a substrate 901, an alkali-free glass substrate typified by, for example, a substrate of 1737 glass made by Corning Inc. was used. An underlayer film 902 was formed on the surface of the substrate 901 on which TFTs were to be formed. As the underlayer film 902, although not shown, a silicon nitride film having a thickness of 25 to 100 nm, here, 50 nm, and a silicon oxide film having a thickness of 50 to 300 nm, here, 150 nm were formed. The underlayer film 902 may be formed using only a silicon nitride film or a silicon nitride oxide film.

The underlayer film 902 may be comprising such a two-layer structure that a first silicon nitride oxide film having a thickness of 10 to 100 nm is fabricated by a plasma CVD method from $SiH_4$, $NH_3$, and $N_2O$, and a second silicon nitride oxide film fabricated from $SiH_4$ and $N_2O$ and having a thickness of 100 to 200 nm is laminated thereon.

The first silicon nitride oxide film is formed by using a parallel plate type plasma CVD method. The first silicon nitride oxide film was formed under the conditions that $SiH_4$ of 10 SCCM, $NH_3$ of 100 SCCM, and $N_2O$ of 20 SCCM were introduced into a reaction chamber, substrate temperature was made 325° C., reaction pressure was made 40 Pa, discharge power density was made 0.41 W/cm$^2$, and discharge frequency was made 60 MHz. On the other hand, the second silicon nitride oxide film was formed under the conditions that $SiH_4$ of 4 SCCM and $N_2O$ of 400 SCCM were introduced into the reaction chamber, substrate temperature was made 400° C., reaction pressure was made 40 Pa, discharge power density was made 0.41 W/cm$^2$, and discharge frequency was made 60 MHz. These films can also be continuously formed only by changing the substrate temperature and changing the reaction gas. The first silicon nitride oxide film is formed so that the inner stress becomes tensile stress when the substrate is considered as the center.

Although the second silicon nitride oxide film is made to have inner stress in the same direction, it is appropriate that the absolute value of the stress is made smaller than that of the first silicon nitride oxide film.

Next, an amorphous silicon film having a thickness of 50 nm was formed on the underlayer film 902 by a plasma CVD method. It is desirable that according to the hydrogen content, the amorphous silicon film is preferably heated at 400 to 550° C. for several hours to carry out a dehydrogenating process so that the hydrogen content is made 5 atom % or less, and a step of crystallization is carried out. Although the amorphous silicon film may be formed by another fabricating method such as a sputtering method or an evaporation method, it is desirable that impurity elements such as oxygen and nitrogen contained in the film are sufficiently decreased in advance.

Here, both the underlayer film and the amorphous silicon film are fabricated by the plasma CVD method, and at this time, the underlayer film and the amorphous silicon film may be continuously formed in vacuum. By making such a step that the underlayer film was not exposed to the air after it was formed, it became possible to prevent pollution of the surface and it was possible to reduce fluctuation in characteristics of TFTs fabricated.

As a step of crystallizing the amorphous silicon film, a well-known laser annealing method or a thermal annealing method may be used. In this embodiment, the laser annealing method was used, and a pulse oscillation type KrF excimer laser light was linearly condensed and was irradiated to the amorphous silicon film to form a crystalline silicon film.

In this embodiment, as the semiconductor layer, although the crystalline silicon film is formed from the amorphous silicon film, a microcrystal silicon film may be used, or a crystalline silicon film may be directly formed.

The thus formed crystalline silicon film was patterned by using a first photomask to form island-like semiconductor layers 903, 904 and 905.

Next, a gate insulating film 906 containing silicon oxide or silicon nitride as its main material was formed to cover the island-like semiconductor layers 903, 904, and 905. As the gate insulating film 906, a silicon nitride oxide film having a thickness of 10 to 200 nm, preferably 50 to 150 nm may be formed by a plasma CVD method using $N_2O$ and $SiH_4$ as a raw material. Here, the film was formed to a thickness of 100 nm.

Then, a first conductive film 907 and a third conductive film 908 were formed on the surface of the gate insulating film 906. The first conductive film 907 may be comprising a semiconductor film containing an element selected from Ta, Ti and W or containing these elements as its main material. It is necessary that the thickness of the first conductive film 907 is made 5 to 50 nm, preferably 10 to 30 nm. Here, a Ta film having a thickness of 20 nm was formed.

In the case where the Ta film is used, the film can be formed by a sputtering method. For the Ta film, Ar is used as a sputtering gas. If a suitable amount of Xe or Kr is added into the sputtering gas, it is possible to relieve inner stress of a formed film and to prevent peeling of the film. Although the resistivity of the Ta film with a phase á is about 20 $\mu\text{Ucm}$ and can be used for a gate electrode, the resistivity of the Ta film with a phase â is about 180 $\mu\text{Ucm}$ and is unsuitable for a gate electrode. However, since a TaN film has a crystal structure close to the phase á, if the Ta film is formed thereon, the Ta film with the phase á can be easily obtained.

Thus, although not shown, the TaN film having a thickness of 10 to 50 nm may be formed under the first conductive film. Similarly, although not shown, it is effective to form a silicon film having a thickness of about 2 to 20 nm and doped with phosphorus (P) under the first conductive layer. By this, improvement in adhesion of the conductive film formed thereon and prevention of oxidation can be realized, and it is possible to prevent a very small amount of alkali metal element contained in the firs conductive film or the second conductive film from diffusing to the gate insulating film 906. In all events, it is preferable that the resistivity of the first conductive film is made a value within the range of 10 to 50 $\mu\text{Ucm}$.

In addition, a W film can also be used, and in that case, argon (Ar) gas and nitrogen ($N_2$) gas are introduced to form the W film having a thickness of 200 nm. It is also possible to form the W film by a thermal CVD method using tungsten hexafluoride ($WF_6$). In all events, it is necessary to decrease the resistance in order to use the film as a gate electrode, and it is desirable that the resistivity of the W film is made 20 $\mu\text{Ucm}$ or less. Although the resistivity of the W film can be decreased by enlarging crystal grains, in the case where a lot of impurity elements such as oxygen are contained in the W film, crystallization is obstructed and the resistance is increased. From this, in the case of the sputtering method, a W target with a purity of 99.9999% is used, and further, the W film is formed while careful attention is paid to prevent mixture of an impurity from a vapor phase at the film formation, so that a resistivity of 9 to 20 $\mu\text{Ucm}$ can be realized.

A conductive material containing Al or Cu as its main material is used for the third conductive layer 908. For example, in the case where Al is used, an Al alloy added with an element selected from Ti, Si, and Sc at 0.1 to 5 atom % may be used. It is appropriate that the third conductive layer is formed to a thickness of 100 to 1,000 nm, preferably 200 to 400 nm. This is formed as a wiring material to decrease wiring resistance of a gate wiring line or a gate bus line.

Similarly, the third conductive layer is useful in forming a wiring line connecting an input terminal provided at an end portion of the substrate 901 to each circuit, and the wiring resistance can be decreased.

An impurity element to give the n type or p type conductivity may be added to the semiconductor film used as the first conductive film. A method of fabricating this semiconductor film may be carried out in accordance with a well-known method. For example, the film can be fabricated by a low pressure CVD method under the condition that the substrate temperature is made 450 to 500° C., and disilane ($Si_2H_6$) of 250 SCCM and helium (He) of 300 SCCM are introduced. At the same time, an n-type semiconductor film may be formed by mixing $PH_3$ of 0.1 to 2% into $Si_2H_6$ (FIG. 9A).

Boron (B) of a concentration of $1\times10^{16}$ to $5\times10^{18}$ atoms/$cm^3$ may be previously added in the island-like semiconductor layers. The boron (B) is added to control a threshold voltage, and other elements may be substituted as long as the same effect can be obtained.

Next, a resist mask was formed using a second photomask, and an unnecessary portion of the third conductive layer was removed to form a gate bus line and part of other wiring lines (909 and 910 in FIG. 9B). In the case where the third conductive layer was made of Al, it was possible to remove the portion with good selectivity against the first conductive layer as an under layer by a wet etching method using a phosphoric acid solution.

Then, resist masks 911, 912, 915 and 916 were formed to cover the semiconductor layer 903 and channel forming regions of the semiconductor layers 904 and 905. At this time, resist masks 913 and 914 may be formed also in the region where wiring lines are formed.

Then, a doping step of giving the n type was carried out. Phosphorus (P), arsenic (As), antimony (Sb), etc. are known as an impurity element to give the n type to a crystalline semiconductor material. Here, phosphorus was used and an ion doping method using phosphine ($PH_3$) was carried out. In this step, for the purpose of adding phosphorus through the gate insulating film 906 and the first conductive layer 907 to the semiconductor layer under the films, an acceleration voltage was set as high as 80 KeV. It is preferable that a concentration of phosphorus added in this region is made a value within the range of $1\times10^{16}$ to $1\times10^{19}$ atoms/$cm^3$, and here, it was made $1\times10^{18}$ atoms/$cm^3$. Then, regions 917, 918, 919, 920, and 921 where phosphorus (P) was added in the semiconductor layer were formed. Here, part of the formed regions where phosphorus was added are made second impurity regions functioning as LDD regions (FIG. 9B).

Thereafter, the resist masks were removed and a second conductive layer 922 was formed on the whole surface. The second conductive layer 922 may be comprising the same material as the first conductive layer 907, and a conductive material containing an element selected from Ta, Ti, Mo, and W is used. It is appropriate that the second conductive layer 922 is formed to a thickness of 100 to 1,000 nm, preferably 200 to 500 nm (FIG. 9C).

Next, resist masks 923, 924, 925, 926, 927, and 928 were formed with a fourth photomask. The fourth photomask is for forming a gate electrode of a p-channel TFT, gate wiring lines of a CMOS circuit and a pixel region, gate bus lines, and other wiring lines. Since a gate electrode of an n-channel TFT was formed in a later step, the resist masks 924 and 928 were formed so that the first conductive layers 931 and 942 and the second conductive layers 932 and 941 remained on the semiconductor layer.

Unnecessary portions of the first conductive layer and the second conductive layer were removed by a dry etching method. Then, gate electrodes 929 and 930, gate wiring line 933 and 934, and gate bus lines 935, 937, 938, and 940 were formed.

The respective gate bus lines were formed as a clad structure in which the third conductive layer 936 and 939 was covered with the first conductive layer 935 and 938 and the second conductive layer 937 and 940. The third conductive layer was made of a low resistance material containing Al or CU as its main material, and it was possible to reduce the wiring resistance.

A doping step of giving the p type to a part of the semiconductor layer 903 where the p-channel TFT was to be formed was carried out while the resist masks 923, 924, 925, 926, 927, and 928 were made to remain as they were. Although boron (B), aluminum (Al) and gallium (Ga) are known as an impurity element to give the p type, boron was used here as the impurity element and was added by an ion doping method using diborane ($B_2H_6$). Also in this case, an acceleration voltage was made 80 keV, and boron was added at a concentration of $2\times10^{20}$ atoms/$cm^3$. As shown in FIG. 10A, third impurity regions 943 and 944 where boron was added at a high concentration were formed.

After the resist masks provided in FIG. 10A were removed, resist masks 945, 946, 947, 948, 949, 950, and 951 were newly formed with a fifth photomask. The fifth photomask is for forming gate electrodes of n-channel TFTs, and gate electrodes 952, 953, 954, 955, 956, and 957 were formed by a dry etching method. At this time, the gate electrodes 952, 953, 954, 955, 956 and 957 were formed to overlap with part of the second impurity regions 917, 918, 919, 920, and 921 (FIG. 10B).

After the resist masks were completely removed, new resist masks 960, 961, 962, 963, 964 and 965 were formed. The resist masks 961, 964, 965 were formed to cover the gate electrodes 952, 953, 954, 955, 956 and 957 of the n-channel TFTs and part of the second impurity regions. The resist masks 961, 964, 965 determine the offset amounts of LDD regions.

The resist masks 960, 961, 962, 963, 964 and 965 were formed using a sixth photomask, and a doping step of giving the n type was carried out. First impurity regions 967 and 968 which became source regions and first impurity regions 966, 969, and 970 which became drain regions were formed. Here, the step was carried out by an ion doping method using phosphine ($PH_3$). Also in this step, for the purpose of adding phosphorus through the gate insulating film 906 to the semiconductor layer under the film, an acceleration voltage was set as high as 80 keV. A concentration of phosphorus in the regions is high as compared with the prior doping step of giving the n type, and it is preferable that the concentration is made $1\times10^{19}$ to $1\times10^{21}$ atoms/$cm^3$, and here, it was made $1\times10^{20}$ atoms/$cm^3$ (FIG. 10C).

After the steps up to FIG. 10C were completed, a step of forming first interlayer insulating films 971 and 972 was carried out. First, a silicon nitride film 971 was formed to a thickness of 50 nm. The silicon nitride film 971 was formed by a plasma CVD method under the condition that $SiH_4$ of 5 SCCM, $NH_3$ of 40 SCCM, and $N_2$ of 100 SCCM were introduced, the pressure was made 0.7 Torr, and a high frequency power of 300 W was applied. Subsequently, as the first interlayer insulating film 972, a silicon oxide film having a thickness of 950 nm was formed under the condition that tetraethyl orthosilicate (TEOS) of 500 SCCM and $O_2$ of 50 SCCM were introduced, the pressure was made 1 Torr, and a high frequency power of 200 W was applied.

Then, a step of heat treatment was carried out. It was necessary to carry out the step of heat treatment to activate the impurity element added at each concentration to give the n type or p type. This step may be carried out by a thermal annealing method using an electric heating furnace, the foregoing laser annealing method using an excimer laser, or a rapid thermal annealing method (RTA method) using a halogen lamp. Here, the step of activation was carried out by the thermal annealing method. The heat treatment was carried out in a nitrogen atmosphere at 300 to 700° C., preferably 350 to 550° C., here, 450° C. for 2 hours.

The first interlayer insulating films 971 and 972 were patterned to form contact holes reaching a source region and a drain region of each TFT. Then, source electrodes 973, 974, and 975 and drain electrodes 976 and 977 were formed. Although not shown, in this embodiment, the respective electrodes were formed as a three-layer electrode in which a Ti film having a thickness of 100 nm, an Al film containing Ti and having a thickness of 300 nm, and a Ti film having a thickness of 150 nm were continuously formed by a sputtering method.

Through the foregoing steps, a channel forming region 981, first impurity regions 984 and 985, and second impurity regions 982 and 983 were formed in the n-channel TFT of the CMOS circuit. Here, in the second impurity regions, regions (GOLD regions) 982a and 983a overlapping with gate electrode and regions (LDD regions) 982b and 983b not overlapping with the gate electrode were formed, respectively. The first impurity region 984 became a source region and the first impurity region 985 became a drain region.

In the p-channel TFT, the gate electrode of a clad structure was similarly formed, and a channel forming region 978, and third impurity regions 979 and 980 were formed. The third impurity region 979 became a source region and the third impurity region 980 became a drain region.

The pixel TFT has a multi gate structure, and channel forming regions 986 and 991, first impurity regions 989, 990 and 994, and second impurity regions 987, 988, 992 and 993 were formed. Here, in the second impurity regions, regions 987a, 988a, 992a and 993a overlapping with the gate electrode, and regions 987b, 988b, 992b and 993b not overlapping with the gate electrode were formed.

Figure 11:
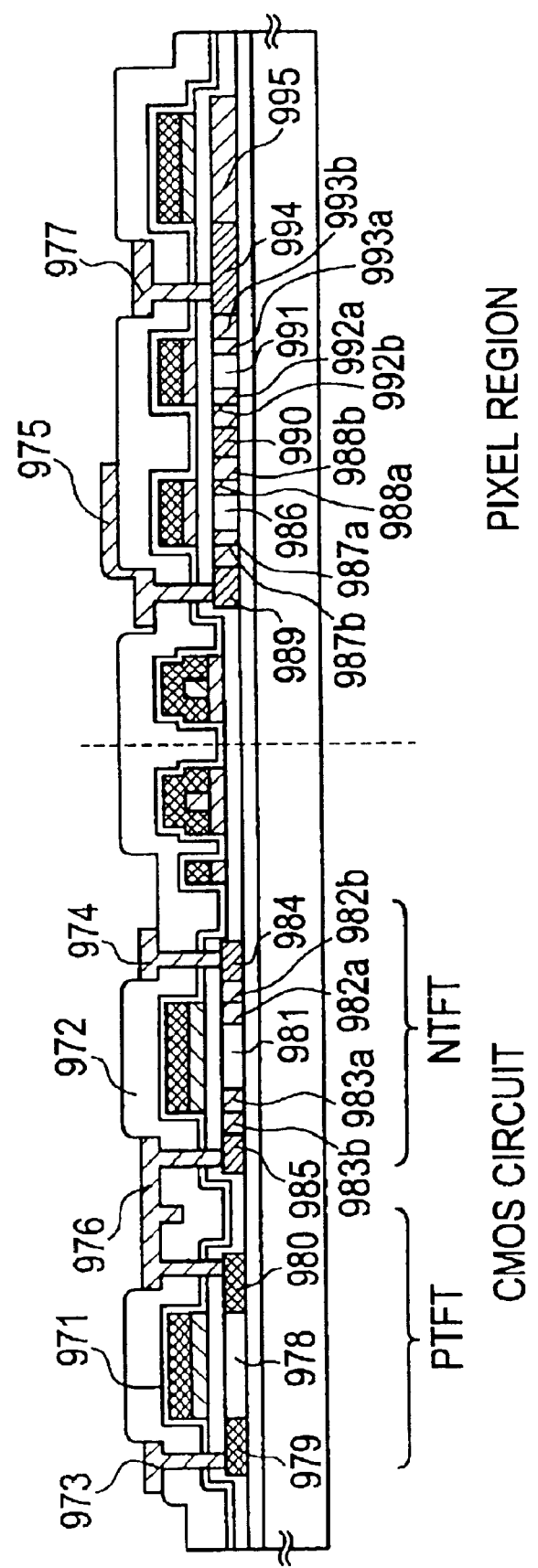
FIG. 11 is a sectional view of an active matrix substrate.

In this way, as shown in FIG. 11, an active matrix substrate in which the CMOS circuit and the pixel portion were formed over the substrate 901 was fabricated. At the same time, a holding capacitance portion was formed at the drain side of the n-channel TFT of the pixel portion.

[Embodiment 2]

Figure 12:
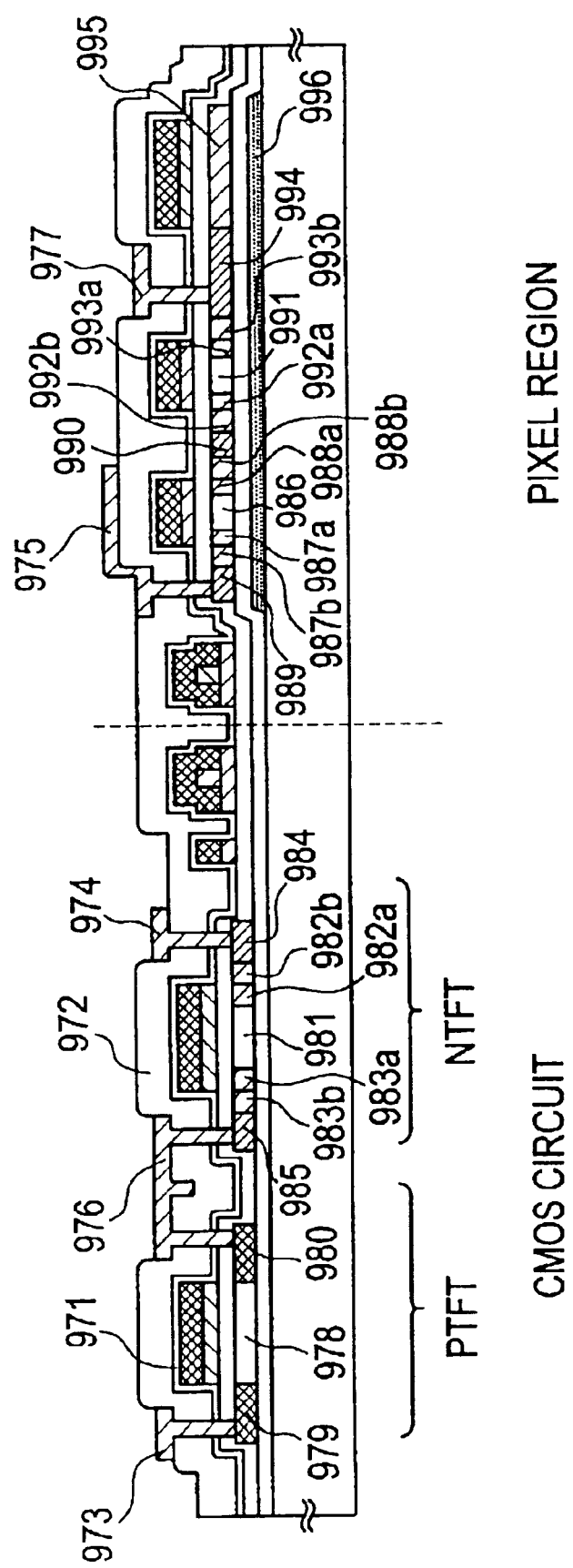
FIG. 12 is a sectional view of an active matrix substrate.

This embodiment will be described with reference to FIG. 12. In FIG. 12, a light shielding film 996 was formed to correspond to a region where a semiconductor layer of a pixel portion was formed, and was provided before an underlayer film 997 was formed. It is appropriate that the light shielding film 996 comprises a metal film of Ti, Ta, Cr, W or the like. It may also be comprising tungsten silicide (WSi). More preferably, it may be comprising a two-layer structure of a WSi film and a Si film. It is appropriate that the light shielding film 996 is formed to a thickness of 100 to 400 nm, typically 200 nm.

Steps of forming TFTs on the light shielding film 996 may be carried out in accordance with the embodiment 1. Then, an active matrix substrate shown in FIG. 12 is formed. It is preferable that such an active matrix substrate is used for a liquid crystal display device for projection. The light shielding film cut off scattered light, so that it was possible to effectively prevent an increase in an OFF current of an n-channel TFT of the pixel portion.

[Embodiment 3]

In this embodiment, a description will be made on an example where a crystalline semiconductor film used as the semiconductor layer in the embodiment 1 is formed by a thermal annealing method using a catalytic element. In the case where the catalytic element is used, it is desirable to use a technique disclosed in Japanese Patent Application Laid-open No. Hei. 7-130652 or No. Hei. 8-78329.

Figure 18A:
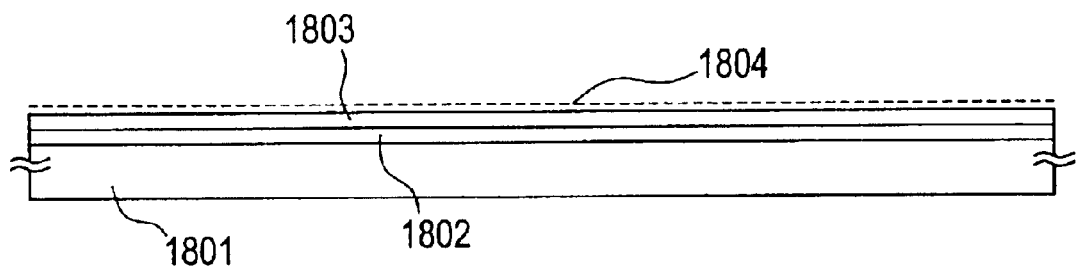
FIGS. 18A and 18B are views showing fabricating steps of a crystalline silicon film.
Figure 18B:
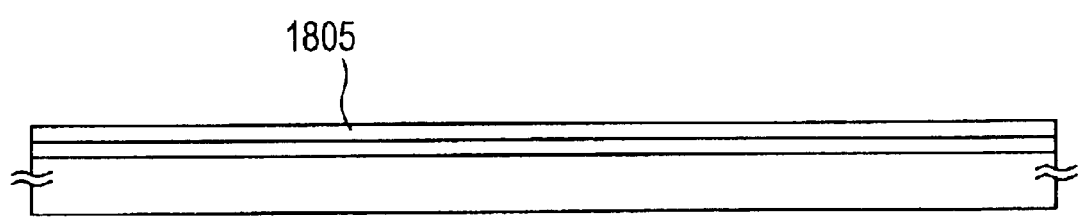

Here, an example of a case where the technique disclosed in Japanese Patent Application Laid-open No. Hei. 7-130652 is applied to the present invention will be described in FIGS. 18A and 18B. First, a silicon oxide film 1802 was formed on a silicon substrate 1801 and an amorphous silicon film 1803 was formed thereon. Further, a nickel acetate salt solution containing nickel of 10 ppm in terms of weight was applied to form a nickel containing layer 1804 (FIG. 18A).

Next, after a dehydrogenating step at 500° C. for 1 hour was carried out, a heat treatment at 500 to 650° C. for 4 to 12 hours, for example, at 550° C. for 8 hours was carried out, so that a crystalline silicon film 1805 was formed. The crystalline silicon film 1805 obtained in this way had extremely superior crystallinity (FIG. 18B).

The technique disclosed in Japanese Patent Application Laid-open No. Hei. 8-78329 is such that selective crystallization of an amorphous semiconductor film is made possible by selectively adding a catalytic element. A case where the technique is applied to the present invention will be described with reference to FIGS. 19A and 19B.

First, a silicon oxide film 1902 was formed on a glass substrate 1901, and an amorphous silicon film 1903 and a silicon oxide film 1904 were continuously formed thereon. At this time, the thickness of the silicon oxide film 1904 was made 150 nm.

Figure 19A:
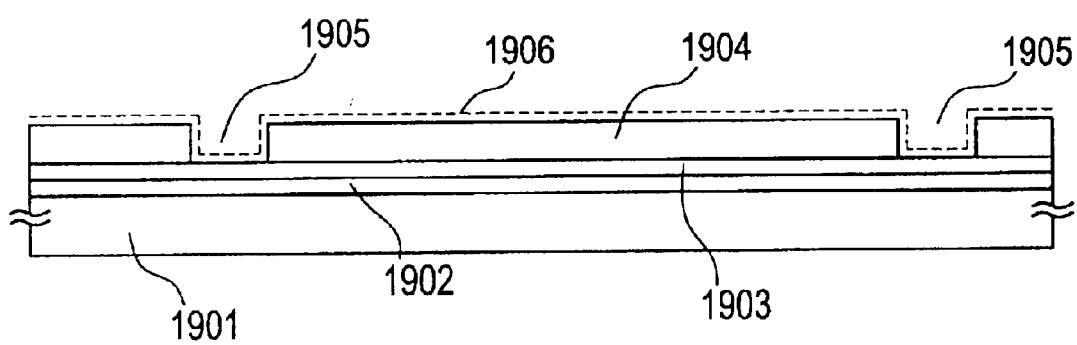
FIGS. 19A and 19B are views showing fabricating steps of a crystalline silicon film.

Next, the silicon oxide film 1904 was patterned to selectively form opening portions 1905. Thereafter, a nickel acetate salt solution containing nickel of 10 ppm in terms of weight was applied. By this, a nickel containing layer 1906 was formed, and the nickel containing layer 1906 was brought into contact with the amorphous silicon film 1902 at only the bottoms of the opening portions 1905 (FIG. 19A).

Figure 19B:
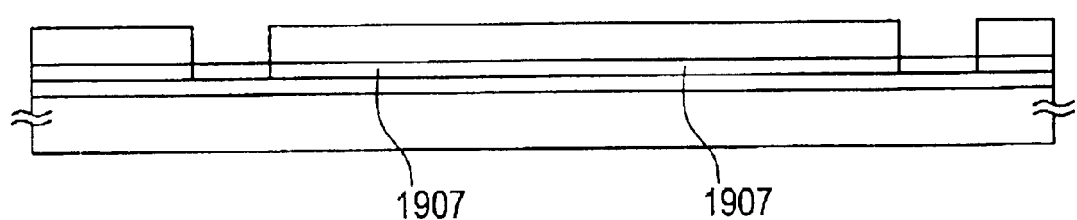

Next, a heat treatment at 500 to 650° C. for 4 to 24 hours, for example, at 570° C. for 14 hours was carried out, so that a crystalline silicon film 1907 was formed. In this crystallizing process, a portion with which nickel is in contact is first crystallized, and crystal growth progresses in the lateral direction therefrom. The thus formed crystalline silicon film 1907 comprises a collective of rod-like or needle-like crystals, and each crystal macroscopically grows with certain directionality. Thus, there is an advantage, that crystallinity is uniform (FIG. 19B).

In the foregoing two techniques, instead of nickel (Ni), an element such as germanium (Ge), iron (Fe), palladium (Pd), tin (Sn), lead (Pb), cobalt (Co), platinum (Pt), copper (Cu), or gold (Au) may be used.

If a crystalline semiconductor film (including a crystalline silicon film, a crystalline silicon germanium film, etc.) is formed by using the technique as described above, and patterning is carried out, a semiconductor layer of a crystalline TFT can be formed. Although superior characteristics can be obtained in the TFT fabricated from the crystalline semiconductor by using the technique of this embodiment, high reliability has been required because of that. However, when the TFT structure of the present invention is adopted, it becomes possible to fabricate a TFT which utilizes the technique of this embodiment to the utmost.

[Embodiment 4]

In this embodiment, a description will be made on an example in which as a method of forming a semiconductor layer used in the embodiment 1, after a crystalline semiconductor film is formed using an amorphous semiconductor film as an initial film and using a catalytic element, a step of removing the catalytic element from the crystalline semiconductor film is carried out. As a method thereof, this embodiment uses a technique disclosed in Japanese Patent Application Laid-open No. 10-247735, No. Hei. 10-135468, or No. Hei. 10-135469.

The technique disclosed in the publications is such that a catalytic element used for crystallization of an amorphous semiconductor film is removed after crystallization by using a gettering function of phosphorus. By using the technique, it is possible to reduce a concentration of a catalytic element in a crystalline semiconductor film to $1 \times 10^{17}$ atoms/cm$^3$ or less, preferably $1 \times 10^{16}$ atoms/cm$^3$ or less.

Figure 20A:
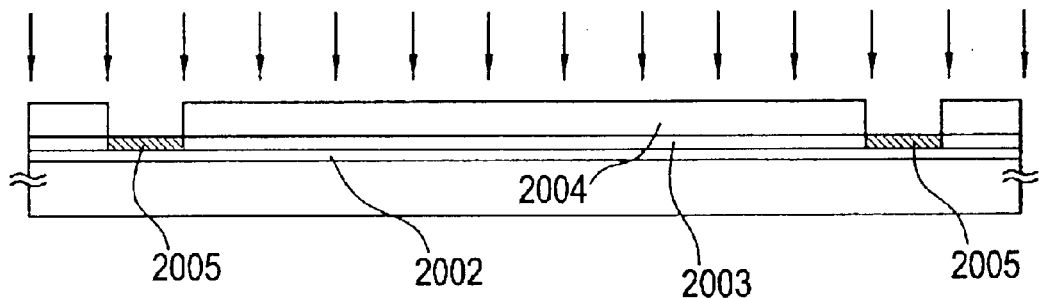
FIGS. 20A and 20B are views showing fabricating steps of a crystalline silicon film.
Figure 20B:
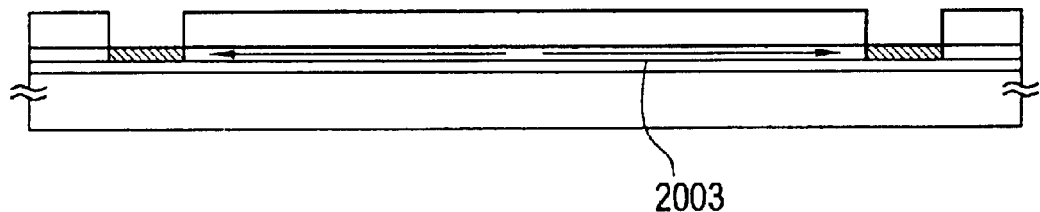

A structure of this embodiment will be described with reference to FIGS. 20A and 20B. Here, an alkali-free glass substrate typified by a substrate of 1737 glass made by Corning Inc. was used. FIG. 20A shows a state in which an underlayer film 2002 and a crystalline silicon film 2003 were formed by using the technique described in the embodiment 3. Then, a silicon oxide film 2004 for masking was formed to a thickness of 150 nm on the surface of the crystalline silicon film 2003, and opening portions were provided by patterning, so that regions where the crystalline silicon film was exposed were provided. Then, a step of adding phosphorus was carried out so that a region 2005 added with phosphorus was provided in the crystalline silicon film.

In this state, when a heat treatment at 550 to 800° C. for 5 to 24 hours, for example, at 600° C. for 12 hours was carried out in a nitrogen atmosphere, the region 2005 where phosphorus was added in the crystalline silicon film functioned as a gettering site, so that it was possible to segregate the catalytic element remaining in the crystalline silicon film 2003 into the region 2005 added with phosphorus.

By removing the silicon oxide film 2004 for masking and the region 2005 added with phosphorus, it was possible to obtain a crystalline silicon film in which the concentration of the catalytic element used in the step of crystallization was reduced to $1 \times 10^{17}$ atoms/cm$^3$ or less. It was possible to use this crystalline silicon film without any change as the semiconductor layer of the TFT of the present invention described in the embodiment 1.

[Embodiment 5]

In this embodiment, a description will be made on another example in which a semiconductor layer and a gate insulating film are formed in a step of fabricating a TFT of the present invention described in the embodiment 1. A structure of this embodiment will be described with reference to FIGS. 21A and 21B.

Figure 21A:
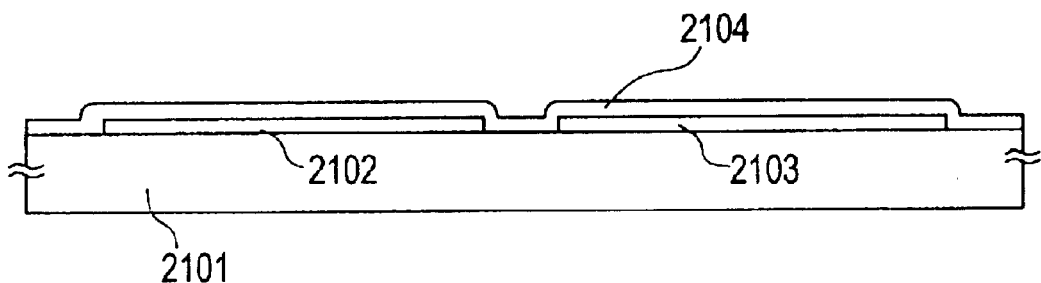
FIGS. 21A and 21B are views showing fabricating steps of a crystalline silicon film.

Here, a substrate having heat resistance of at least about 700 to 1100° C. was necessary and a quartz substrate 2101 was used. The technique disclosed in the embodiment 3 and the embodiment 4 was used to form a crystalline semiconductor. For the purpose of making this a semiconductor layer of a TFT, this was patterned into island-like regions so that semiconductor layers 2102 and 2103 were formed. A gate insulating film 2104 covering the semiconductor layers 2102 and 2103 was comprising a film containing silicon oxide as its main material. In this embodiment, a silicon nitride oxide film having a thickness of 70 nm was formed by a plasma CVD method (FIG. 21A).

Figure 21B:
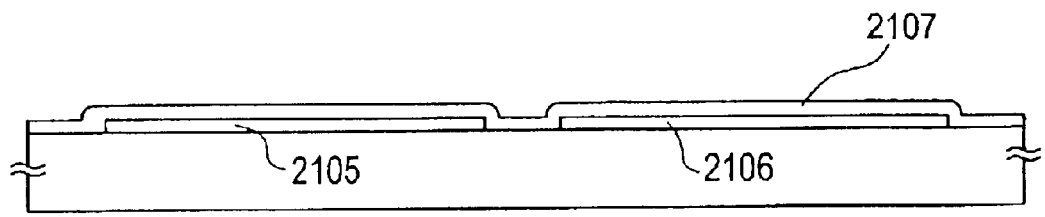

Then, a heat treatment was carried out in an atmosphere containing a halogen (typically, chlorine) and oxygen. In this embodiment, the heat treatment was carried out at 950° C. for 30 minutes. Incidentally, it was appropriate that the processing temperature was selected within the range of 700 to 1100° C. and the treatment time was selected within the range of 10 minutes to 8 hours (FIG. 21B).

As a result, under the condition of this embodiment, thermal oxidation films were formed between the semiconductor layers 2102, 2103 and the gate insulating film 2104, so that gate insulating films 2107 were formed. Moreover, in the process of oxidation in the halogen atmosphere, an impurity contained in the gate insulating film 2104 and the semiconductor layers 2102 and 2103, especially a metal impurity element was combined with the halogen to form a compound, so that it was possible to remove the impurity element into the vapor phase.

The gate insulating films 2107 fabricated through the above steps had a high withstand voltage, and interfaces between the semiconductor layers 2105, 2106 and the gate insulating films 2107 were very excellent. In order to obtain the structure of the TFT of the present invention, it was satisfactory if the subsequent steps were carried out in accordance with the embodiment 1.

[Embodiment 6]

In this embodiment, a description will be made on an example in which in a method of fabricating an active matrix substrate through steps described in the embodiment 1 after forming a crystalline semiconductor film by a method described in the embodiment 3, a catalytic element used in a step of crystallization is removed by gettering. In the embodiment 1, the semiconductor layers 903, 904 and 905 shown in FIG. 9A were crystalline silicon films fabricated by using a catalytic element. At this time, since the catalytic element used in the step of crystallization remained in the semiconductor layers, it was desirable to carry out a step of gettering.

Here, the process up to the step shown in FIG. 10B was carried out as it was. Then, the resist masks 945, 946, 947, 948, 949, 950 and 951 were removed.

As shown in FIG. 22A, new resist masks 2201, 961, 962, 963, 964 and 965 were formed. Then, a doping step of giving the n type was carried out. Regions 2202, 2203, 966, 967, 968, 969, and 970 added with phosphorus were formed in the semiconductor layer.

Although boron of an impurity element to give the p type was already added in the regions 2202 and 2203 where phosphorus was added, since the concentration of phosphorus is $1 \times 10^{19}$ to $1 \times 10^{21}$ atoms/cm$^3$ and phosphorus was added at a concentration of about one half of a concentration of boron, it did not have any influence ON characteristics of the p-channel TFT.

In this state, a heat treatment at 400 to 800° C. for 1 to 24 hours, for example, at 600° C. for 12 hours was carried out in a nitrogen atmosphere. By this step, it was possible to activate the added impurity elements to give the n type and p type. Further, the regions added with phosphorus became gettering sites, so that it was possible to segregate the catalytic element remaining after the crystallization step. As a result, it was possible to remove the catalytic element from channel forming regions (FIG. 22B).

After the step of FIG. 22B was completed, by carrying out subsequent steps in accordance with the steps of the embodiment 1 to form the state of FIG. 11, it was possible to fabricate an active matrix substrate.

[Embodiment 7]

In this embodiment, a description will be made on a process of fabricating an active matrix type liquid crystal display device from an active matrix substrate fabricated with the techniques of the embodiments 1 to 6.

Figure 13A:
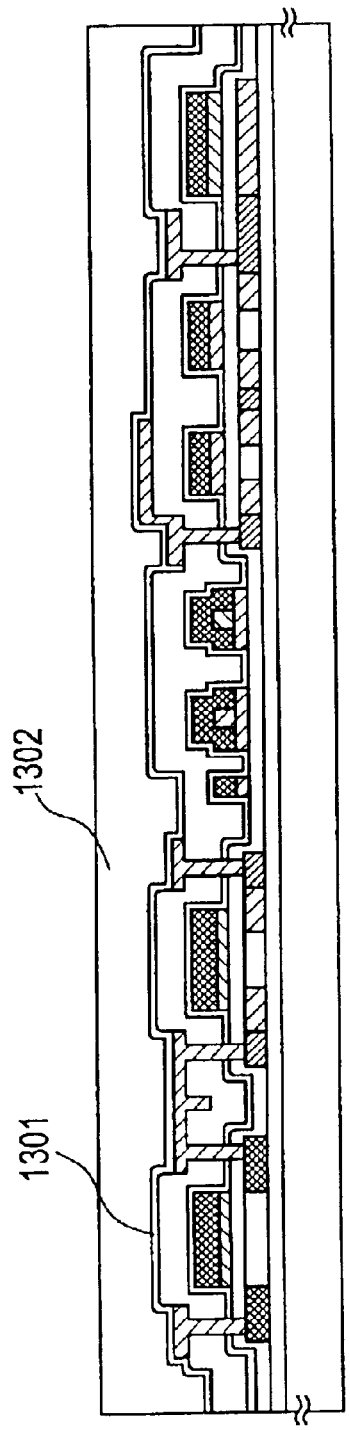
FIGS. 13A and 13B are views showing fabricating steps of a liquid crystal display device.

A passivation film 1301 was formed to the active matrix substrate in the state of FIG. 11. The passivation film 1301 was made of a silicon nitride film having a thickness of 50 nm. Further, a second interlayer insulating film 1302 made of organic resin was formed to a thickness of about 1,000 nm as shown in FIG. 13A. As the organic resin, polyimide, acryl, polyimidoamide, etc. may be used. As advantages obtained by using the organic resin film, it is possible to enumerate such points that a film formation method is simple, parasitic capacitance can be reduced since its relative dielectric constant is low, and flatness is superior. An organic resin film other than the above may be used. Here, polyimide of such a type that thermal polymerization was made after application to the substrate was used, and was fired at 300° C. to form the film.

Figure 13B:
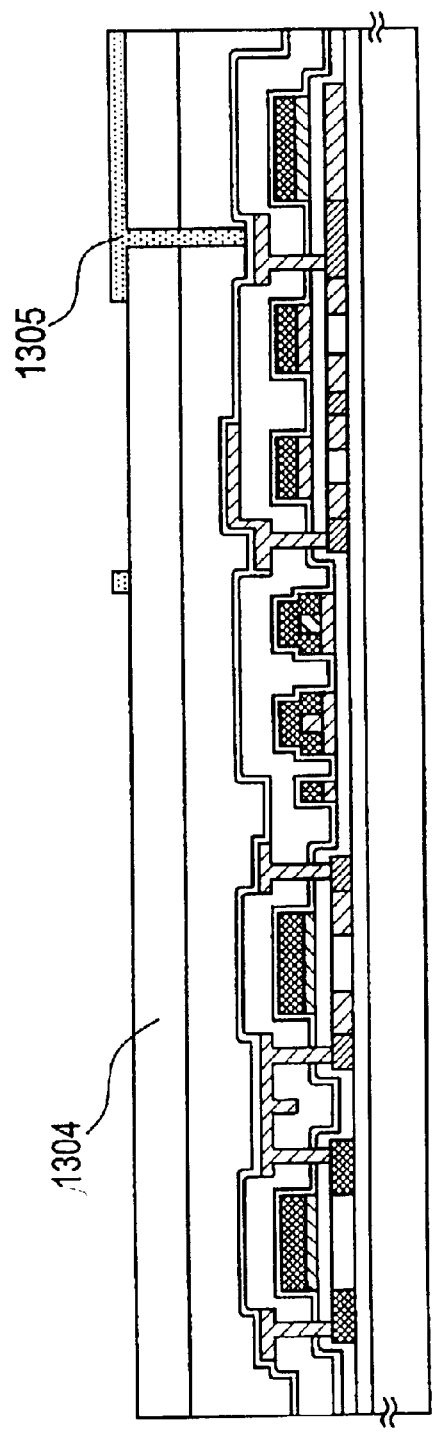

Further, a third interlayer insulating film was formed as shown in FIG. 13B. The third interlayer insulating film 1304 was formed by using an organic resin film of polyimide or the like. A contact hole reaching the drain electrode 977 was formed in the third interlayer insulating film 1304, the second interlayer insulating film 1302, and the passivation film 1301, and a pixel electrode 1305 was formed. With respect to the pixel electrode 1305, it is appropriate that a transparent conductive film is used in the case where a transmission type liquid crystal display device is formed, and a metal film is used in the case where a reflection type liquid crystal display device is formed. Here, for the purpose of making the transmission type liquid crystal display device, an indium-tin oxide (ITO) film having a thickness of 100 nm was formed by a sputtering method, so that the pixel electrode 1305 was formed.

Next, as shown in FIG. 14, an orientated film 1401 was formed on the third interlayer insulating film 1304 and the pixel electrode 1305. In general, a polyimide resin is often used for an oriented film of a liquid crystal display device. A transparent electrode 1403 and an oriented film 1404 were formed on an opposite side substrate 1402. The oriented film was subjected to a rubbing process after formation so that liquid crystal molecules were made to be oriented in parallel and with a certain pretilt angle.

After the foregoing steps, the active matrix substrate on which the pixel region and the CMOS circuit were formed and the opposite substrate were bonded to each other by a well-known cell assembling step through a sealing material, a spacer (both are not shown), and the like. Thereafter, a liquid crystal material 1405 was injected between both the substrates, and complete sealing was made by a sealing agent (not shown). Thus, the active matrix type liquid crystal display device shown in FIG. 14 was completed.

Figure 15:
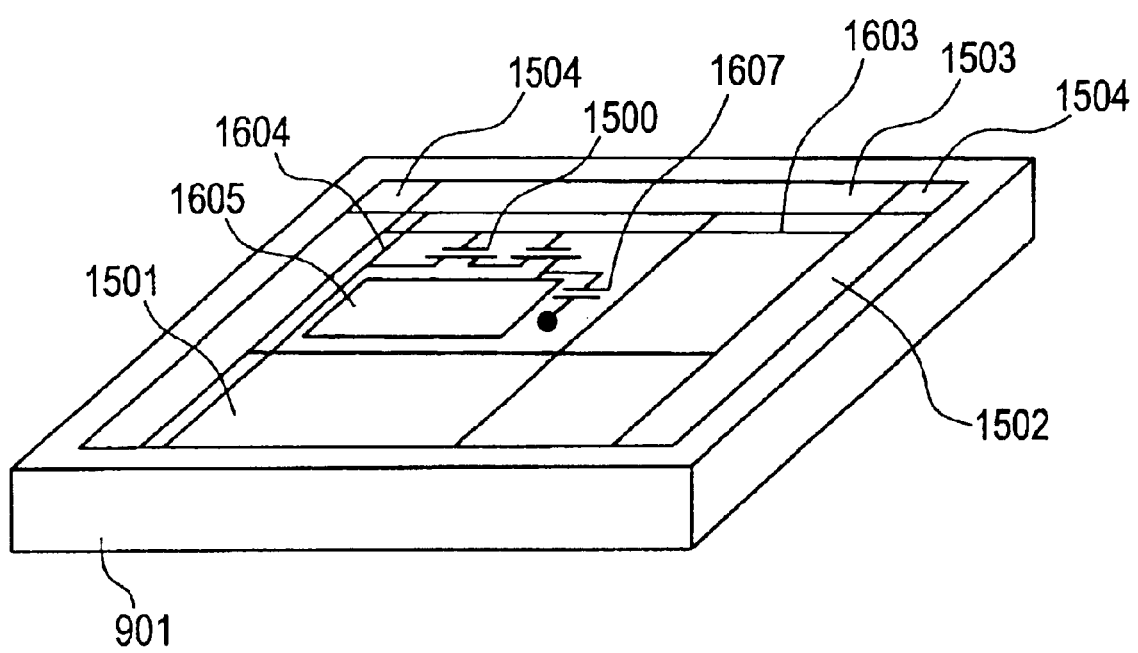
FIG. 15 is a perspective view of an active matrix substrate.

Next, a structure of an active matrix type liquid crystal display device of this embodiment will be described with reference to FIGS. 15 and 16. FIG. 15 is a perspective view of an active matrix substrate of this embodiment. The active matrix substrate is constructed by a pixel portion 1501, a scanning (gate) line driver circuit 1502, and a data (source) line driver circuit 1503 formed on a glass substrate 901. A pixel TFT 1500 is an n-channel TFT, and the driver circuits provided at the periphery comprise a CMOS circuit as a base. The scanning (gate) line driver circuit 1502 and the data (source) line driver circuit 1503 are connected to the pixel portion 1501 through a gate wiring line 1603 and a source wiring line 1604, respectively.

Figure 16:
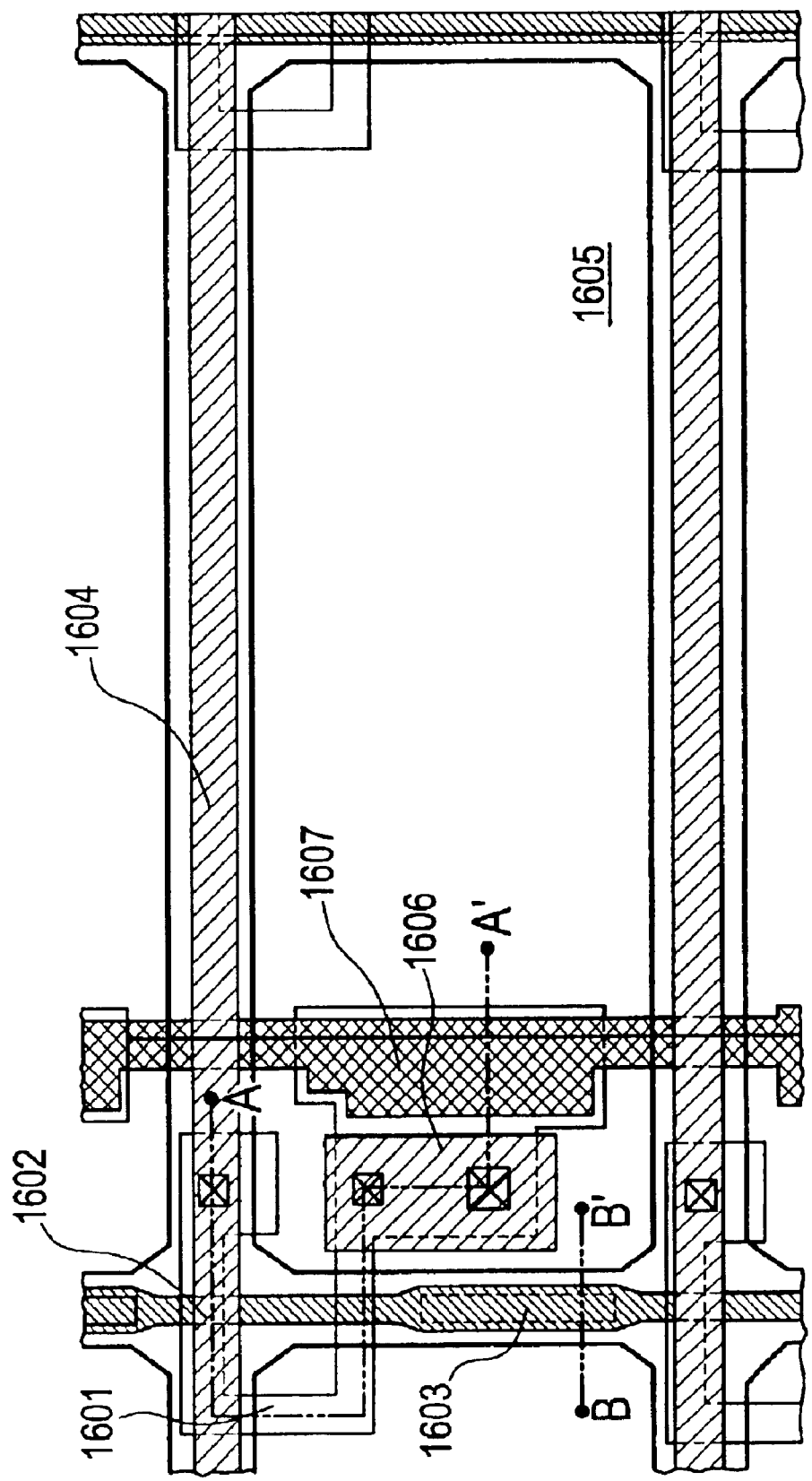
FIG. 16 is a top view of a pixel region.

FIG. 16 is a top view of the pixel portion 1501 and is a top view of about one pixel. The pixel TFT is an n-channel TFT. A gate electrode 1602 formed to be connected with the gate wiring line 1603 intersects through a not-shown gate insulating film with a semiconductor layer 1601 thereunder. Although not shown, a source region, a drain region, and a first impurity region are formed in the semiconductor layer. At a drain side of the pixel TFT, a holding capacitance 1607 comprises the semiconductor layer, the gate insulating film, and an electrode made of the same material as the gate electrode. A sectional structure along line A–A' and line B–B' shown in FIG. 16 corresponds to the sectional view of the pixel region shown in FIG. 14.

In this embodiment, although the pixel TFT 1500 has a double gate structure, a single gate structure may be adopted, or a multi gate structure of a triple gate may be adopted. The structure of the active matrix substrate of the invention is not limited to the structure of this embodiment. Since the structure of the present invention is characterized in the structure of a gate electrode, and the structure of a source region, a drain region and other impurity regions of a semiconductor layer provided through a gate insulating film, other structures may be suitably determined by an operator.

[Embodiment 8]

In this embodiment, another structural example of a pixel region of an active matrix type liquid crystal display device will be described with reference to FIGS. 17A and 17B.

Figure 17A:
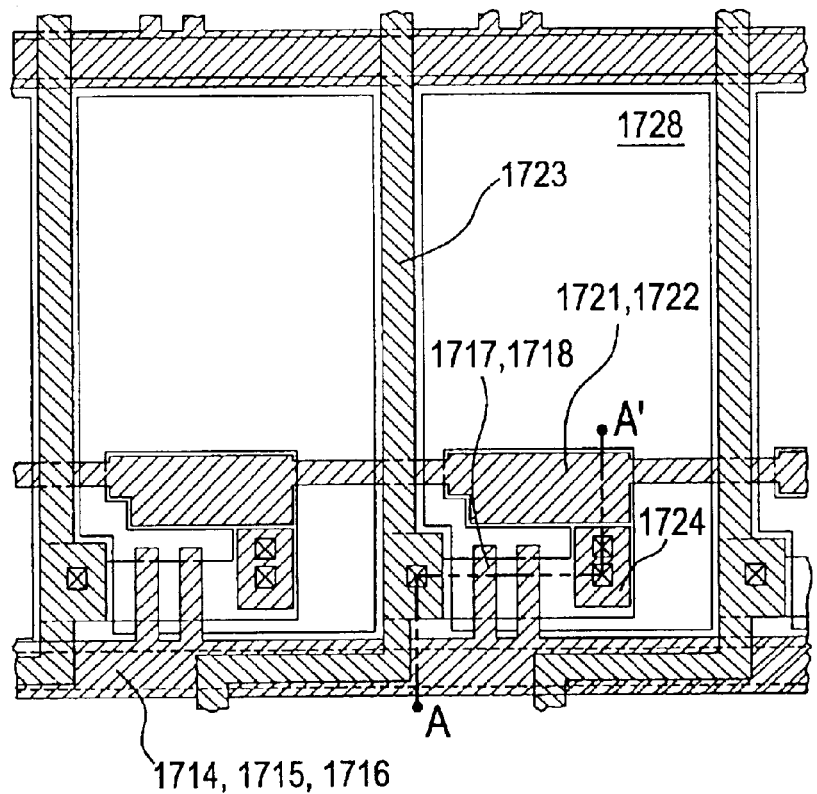
FIGS. 17A and 17B are a top view and a sectional view of a pixel region.
Figure 17B:
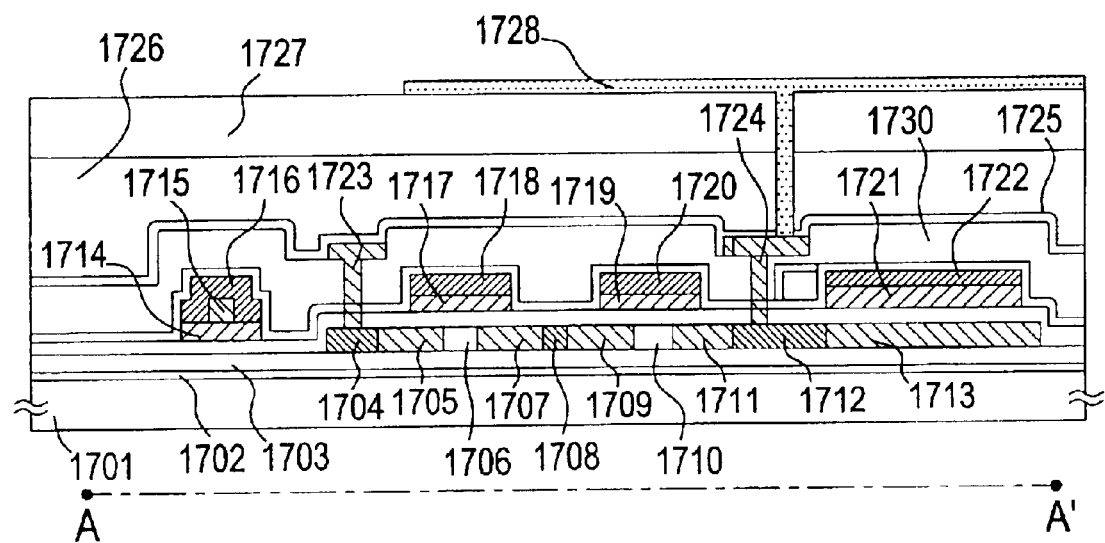

FIG. 17A is a top view of a pixel region and is a top view of about one pixel. In the pixel region, an n-channel TFT is provided. An A–A' section of FIG. 17A corresponds to FIG. 17B. A gate wiring line has a clad type structure and comprises a first conductive layer 1714, a second conductive layer 1716, and a third conductive layer 1715. Gate electrodes connected to the gate wiring line comprise first conductive layers 1717 and 1719 and second conductive layers 1718 and 1720. Although not shown in FIG. 17A, a source region, a drain region and a first impurity region are formed in a semiconductor layer. A substrate 1701 has an underlayer film comprising SiN 1702 and an underlayer film comprising $SiO_2$ 1703 thereon. A semiconductor layer in the pixel region has first impurity regions 1704 (source region) and 1712 (drain region), second impurity regions 1705, 1707, 1709, 1711 (LDD regions), channel forming regions 1706, 1710, a low concentration impurity region 1713. At a drain side of the pixel TFT, a holding capacitance comprises the semiconductor layer, a gate insulating film, and an electrode comprising the same material as the gate electrode. Holding capacitance electrodes 1721 and 1722 are formed over a gate insulating film. Source electrode 1723 and drain electrode 1724 are connected to the semiconductor layer. Then, a first interlayer insulating film 1730, a passivation film 1725, a second interlayer insulating film 1726, third insulating film 1727, and a pixel electrode 1728 are formed.

[Embodiment 9]

Figure 23:
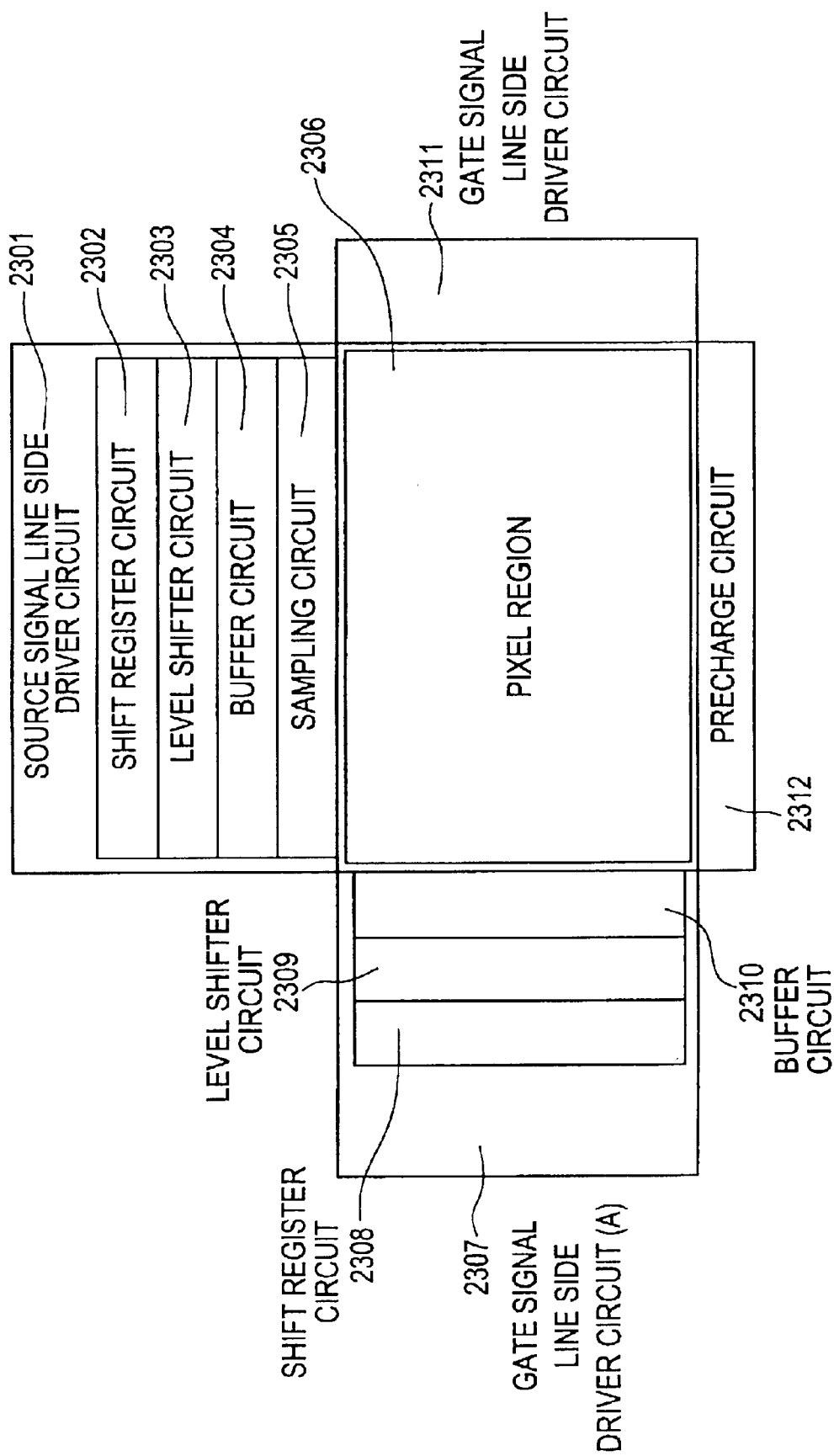
FIG. 23 is a circuit block diagram of an active matrix type liquid crystal display device according to a mode of the invention.

FIG. 23 shows an example of a circuit structure of an active matrix type liquid crystal display device shown in the embodiment 7. The active matrix type liquid crystal display device of this embodiment includes a source signal line side driver circuit 2301, a gate signal line side driver circuit (A) 2307, a gate signal line side driver circuit (B) 2311, a precharge circuit 2312 and a pixel region 2306.

The source signal line side driver circuit 2301 includes a shift register circuit 2302, a level shifter circuit 2303, a buffer circuit 2304 and a sampling circuit 2305.

The gate signal line side driver circuit (A) 2307 includes a shift register circuit 2308, a level shifter circuit 2309, and a buffer circuit 2310. The gate signal line side driver circuit (B) 2311 has also the same structure.

Here, an example of driving voltage of each circuit will be shown. The shift register circuit 2302 and 2308 had 10 to 16 V, and the level shifter circuits 2303 and 2309, the buffer circuits 2304 and 2310, the sampling circuit 2305, and the pixel region 2306 had 14 to 16 V. With respect to the sampling circuit 2305 and the pixel region 2306, the value was an amplitude of an applied voltage, and generally reversed voltages were alternately applied.

In the present invention, it is easy to make the lengths of second impurity regions, which become LDD regions, different from each other on the same substrate in view of driving voltages of n-channel TFTs, and it was possible to form the optimum shapes for TFTs constituting the respective circuits through the same step.

Figure 24A:
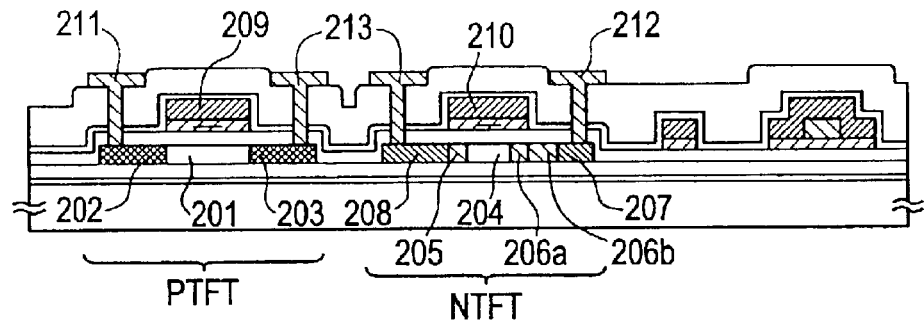
FIGS. 24A to 24D are views showing a structure of a TFT of the invention.

FIG. 24A shows a structural example of a TFT of a shift register circuit. An n-channel TFT of the shift register circuit has a single gate, and a second impurity region which becomes an LDD region is provided at only a drain side. Here, the lengths of an LDD region (GOLD region) 206a overlapping with a gate electrode and an LDD region 206b not overlapping with the gate electrode may be determined in accordance with FIG. 26C, and the regions can be formed such that the region 206a has a length of 2.0 μm and the region 206b has a length of 1.0 μm.

Figure 24B:
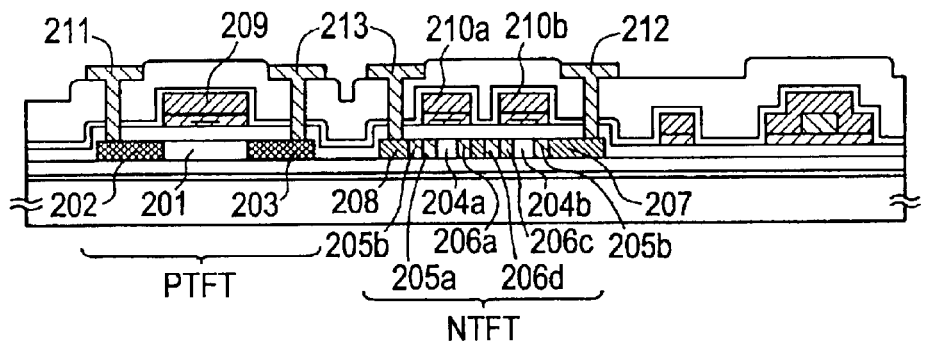

FIG. 24B shows a structural example of a TFT of a level shifter circuit or a buffer circuit. An n-channel TFT of these circuits is made to have a double gate, and a second impurity region which becomes an LDD region is provided at a drain side. For example, the length of each of LDD regions (GOLD regions) 205a and 205c overlapping with gate electrodes can be made 2.5 μm, and the length of each of LDD regions 205b and 205d not overlapping with the gate electrodes can be made 2.5 μm. Of course, the gate electrode of the TFT is not limited to the double gate structure. It may be a single gate structure or a multi gate structure having a plurality of gate electrode.

Since a level shifter circuit and a buffer circuit need to have a high current driving performance, TFT's in the level shifter circuit and the buffer circuit are easy to deteriorate due to kink effect. However, the deterioration of the TFT's can be prevented by forming the LDD region as shown in FIG. 24B.

Figure 24C:
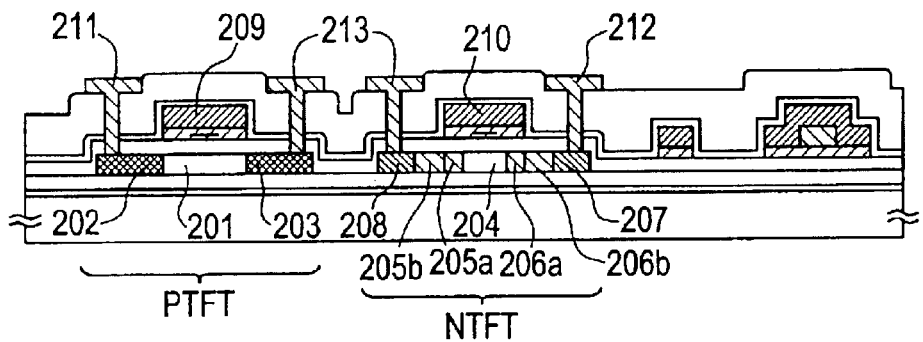

FIG. 24C shows a structural example of a TFT of a sampling circuit. Although an n-channel TFT of this circuit has a single gate, since the polarity is inverted, a second impurity region which becomes an LDD region is provided at both sides of a source side and a drain side. It is preferable that the lengths of LDD regions (GOLD regions) 205a and 206a overlapping with a gate electrode and the lengths of LDD regions 205b and 206b not overlapping with the gate electrode are respectively made equal to each other. For example, the lengths of the LDD regions (GOLD regions) overlapping with the gate electrode can be made 1.5 μm, and the lengths of the LDD regions 205b and 206b not overlapping with the gate electrode can be made 1.0 μm.

Figure 24D:
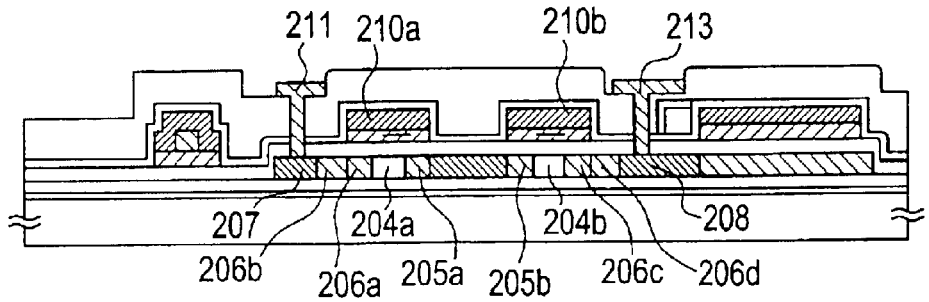

FIG. 24D shows a structural example of a pixel region. Although an n-channel TFT of this circuit has a multi gate, since the polarity is inverted, a second impurity region which becomes an LDD region is provided at both sides of a source side and a drain side. For example, the lengths of LDD regions (GOLD regions) 205a, 205b, 206a, and 206c overlapping with a gate electrode can be made 1.5 μm, and the lengths of LDD regions 206b and 206d not overlapping with the gate electrode can be made 1.5 μm.

[Embodiment 10]

In this embodiment, a description will be given on a semiconductor device incorporating an active matrix liquid crystal display device made from a TFT circuit of the present invention, with reference to FIGS. 25A to 25F, FIGS. 33A to 33C and FIGS. 34A to 34D.

As such a semiconductor device, a portable information terminal (an electronic book, a mobile computer or a cellular phone), a video camera, a still-image camera, a personal computer, TV etc. may be enumerated. Examples of those are shown in FIGS. 25A to 25F.

Figure 25A:
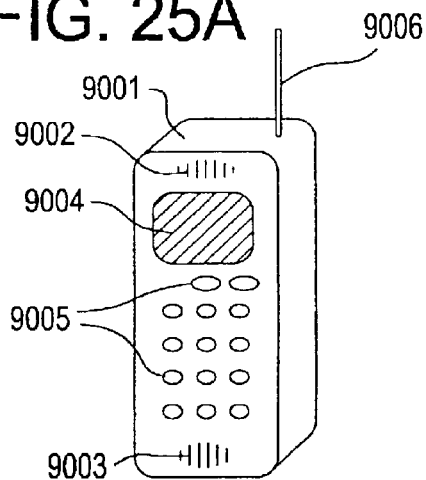
FIGS. 25A to 25F are views showing examples of semiconductor devices.

FIG. 25A is a cellular phone that is composed of a main body 9001, a sound output section 9002, a sound input section 9003, a display device 9004, operation switches 9005, and an antenna 9006. The present invention can be applied to the sound output section 9002, the sound input section 9003 and the display device 9004 having an active matrix substrate.

Figure 25B:
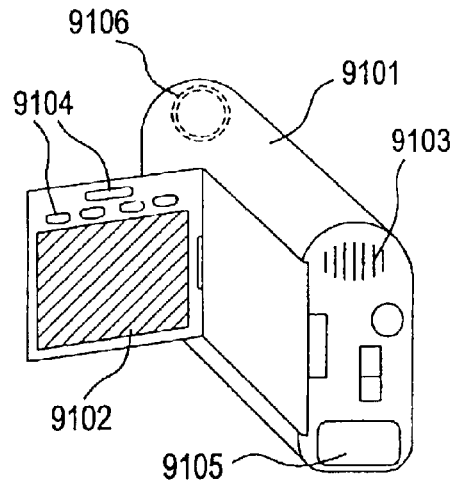

FIG. 25B shows a video camera that is comprised of a main body 9101, a display device 9102, a voice input unit 9103, operation switches 9104, a battery 9105, and an image receiving unit 9106. The present invention is applicable to the voice input unit 9103, the display device 9102 having an active matrix substrate and the image receiving unit 9106.

Figure 25C:
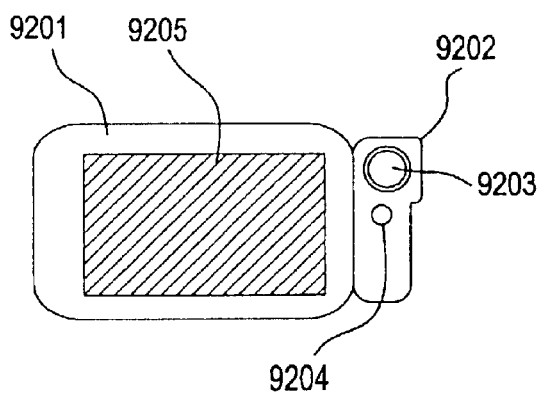

FIG. 25C shows a mobile computer that is comprised of a main body 9201, a camera unit 9202, an image receiving unit 9203, operation switches 9204, and a display device 9205. The present invention can be applied to the image receiving unit 9203 and the display device 9205 having an active matrix substrate.

Figure 25D:
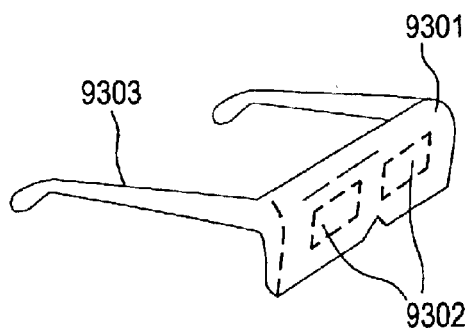

FIG. 25D shows a head mount display that is comprised of a main body 9301, a display device 9302 and arm portions 9303. The present invention can be applied to the display device 9302. Further, although not shown, the present invention can also be used for other signal control circuits.

Figure 25E:
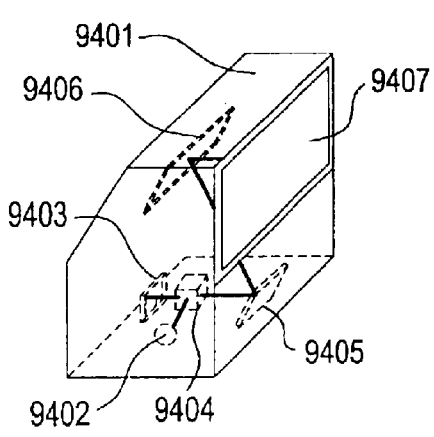

FIG. 25E shows a rear-type projector that is comprised of a main body 9401, a light source 9402, display device 9403, a polarization beam splitter 9404, reflectors 9405 and 9406, and a screen 9407. The present invention can be applied to the display device 9403.

Figure 25F:
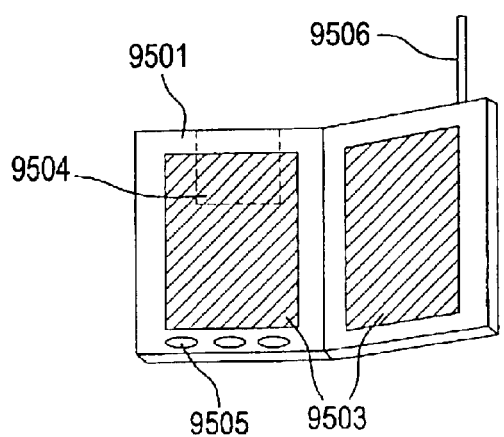

FIG. 25F shows a portable electronic book that is comprised of a main body 9501, display devices 9502, 9503, a memory medium 9504, an operation switch 9505 and an antenna 9506. The book is used to display data stored in a mini-disk or a DVD, or a data received with the antenna. The display devices 9502, 9503 are direct-vision type display devices, to which the present invention may be applied.

Figure 33A:
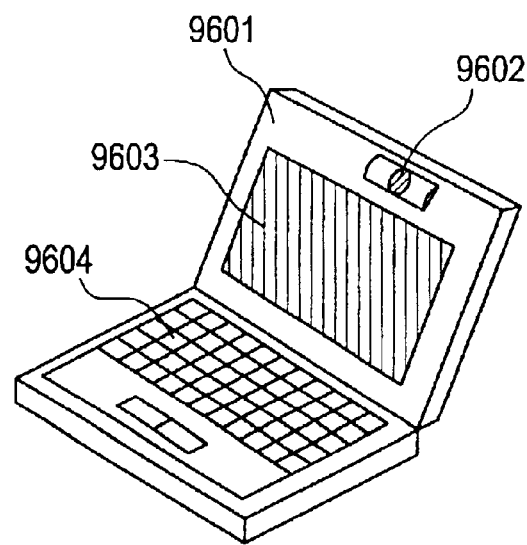
FIGS. 33A to 33C and 34A to 34D are views showing examples of semiconductor devices.

FIG. 33A shows a personal computer comprising a main body 9601, an image inputting unit 9602, a display device 9603 and a key board 9604.

Figure 33B:
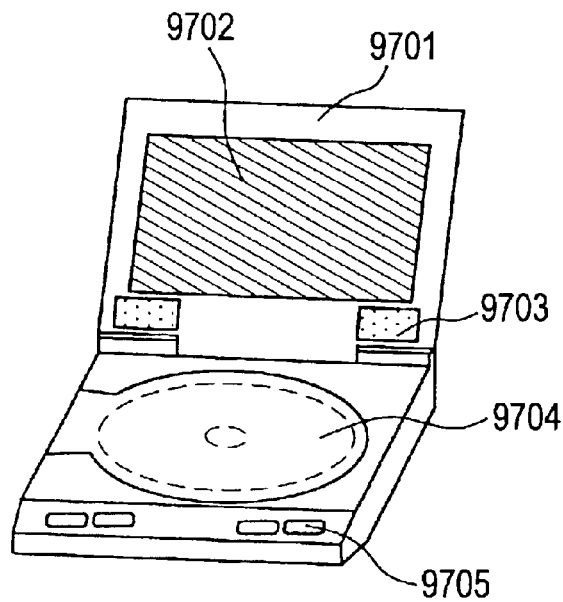

FIG. 33B shows a player that employs a recording medium in which programs are recorded (hereinafter referred to as recording medium), and comprises a main body 9701, a display device 9702, a speaker unit 9703, a recording medium 9704, and an operation switch 9705. Incidentally, this player uses as the recording medium a DVD (Digital Versatile Disc), CD and the like to appreciate music and films, play games, and connect to the Internet.

Figure 33C:
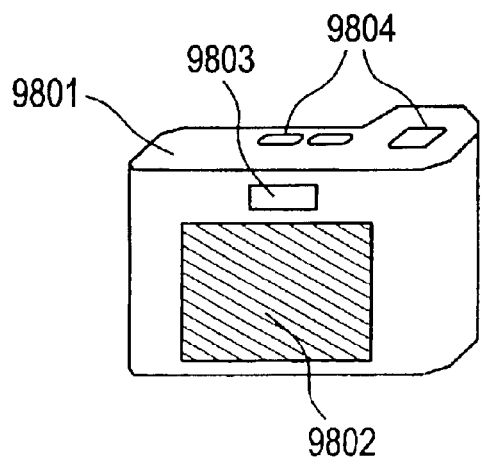

FIG. 33C shows a digital camera comprising a main body 9801, a display device 9802, an eye piece section 9803, operation switches 9804, and an image receiving unit (not shown).

Figure 34A:
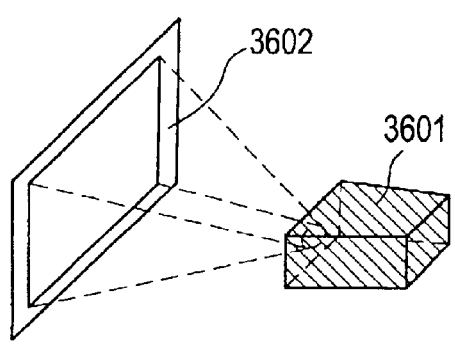

FIG. 34A shows a front-type projector comprising a projection device 3601 and a screen 3602. The present invention is applicable to the projection device 3601 and other signal control circuits.

Figure 34B:
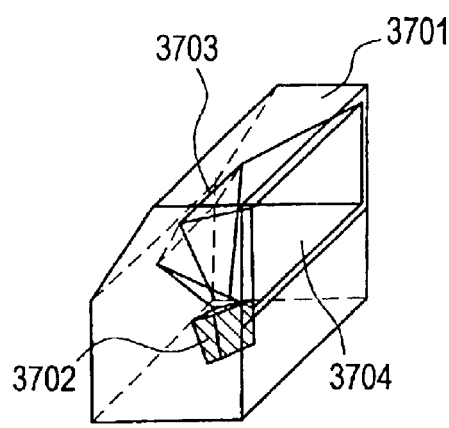

FIG. 34B shows a rear-type projector comprising a main body 3701, a projection device 3702, a mirror 3703, and a screen 3704. The present invention is applicable to the projection device 3702 (specially, it effects in case of 50–100 inch projector) and other signal control circuits.

Figure 34C:
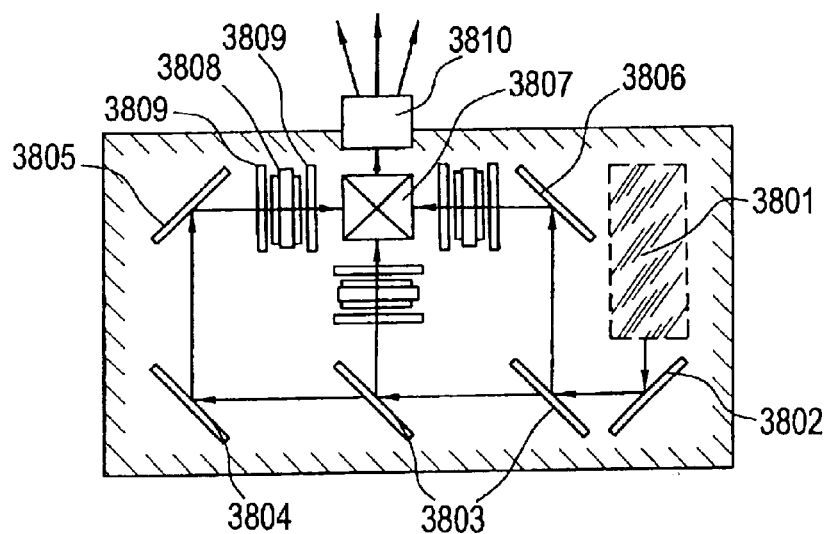

FIG. 34C is a diagram showing an example of the structure of the projection devices 3601, 3702 in FIGS. 34A and 34B. The projection device 3601 or 3702 comprises a light source optical system 3801, mirrors 3802, 3804 to 3806, dichroic mirrors 3803, a prism 3807, liquid crystal display devices 3808, phase difference plates 3809, and a projection optical system 3810. The projection optical system 3810 is composed of an optical system including a projection lens. This example shows an example of "Three plate type" but not particularly limited thereto. For instance, the invention may be applied also to a "Single plate type" optical system. Further, in the light path indicated by an arrow in FIG. 34C, an optical system such as an optical lens, a film having a polarization function, a film for adjusting a phase difference, and an IR film may be suitably provided by a person who carries out the invention.

Figure 34D:
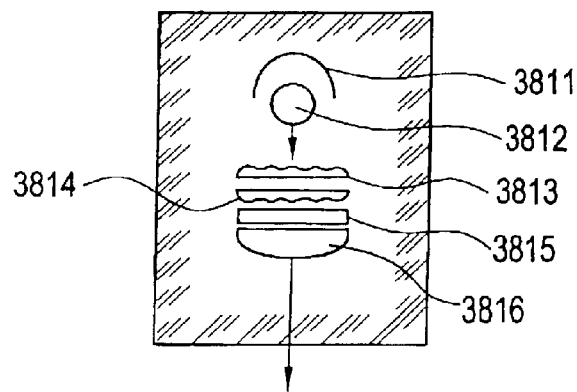

FIG. 34D is a diagram showing an example of the structure of the light source optical system 3801 in FIG. 34C. In this embodiment, the light source optical system 3801 comprises a reflector 3811, a light source 3812, lens arrays 3813, 3814, a polarization conversion element 3815, and a condenser lens 3816. The light source optical system shown in FIG. 34D is merely an example, and is not particularly limited to the illustrated structure. For example, a person who carries out the invention is allowed to suitably add to the light source optical system an optical system such as an optical lens, a film having a polarization function, a film for adjusting a phase difference, and an IR film.

Other than those, the present invention may be applied to an image sensor and an EL display element. The present invention thus has so wide application range that it is applicable to electronic equipment in any field.

[Embodiment 11]

In this embodiment, a description will be made on an example in which an EL (electroluminescence) display panel (also called an EL display device) is fabricated using the present invention.

Figure 27A:
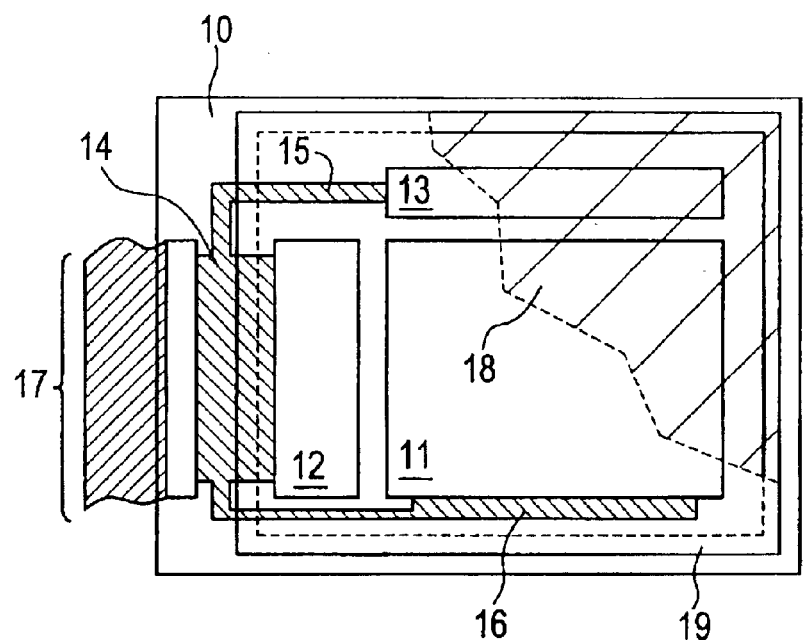
FIGS. 27A and 27B are views showing an outer appearance of an EL display panel and its sectional structure.

FIG. 27A is a top view of an EL display panel using the present invention. In FIG. 27A, reference numeral 10 designates a substrate; 11, a pixel portion; 12, a source side driver circuit; and 13, a gate side driver circuit. The respective driver circuits lead to an FPC 17 through wiring lines 14 to 16 and are connected to an external equipment.

At this time, a sealing material (also called a housing material) 18 is provided so as to surround at least the pixel portion, preferably the driver circuits and the pixel portion. As the sealing material 18, a glass plate or plastic plate having a recess portion capable of surrounding a component portion may be used, or an ultraviolet ray curing resin may be used. In the case where the plastic plate having the recess portion capable of surrounding the component portion is used as the sealing material 18, the plate is bonded to the substrate 10 by an adhesive 19, and a sealed space is formed against the substrate 10. At this time, an EL element is put in such a state that it is completely enclosed in the sealed space, and it is completely insulated from the outer air.

Further, it is preferable that an inert gas (argon, helium, nitrogen, etc.) is filled in a gap 20 between the sealing material 18 and the substrate 10, or a drying agent such as barium oxide is provided in the gap. By this, it is possible to suppress deterioration of the EL element due to moisture or the like.

Figure 27B:
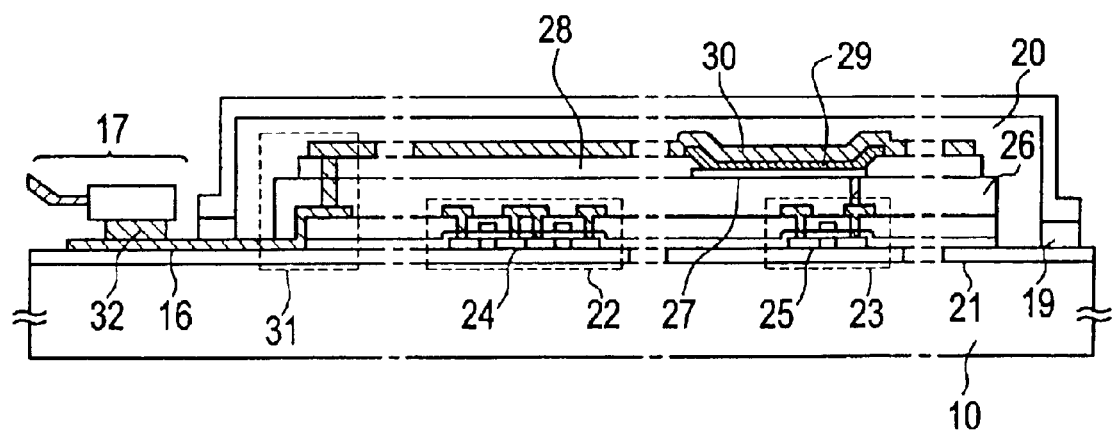

FIG. 27B is a view showing a sectional structure of the EL display panel of this embodiment. A TFT 22 for a driver circuit (here, a CMOS circuit made of a combination of an n-channel TFT and a p-channel TFT is shown) and a TFT 23 for a pixel portion (here, only a TFT for controlling a current to the EL element is shown) are formed on an underlayer film 21 of the substrate 10. As the TFT 22 for the driver circuit, the n-channel TFT or p-channel TFT shown in FIG. 2 may be used. As the TFT 23 for the pixel portion, the n-channel TFT or p-channel TFT shown in FIG. 2 may be used.

After the TFT 22 for the driver circuit and the TFT 23 for the pixel portion are completed by using the present invention, a pixel electrode 27 electrically connected to a drain of the TFT 23 for the pixel portion and made of a transparent conductive film is formed on an interlayer insulating film (flattening film) 26 made of a resin material. As the transparent conductive film, a compound (called ITO) of indium oxide and tin oxide or a compound of indium oxide and zinc oxide may be used. After the pixel electrode 27 is formed, an insulating film 28 is formed, and an opening portion is formed over the pixel electrode 27.

Next, an EL layer 29 is formed. The EL layer 29 may be made of a laminate structure by freely combining well-known EL materials (a hole injection layer, a hole transport layer, a light emitting layer, an electron transport layer or an electron injection layer) or a single-layer structure. A well-known technique may be used to determine what structure is formed. The EL material includes a low molecular material and a high molecular (polymer) material. In the case where the low molecular material is used, an evaporation method is used. In the case where the high molecular material is used, it is possible to use a simple method such as a spin coating method, a printing method or an ink jet method.

In this embodiment, the EL layer is formed by using a shadow mask and by the evaporation method. A luminescent layer (a red luminescent layer, a green luminescent layer, and a blue luminescent layer) capable of emitting light with different wavelengths is formed for every pixel by using the shadow mask, so that color display becomes possible. In addition to that, there are a system in which a color conversion layer (CCM) and a color filter are combined and a system in which a white luminescent layer and a color filter are combined, and any of the methods may be used. Of course, an EL display device of monochromatic luminescence may be made.

After the EL layer 29 is formed, a cathode 30 is formed thereon. It is desirable that moisture and oxygen existing at the interface between the cathode 30 and the EL layer 29 is removed to the utmost degree. Thus, such contrivance is necessary that the EL layer 29 and the cathode 30 are continuously formed in vacuum, or the EL layer 29 is formed in an inert gas atmosphere and the cathode 30 is formed without opening to the air. In this embodiment, a multi-chamber system (cluster tool system) film forming apparatus is used so that the foregoing film formation is made possible.

In this embodiment, a laminate structure of a LiF (lithium fluoride) film and an Al (aluminum) film is used for the cathode 30. Specifically, a LiF (lithium fluoride) film having a thickness of 1 nm is formed on the EL layer 29 by an evaporation method, and an aluminum film having a thickness of 300 nm is formed thereon. Of course, a MgAg electrode of a well-known cathode material may be used. The cathode 30 is connected to the wiring line 16 in a region designated by 31. The wiring line 16 is a power source supply line for supplying a predetermined voltage to the cathode 30, and is connected to the FPC 17 through a conductive paste material 32.

For the purpose of electrically connecting the cathode 30 with the wiring line 16 in the region 31, it is necessary to form a contact hole in the interlayer insulating film 26 and the insulating film 28. This may be formed at the time of etching of the interlayer insulating film 26 (at the time of formation of the contact hole for the pixel electrode) and at the time of etching of the insulating film 28 (at the time of formation of the opening portion prior to the formation of the EL layer). Besides, when the insulating film 28 is etched, the interlayer insulating film 26 may also be etched at the same time. In this case, if the interlayer insulating film 26 and the insulating film 28 comprise the same resin material, it is possible to make the shape of the contact hole excellent.

The wiring line 16 is electrically connected to the FPC 17 through the gap (it is filled with the adhesive 19) between the sealing material 18 and the substrate 10. Although the description has been made on the wiring line 16, the other wiring lines 14 and 15 are also electrically connected to the FPC 17 through the portion under the sealing material 18 in the same manner.

Figure 28:
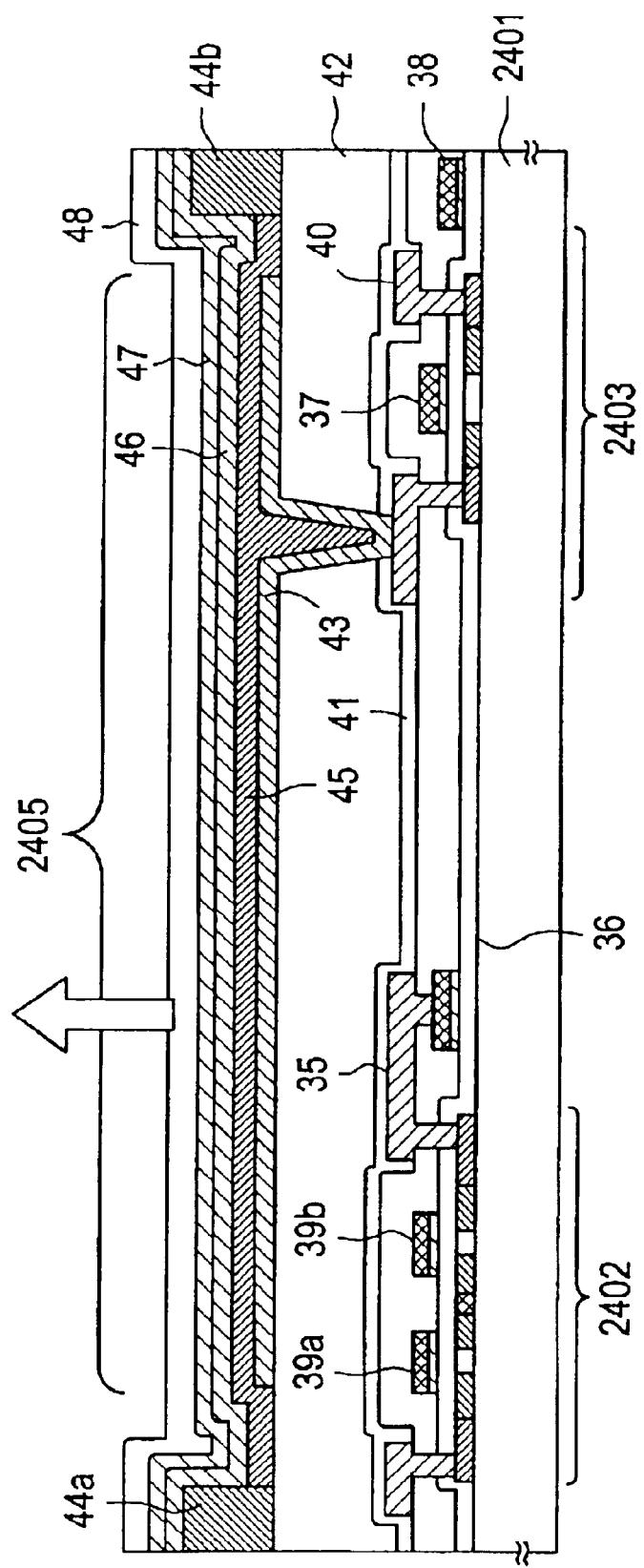
FIG. 28 is a view showing a sectional structure of a pixel portion of an EL display panel.
Figure 29A:
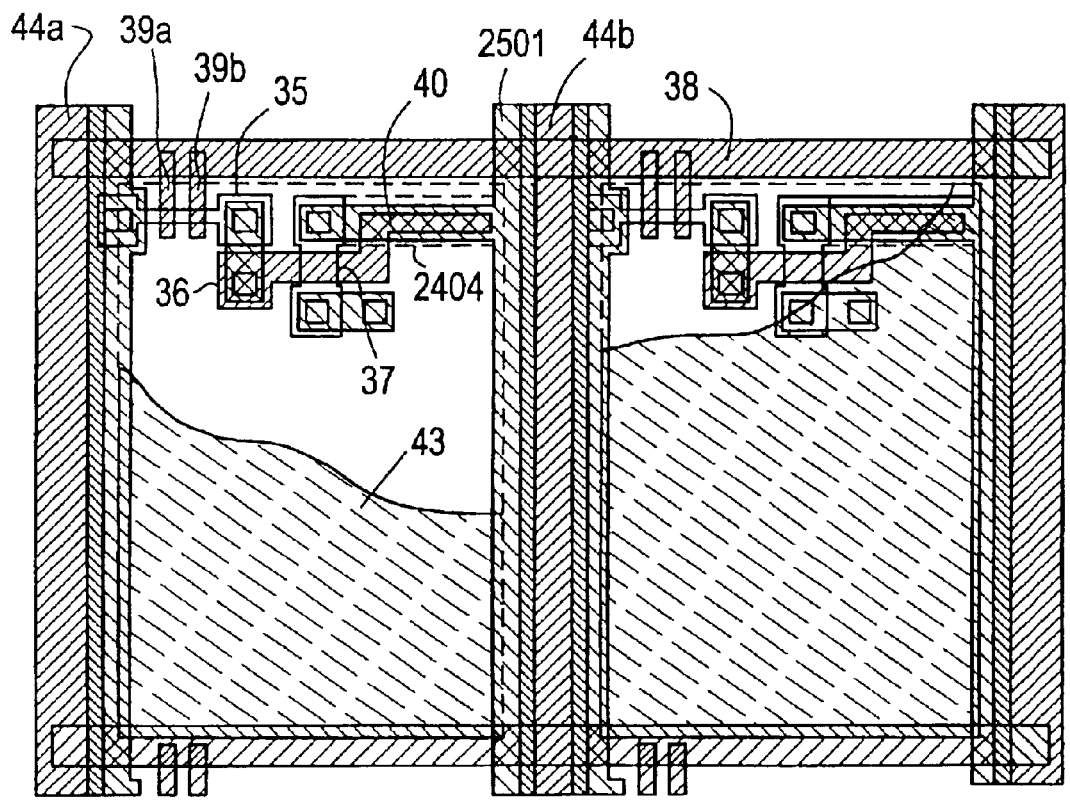
FIGS. 29A and 29B are views showing an upper structure of a pixel portion of an EL display panel and its circuit structure.
Figure 29B:
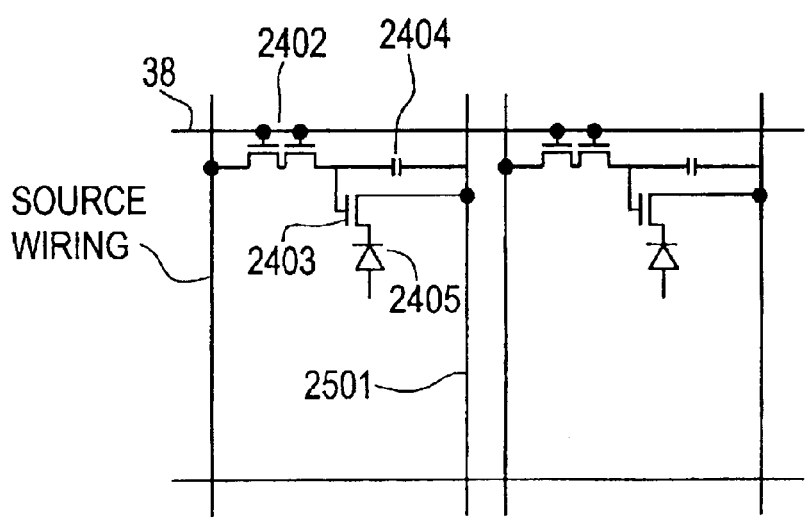

In the EL display panel having the structure as described above, the present invention can be used. Here, FIG. 28 shows a more detailed sectional structure of the pixel portion, FIG. 29A shows its upper structure, and FIG. 29B shows a circuit diagram. Since common reference characters are used in FIG. 28, FIG. 29A and FIG. 29B, they may be referred to one another.

In FIG. 28, a switching TFT 2402 provided over a substrate 2401 is formed by using an n-channel TFT of the present invention (for example, a TFT of the example 1 shown in FIG. 2). In this embodiment, although a double gate structure is adopted, since a great difference does not exist in a structure and a fabricating process, the explanation is omitted. However, by adopting the double gate structure, such a structure is obtained that two TFTs are substantially connected in series. Thus, there is a merit that an OFF current value can be reduced. Although the double gate structure is adopted in this embodiment, a single gate structure may be adopted, or a triple gate structure or a multi gate structure having more gates may be adopted. Alternatively, it is also possible to form the TFT by using a p-channel TFT of the present invention.

A current controlling TFT 2403 is formed by using an n-channel TFT of the present invention. At this time, a drain wiring line 35 of the switching TFT 2402 is electrically connected to a gate electrode 37 of the current controlling TFT through a wiring line 36. A wiring line designated by 38 is a gate wiring line for electrically connecting gate electrodes 39*a* and 39*b* of the switching TFT 2402.

At this time, it has a very important meaning that the current controlling TFT 2403 has the structure of the present invention. Since the current controlling TFT is a device for controlling the amount of current flowing through the EL element, it is also such a device that a lot of current flows and there is a high fear of deterioration by heat or deterioration by hot carriers. Thus, it is very effective to use the structure of the present invention that an LDD region is provided at a drain side of the current controlling TFT through a gate insulating film so as to overlap with a gate electrode (strictly speaking, a side wall functioning as the gate electrode).

In this embodiment, although the current controlling TFT 2403 is shown as a single gate structure, a multi gate structure in which a plurality of TFTs are connected in series may be adopted. Besides, such a structure may be adopted that a plurality of TFTs are connected in parallel so that a channel forming region is substantially divided into plural regions and radiation of heat can be carried out at high efficiency. Such a structure is effective as a countermeasure against deterioration due to heat.

As shown in FIG. 29A, a wiring line which becomes the gate electrode 37 of the current controlling TFT 2403 overlaps with a drain wiring line 40 of the current controlling TFT 2403 through an insulating film at a region designated by 2404. At this time, a capacitor is formed at the region designated by 2404. This capacitor 2404 functions as a capacitor for holding voltage applied to the gate of the current controlling TFT 2403. Incidentally, the drain wiring line 40 is connected to a current supply line (power source line) 2501 and is always applied with a constant voltage.

A first passivation film 41 is provided on the switching TFT 2402 and the current controlling TFT 2403, and a flattening film 42 made of a resin insulating film is formed thereon. It is very important that a step due to a TFT is flattened by using the flattening film 42. Since a subsequently formed EL layer is very thin, there is a case where poor luminescence occurs due to the step. Thus, it is desirable to make flattening prior to formation of a pixel electrode so that the EL layer can be formed on a surface with the utmost flatness.

Reference numeral 43 designates a pixel electrode (cathode of the EL element) made of a conductive film having high reflectivity, and is electrically connected to the drain of the current controlling TFT 2403. As the pixel electrode 43, it is preferable to use a low resistance conductive film such as an aluminum alloy film, a copper alloy film, or a silver alloy film, or a laminate film of those. Of course, a laminate structure using other conductive films may be used.

A light emitting layer 44 is formed in a groove (corresponding to a pixel) comprising banks 44*a* and 44*b* made of insulating films (preferably, resin). Although only one pixel is shown here, light emitting layers corresponding to colors of R (Red), G (Green) and B (Blue) may be separately formed. As an organic EL material which is made a light emitting layer, $\delta$ conjugated polymer material is used. As typical polymer materials, polyparaphenylene vinylene (PPV), polyvinylcarbazole (PVK), polyfluorene, and the like can be enumerated.

Although various types exist for the PPV organic EL material, for example, a material disclosed in "H. Schenk, H. Becker, O. Gelsen, E. Kluge, W. Kreuder, and H. Spreitzer, "Polymers for Light Emitting Diodes," Euro Display, Proceedings, 1999, p. 33–37," or Japanese Patent Application Laid-open No. Hei. 10-92576 may be used.

As a specific light emitting layer, it is appropriate that cyanopolyphenylene vinylene is used for a light emitting layer emitting red light, polyphenylene vinylene is used for a light emitting layer emitting green light, and polyphenylene vinylene or polyalkylene phenylene is used for a light emitting layer emitting blue light. It is appropriate that the film thickness is made 30 to 150 nm (preferably 40 to 100 nm).

However, the above embodiments are only examples of organic resin materials capable of being used for the light emitting layer, and it is not necessary to limit the invention to those. The EL layer (layer in which light emission is made and carrier movement for that is made) may be formed by freely combining a light emitting layer, a charge transport layer, and a charge injection layer.

For example, although this embodiment shows an example in which a polymer material is used for the light emitting layer, a low molecular organic EL material may be used. It is also possible to use an inorganic resin material such as silicon carbide for the charge transport layer or the charge injection layer.

In this embodiment, the EL layer is made to have such a laminate structure that a hole injection layer 46 made of PEDOT (polythiophene) or PAni (polyaniline) is provided on a light emitting layer 45. An anode 47 made of a transparent conductive layer is provided on the hole injection layer 46. In the case of this embodiment, since light produced in the light emitting layer 45 is emitted toward the upper surface side (toward a portion above the TFT), the anode must be translucent. As the transparent conductive film, although a compound of indium oxide and tin oxide or a compound of indium oxide and zinc oxide may be used, since it is formed after the light emitting layer and the hole injection layer having low heat resistance are formed, it is preferable that the transparent conductive film can be formed at the lowest possible temperature.

At the point when the anode 47 has been formed, an EL element 2405 is completed. The EL element here indicates the pixel electrode (cathode) 43, the light emitting layer 45, the hole injection layer 46 and the capacitor formed at the anode 47. As shown in FIG. 29A, since the pixel electrode 43 roughly coincides with the area of a pixel, the whole pixel functions as the EL element. Thus, a usage efficiency of light emission becomes very high, and bright image display becomes possible.

In this embodiment, a second passivation film 48 is provided on the anode 47. As the second passivation film 48, a silicon nitride film or a silicon nitride oxide film is preferable. This object is to isolate the EL element from the outside, which has both of a meaning to prevent deterioration due to oxidation of the organic resin material and a meaning to prevent degassing from the organic resin material. By this, the reliability of the EL display device can be raised.

As described above, the EL display panel of the present invention includes the pixel portion made of a pixel having the structure as shown in FIG. 28, and includes a switching TFT which has a sufficiently low OFF current value and a current controlling TFT which is strong against hot carrier injection. Thus, the EL display panel having high reliability and enabling excellent image display can be obtained.

The structure of this embodiment can be freely combined with the structure of the embodiment modes 1 to 6 and the embodiments 1 to 6. Besides, it is effective to use the EL display panel of this embodiment as a display portion of an electronic equipment of the embodiment 10.

[Embodiment 12]

Figure 30:
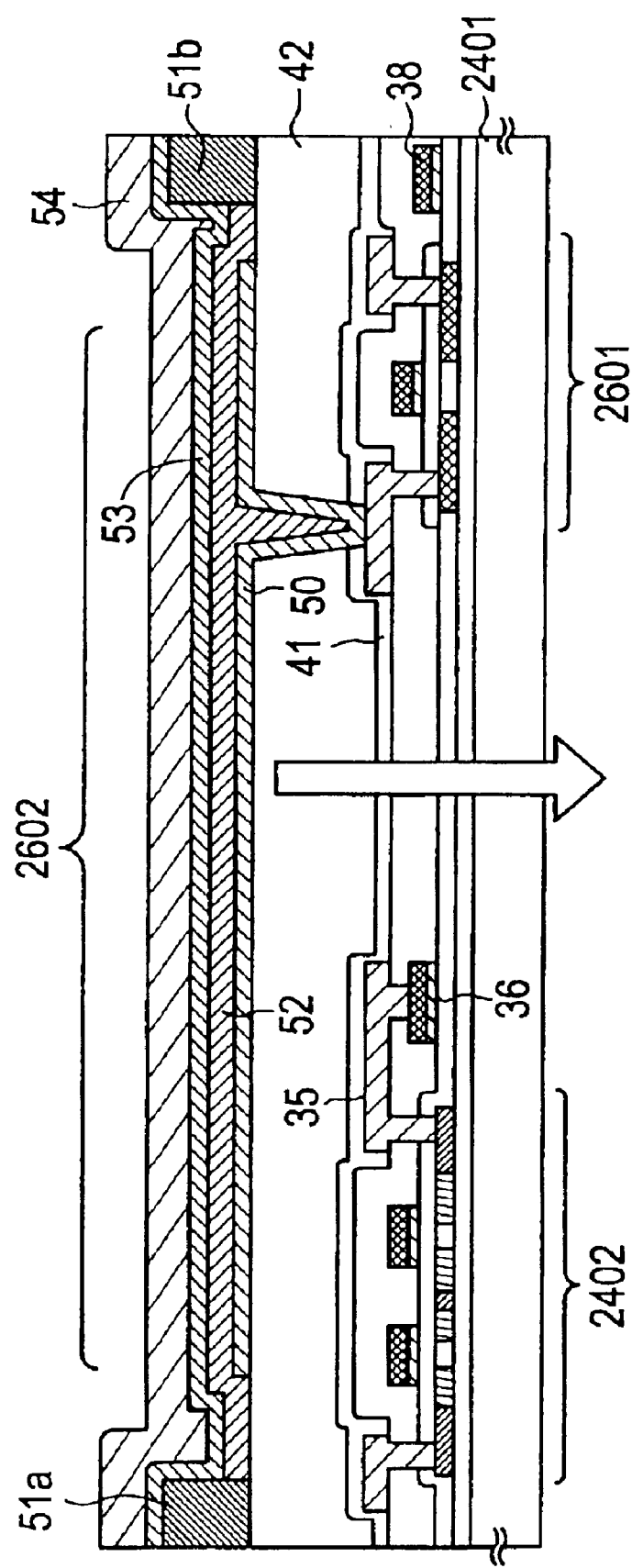
FIG. 30 is a view showing a sectional structure of an EL display panel.

In this embodiment, a description will be made on a structure in which the structure of the EL element 2405 is inverted in the pixel portion shown in the embodiment 11. FIG. 30 is used for the description. Incidentally, since different points from the structure of FIG. 29A are only a portion of an EL element and a current controlling TFT, the description of other portions is omitted.

In FIG. 30, a current controlling TFT 2601 is formed by using a p-channel TFT of the present invention. The embodiment 1 may be referred to for fabricating steps.

In this embodiment, a transparent conductive film is used as a pixel electrode (anode) 50. Specifically, a conductive film made of a compound of indium oxide and zinc oxide is used. Of course, a conductive film made of a compound of indium oxide and tin oxide may be used.

After banks 51a and 51b made of an insulating film are formed, a light emitting layer 52 made of polyvinylcarbazole is formed by application of a solution. An electron injection layer 53 made of potassium acetylacetonate (expressed by acacK) and a cathode 54 made of aluminum alloy are formed thereon. In this case, the cathode 54 functions also as a passivation film. In this way, an EL element 2602 is formed.

In the case of this embodiment, light generated in the light emitting layer 53 is emitted as indicated by an arrow toward the substrate on which TFTs are formed. In the case where the structure of this embodiment is adopted, it is preferable that the current controlling TFT 2601 comprises a p-channel TFT.

Incidentally, the structure of this embodiment can be freely combined with the structure of the embodiment modes 1 to 6 and the embodiments 1 to 6. Also, it is effective to use the EL display panel of this embodiment as a display portion of an electronic equipment of the embodiment 10.

[Embodiment 13]

In this embodiment, an example of a pixel having a structure different from the circuit diagram shown in FIG. 29B will be described with reference to FIGS. 31A to 31C. In this embodiment, 2701 designate a source wiring line of a switching TFT 2702; 2703, a gate wiring line of the switching TFT 2702; 2704, a current controlling TFT; 2705, a capacitor; 2706, 2708, current supply lines; and 2707, an EL element.

Figure 31A:
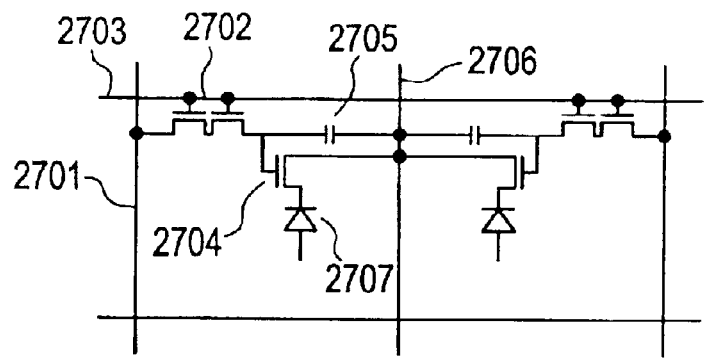
FIGS. 31A to 31C are circuit diagrams of pixel portions of EL display panels.

FIG. 31A shows an example of a case where a current supply line 2706 is common to two pixels. That is, this example is characterized in that two pixels are formed axisymmetrically with respect to the current supply line 2706. In this case, since the number of power supply lines can be reduced, the pixel portion can be further made fine.

Figure 31B:
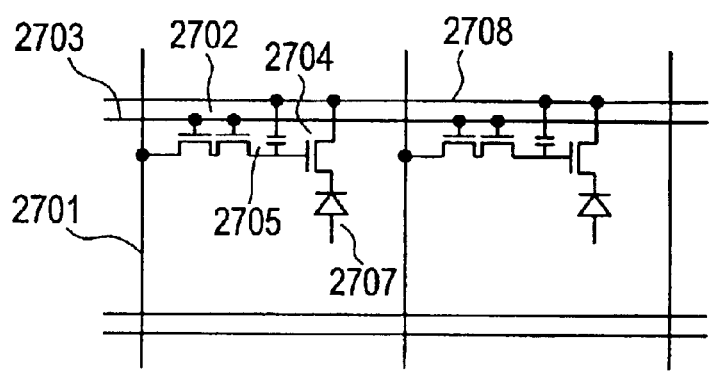

FIG. 31B shows an example of a case where a current supply line 2708 is provided in parallel with a gate wiring line 2703. Although FIG. 31B shows a structure in which the current supply line 2708 and the gate wiring line 2703 are provided so that they do not overlap with each other, if both are wiring lines formed in different layers, it is also possible to provide them so that they overlap with each other through an insulating film. In this case, since an occupied area can be made common to the power supply line 2708 and the gate wiring line 2703, the pixel portion can be made further fine.

Figure 31C:
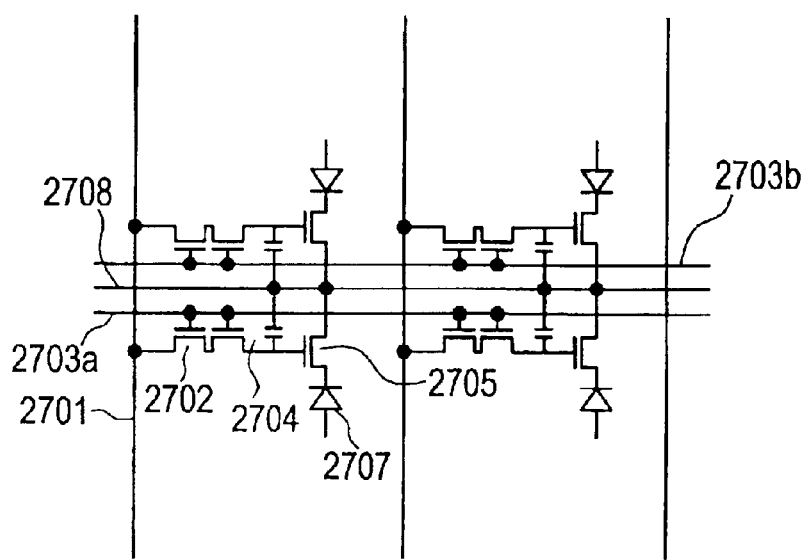

FIG. 31C shows an example characterized in that a current supply line 2708 is provided in parallel with gate wiring lines 2703 similarly to the structure of FIG. 31B, and further, two pixels are formed to become axisymmetric with respect to the current supply line 2708. It is also effective to provide the current supply line 2708 in such a manner that it overlaps with either one of the gate wiring lines 2703. In this case, since the number of power supply lines can be reduced, the pixel portion can be further fine.

The structure of this embodiment can be freely combined with the structure of the embodiment 11 or 12. It is effective to use an EL display panel having a pixel structure of this embodiment as a display portion of an electronic equipment of the embodiment 10.

[Embodiment 14]

Although the embodiment 11 shown in FIGS. 29A and 29B has such a structure that the capacitor 2404 for holding a voltage applied to the gate of the current controlling TFT 2403 is provided, the capacitor 2404 may be omitted.

In the case of the embodiment 13, since an n-channel TFT of the present invention as shown in FIG. 28 is used for the current controlling TFT 2403, it includes an LDD region provided to overlap with a gate electrode through a gate insulating film. Although a parasitic capacitance generally called gate capacitance is formed in this overlapping region, this embodiment is characterized in that this parasitic capacitance is positively used as a substitution of the capacitor 2404.

Since the capacitance of this parasitic capacitance is changed by an area where the gate electrode overlaps with the LDD region, it is determined by the length of the LDD region contained in the overlapping region.

Also in the structures of FIGS. 31A, 31B and 31C, the capacitor 2705 can be omitted similarly.

The structure of this embodiment can be freely combined with the structure of the embodiment modes 1 to 6 and the embodiments 1 to 6. It is effective to use the EL display panel having the pixel structure of this embodiment as a display portion of an electronic equipment of the embodiment 10.

[Embodiment 15]

For a liquid crystal display device shown in the embodiment 7, various liquid crystals other than a nematic liquid crystal can be used. For example, it is possible to use a liquid crystal disclosed in 1998, SID, "Characteristics and Driving Scheme of Polymer-Stabilized Monostable FLCD Exhibiting Fast Response Time and High Contrast Ratio with Gray-Scale Capability" by H. Furue et al.; 1997, SID DIGEST, 841, "A Full-Color Thresholdless Antiferroelectric LCD Exhibiting Wide Viewing Angle with Fast Response Time" by T. Yoshida et al.; 1996, J. Mater. Chem. 6(4), 671–673, "Thresholdless antiferroelectricity in liquid crystals and its application to displays" by S. Inui et al.; or U.S. Pat. No. 5,594,569.

Figure 32:
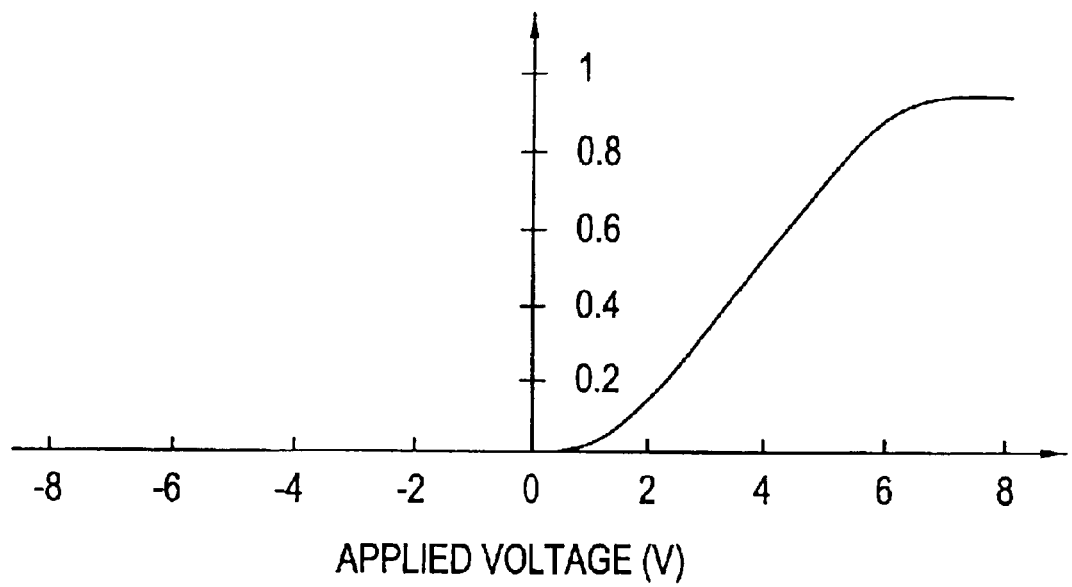
FIG. 32 is a view showing an example of light transmittance characteristics of an antiferroelectric mixed liquid crystal.

FIG. 32 shows electro-optical characteristics of single stable ferroelectric liquid crystal (FLC) in which the ferroelectric liquid crystal (FLC) exhibiting a transition series of isometric phase-cholesteric phase-chiral smectic C phase is used, transition of cholesteric phase-chiral smectic C phase is caused while applying a DC voltage, and a cone edge is made to almost coincide with a rubbing direction. A display mode by the ferroelectric liquid crystal as shown in FIG. 32 is called a "Half-V-shaped switching mode." The vertical axis of the graph shown in FIG. 32 indicates transmissivity (in an arbitrary unit) and the horizontal axis indicates applied voltage. The details of the "Half-V-shaped switching mode" is described in "Half-V-shaped switching mode FLCD" by Terada et al., Collection of Preliminary Papers for 46th Applied Physics Concerned Joint Lecture Meeting, March 1999, p. 1316, and "Time-division full-color LCD with ferroelectric liquid crystal" by Yoshihara et al., Liquid Crystal, Vol. 3, No. 3, p. 190.

As shown in FIG. 32, it is understood that when such a ferroelectric mixed liquid crystal is used, low voltage driving and gradation display becomes possible. For the liquid crystal display device of the present invention, it is also possible to use the ferroelectric liquid crystal exhibiting such electro-optical characteristics.

Also, a liquid crystal exhibiting antiferroelectricity in some temperature range is called an antiferroelectric liquid crystal (AFLC). In mixed liquid crystals including the antiferroelectric liquid crystal, there is one called a thresholdless antiferroelectric mixed liquid crystal exhibiting electro-optical response characteristics in which transmittance is continuously changed with respect to an electric field. Some thresholdless antiferroelectric mixed liquid crystal exhibits the so-called V-shaped electro-optical response characteristics, and a liquid crystal in which its driving voltage is about ±2.5 V (cell thickness is about 1 μm to 2 μm) has also been found.

In general, the thresholdless antiferroelectric mixed liquid crystal has large spontaneous polarization, and the dielectric constant of the liquid crystal itself is high. Thus, in the case where the thresholdless antiferroelectric mixed liquid crystal is used for a liquid crystal display device, it becomes necessary to provide relatively large holding capacitance for a pixel. Thus, it is preferable to use the thresholdless antiferroelectric mixed liquid crystal having small spontaneous polarization.

Since low voltage driving can be realized by using such a thresholdless antiferroelectric mixed liquid crystal for the liquid crystal display device of the present invention, low power consumption can be realized.

As described above, the present invention has the following effects.

By carrying out the present invention, it was possible to obtain a stable crystalline TFT operation. As a result, it was possible to raise reliability of a semiconductor device including a CMOS circuit fabricated with the crystalline TFT, specifically a pixel region of a liquid crystal display device and a driver circuit provided at the periphery, so that it was possible to obtain a liquid crystal display device capable of withstanding a long use.

Moreover, according to the present invention, in a second impurity region formed between a channel forming region of an n-channel TFT and a drain region, it is possible to easily control the individual lengths of a region (GOLD region) where the second impurity region overlaps with a gate electrode and a region (LDD region) not overlapping with the gate electrode. Specifically, in accordance with a driving voltage of a TFT, it is also possible to determine the respective lengths of the region (GOLD region) where the second impurity region overlaps with the gate electrode and the region (LDD region) not overlapping with the gate electrode, which enabled fabrication of TFTs corresponding to the respective driving voltages through the same step in the case where the TFT operations are made by different driving voltages in the same substrate.

Further, by causing a part of a gate wiring line and a gate bus line to have a clad structure, in a large area integrated circuit typified by an active matrix type liquid crystal display device or an image sensor, the invention was extremely effective in realization of improvement of integration of a circuit.

What is claimed is:

1. A camera having a display device comprising:
   a substrate having an insulating surface;
   a semiconductor layer formed over the substrate, the semiconductor layer having at least a channel region, source and drain regions, first impurity regions, and second impurity regions, the first and second impurity regions located between the channel region and the source and drain regions;
   a gate electrode adjacent to the semiconductor layer with a gate insulating film interposed therebetween, the gate electrode comprising a first conductive layer and a second conductive layer; and
   a gate bus line electrically connected to the gate electrode, the gate bus line comprising the first conductive layer and the second conductive layer with a third conductive layer interposed therebetween,
   wherein the second impurity regions overlap with the gate electrode and the first impurity regions do not overlap with the gate electrode.

2. A camera according to claim 1, wherein the first conductive layer and the second conductive layer comprise at least one element selected from the group consisting of titanium, tantalum, tungsten, molybdenum, and a compound containing the element as its main ingredient, respectively.

3. A camera according to claim 1, wherein the third conductive layer comprises at least one element selected from the group consisting of aluminum, copper, and a compound containing the element as its main ingredient.

4. A camera according to claim 1, wherein the display device is a liquid crystal display device.

5. A camera according to claim 1, the display device is an electro luminescence display device.

6. A camera according to claim 1, wherein the camera comprises an image sensor.

7. A camera having a display device having a pixel region comprising at least one n-channel thin film transistor, the display device comprising:
   a substrate having an insulating surface;
   a semiconductor layer formed over the substrate, the semiconductor layer having at least a channel region, source and drain regions, first impurity regions, and second impurity regions, the first and second impurity regions located between the channel region and the source and drain regions;

a gate electrode adjacent to the semiconductor layer with a gate insulating film interposed therebetween, the gate electrode comprising a first conductive layer and a second conductive layer; and a gate bus line electrically connected to the gate electrode, the gate bus line comprising the first conductive layer and the second conductive layer with a third conductive layer interposed therebetween, wherein the second impurity regions overlap with the gate electrode and the first impurity regions do not overlap with the gate electrode.

8. A camera according to claim 7, wherein the first conductive layer and the second conductive layer comprise at least one element selected from the group consisting of titanium, tantalum, tungsten, molybdenum, and a compound containing the element as its main ingredient, respectively.

9. A camera according to claim 7, wherein the third conductive layer comprises at least one element selected from the group consisting of aluminum, copper, and a compound containing the element as its main ingredient.

10. A camera according to claim 7, wherein the display device comprises a liquid crystal display device.

11. A camera according to claim 7, wherein the display device comprises an electro luminescence display device.

12. A camera according to claim 7, wherein the camera comprises an image sensor.

13. A camera having a display device having a CMOS circuit comprising an n-channel thin film transistor and a p-channel thin film transistor, comprising:

a substrate having an insulating surface;

semiconductor layers formed over the substrate, each of the semiconductor layers having at least a channel region, and source and drain regions;

gate electrodes adjacent to the semiconductor layers with a gate insulating film interposed therebetween respectively, each of the gate electrodes comprising a first conductive layer and a second conductive layer; and a gate bus line electrically connected to the gate electrodes, the gate bus line comprising the first conductive layer and the second conductive layer with a third conductive layer interposed therebetween, wherein the semiconductor layer of the n-channel thin film transistor further comprises first impurity regions and second impurity regions located between the channel region and the source and drain regions, and wherein in the n-channel thin film transistor, the second impurity regions overlap with the gate electrode and the first impurity regions do not overlap with the gate electrode.

14. A camera according to claim 13, wherein in the p-channel thin film transistor, edges of the gate electrode are aligned with ends of the channel region.

15. A camera according to claim 13, wherein in the p-channel thin film transistor, the gate electrode overlaps portions of the source and drain regions.

16. A camera according to claim 13, wherein the source an drain regions of both the n-channel thin film transistor and the p-channel thin film transistor includes phosphorus.

17. A camera according to claim 13, wherein the first conductive layer and the second conductive layer comprise at least one element selected from the group consisting of titanium, tantalum, tungsten, molybdenum, and a compound containing the element as its main ingredient, respectively.

18. A camera according to claim 13, wherein the third conductive layer comprises at least one element selected from the group consisting of aluminum, copper, and a compound containing the element as its main ingredient.

19. A camera according to claim 13, wherein the display device is a liquid crystal display device.

20. A camera according to claim 13, wherein the display device is an electro luminescence display device.

21. A camera according to claim 13, wherein the camera comprises an image sensor.

22. A camera having a display device having a pixel region having an n-channel thin film transistor and a CMOS circuit having an n-channel thin film transistor and a p-channel thin film transistor, comprising:

a substrate having an insulating surface;

semiconductor layers formed over the substrate, each of the semiconductor layers having at least a channel region, and source and drain regions;

gate electrodes adjacent to the semiconductor layers with a gate insulating film interposed therebetween respectively, each of the gate electrodes comprising a first conductive layer and a second conductive layer; and a gate bus line electrically connected to the gate electrodes, the gate bus line comprising the first conductive layer and the second conductive layer with a third conductive layer interposed therebetween, wherein each of the semiconductor layers of the n-channel thin film transistors further comprises first impurity regions and second impurity regions located between the channel region and the source and drain regions, and wherein in each of the n-channel thin film transistors, the second impurity regions overlap with the gate electrode and the first impurity regions do not overlap with the gate electrode.

23. A camera according to claim 22, wherein in the p-channel thin film transistor, edges of the gate electrode are aligned with ends of the channel region.

24. A camera according to claim 22, wherein in the p-channel thin film transistor, the gate electrode overlaps portions of the source and drain regions.

25. A camera according to claim 22, wherein the source and drain regions of the n-channel and the p-channel thin film transistors include phosphorus.

26. A camera according to claim 22, wherein the first conductive layer and the second conductive layer comprise at least one element selected from the group consisting of titanium, tantalum, tungsten, molybdenum, and a compound containing the element as its main ingredient, respectively.

27. A camera according to claim 22, wherein the third conductive layer comprises at least one element selected from the group consisting of aluminum copper, and a compound containing the element as its main ingredient.

28. A camera according to claim 22, wherein the display device is a liquid crystal display device.

29. A camera according to claim 22, wherein the display device is an electro luminescence display device.

30. A camera according to claim 22, wherein the camera comprises an image sensor.

31. A camera having a display device comprising:

a substrate having an insulating surface;

at least one semiconductor layer formed over the substrate, the semiconductor layer having a plurality of channel regions, source and drain regions, first impurity regions, and second impurity regions, the first and second impurity regions located between the source and drain regions;

a plurality of gate electrodes adjacent to the semiconductor layer with a gate insulating film interposed therebetween, the gate electrodes comprising a first conductive layer and a second conductive layer; and a gate bus line electrically connected to the gate electrodes, the gate bus line comprising the first conductive layer and the second conductive layer with a third conductive layer interposed therebetween, wherein the second impurity regions overlap with the gate electrodes and the first impurity regions do not overlap with the gate electrodes in the semiconductor layer.

32. A camera according to claim 31, wherein the first conductive layer and the second conductive layer comprise at least one element selected from the group consisting of titanium, tantalum, tungsten, molybdenum, and a compound containing the element as its main ingredient, respectively.

33. A camera according to claim 31, wherein the third conductive layer comprises at least one element selected from the group consisting of aluminum, copper, and a compound containing the element as its main ingredient.

34. A camera according to claim 31, wherein the display device is a liquid crystal display device.

35. A camera according to claim 31, wherein the display device is an electro luminescence display device.

36. A camera according to claim 31, wherein the camera comprises an image sensor.

37. A cellular phone having a display device comprising:

a substrate having an insulating surface;

a semiconductor layer formed over the substrate, the semiconductor layer having at least a channel region, source and drain regions, first impurity regions, and second impurity regions, the first and second impurity regions located between the channel region and the source and drain regions;

a gate electrode adjacent to the semiconductor layer with a gate insulating film interposed therebetween, the gate electrode comprising a first conductive layer and a second conductive layer; and a gate bus line electrically connected to the gate electrode, the gate bus line comprising the first conductive layer and the second conductive layer with a third conductive layer interposed therebetween, wherein the second impurity regions overlap with the gate electrode and the first impurity regions do not overlap with the gate electrode.

38. A cellular phone according to claim 37, wherein the first conductive layer and the second conductive layer comprise at least one element selected from the group consisting of titanium, tantalum, tungsten, molybdenum, and a compound containing the element as its main ingredient, respectively.

39. A cellular phone according to claim 37, wherein the third conductive layer comprises at least one element selected from the group consisting of aluminum, copper, and a compound containing the element as its main ingredient.

40. A cellular phone according to claim 37, wherein the display device is a liquid crystal display device.

41. A cellular phone according to claim 37, wherein the display device is an electro luminescence display device.

42. A cellular phone according to claim 37 wherein the cellular phone comprises an image sensor.

43. A cellular phone having a display device having a pixel region comprising at feast one n-channel thin film transistor, the display device comprising:

a substrate having an insulating surface;

a semiconductor layer formed over the substrate, the semiconductor layer having at least a channel region, source and drain regions, first impurity regions, and second impurity regions, the first and second impurity regions located between the channel region and the source and drain regions;

a gate electrode adjacent to the semiconductor layer with a gate insulating film interposed therebetween, the gate electrode comprising a first conductive layer and a second conductive layer; and a gate bus line electrically connected to the gate electrode, the gate bus line comprising the first conductive layer and the second conductive layer with a third conductive layer interposed therebetween, wherein the second impurity regions overlap with the gate electrode and the first impurity regions do not overlap with the gate electrode.

44. A cellular phone according to claim 43, wherein the first conductive layer and the second conductive layer comprise at least one element selected from the group consisting of titanium, tantalum, tungsten, molybdenum, and a compound containing the element as its main ingredient, respectively.

45. A cellular phone according to claim 43, wherein the third conductive layer comprises at least one element selected from the group consisting of aluminum, copper, and a compound containing the element as its main ingredient.

46. A cellular phone according to claim 43, wherein the display device comprises a liquid crystal display device.

47. A cellular phone according to claim 43, wherein the display device comprises an electro luminescence display device.

48. A cellular phone according to claim 43, wherein the cellular phone comprises an image sensor.

49. A cellular phone having a display device having a CMOS circuit comprising an n-channel thin film transistor and a p-channel thin film transistor, comprising:

a substrate having an insulating surface;

semiconductor layers formed over the substrate, each of the semiconductor layers having at least a channel region, and source and drain regions;

gate electrodes adjacent to the semiconductor layers with a gate insulating film interposed therebetween respectively, each of the gate electrodes comprising a first conductive layer and a second conductive layer; and a gate bus line electrically connected to the gate electrodes, the gate bus line comprising the first conductive layer and the second conductive layer with a third conductive layer interposed therebetween, wherein the semiconductor layer of the n-channel thin film transistor further comprises first impurity regions and second impurity regions located between the channel region and the source and drain regions, and wherein in the n-channel thin film transistor, the second impurity regions overlap with the gate electrode and the first impurity regions do not overlap with the gate electrode.

50. A cellular phone according to claim 49, wherein in the p-channel thin film transistor, edges of the gate electrode are aligned with ends of the channel region.

51. A cellular phone according to claim 49, wherein in the p-channel thin film transistor, the gate electrode overlaps portions of the source and drain regions.

52. A cellular phone according to claim 49, wherein the source and drain regions of both the n-channel thin film transistor and the p-channel thin film transistor include phosphorus.

53. A cellular phone according to claim 49, wherein the first conductive layer and the second conductive layer comprise at least one element selected from the group consisting of titanium, tantalum, tungsten, molybdenum, and a compound containing the element as its main ingredient, respectively.

54. A cellular phone according to claim 49, wherein the third conductive layer comprises at least one element selected from the group consisting of aluminum, copper, and a compound containing the element as its main ingredient.

55. A cellular phone according to claim 49, wherein the display device is a liquid crystal display device.

56. A cellular phone according to claim 49, wherein the display device is an electro luminescence display device.

57. A cellular phone according to claim 49, wherein the cellular phone comprises an image sensor.

58. A cellular phone having a display device having a pixel region having an n-channel thin film transistor and a CMOS circuit having an n-channel thin film transistor and a p-channel thin film transistor, comprising:
a substrate having an insulating surface;
semiconductor layers formed over the substrate, each of the semiconductor layers having at least a channel region, and source and drain regions;
gate electrodes adjacent to the semiconductor layers with a gate insulating film interposed therebetween respectively, each of the gate electrodes comprising a first conductive layer and a second conductive layer; and
a gate bus line electrically connected to the gate electrodes, the gate bus line comprising the first conductive layer and the second conductive layer with a third conductive layer interposed therebetween,
wherein each of the semiconductor layers of the n-channel thin film transistors further comprises first impurity regions and second impurity regions located between the channel region and the source and drain regions, and
wherein in each of the n-channel thin film transistors, the second impurity regions overlap with the gate electrode and the first impurity regions do not overlap with the gate electrode.

59. A cellular phone according to claim 58, wherein in the p-channel thin film transistor, edges of the gate electrode are aligned with ends of the channel region.

60. A cellular phone according to claim 58, wherein in the p-channel thin film transistor, the gate electrode overlaps portions of the source and drain regions.

61. A cellular phone according to claim 58, wherein the source and drain regions of the n-channel and the p-channel thin film transistors include phosphorus.

62. A cellular phone according to claim 58, wherein the first conductive layer and the second conductive layer comprise at least one element selected from the group consisting of titanium, tantalum, tungsten, molybdenum, and a compound containing the element as its main ingredient, respectively.

63. A cellular phone according to claim 58, wherein the third conductive layer comprises at least one element selected from the group consisting of aluminum, copper, and a compound containing the element as its main ingredient.

64. A cellular phone according to claim 58, wherein the display device is a liquid crystal display device.

65. A cellular phone according to claim 58, wherein the display device is an electro luminescence display device.

66. A cellular phone according to claim 58, wherein the cellular phone comprises an image sensor.

67. A cellular phone having a display device comprising:
a substrate having an insulating surface;
at least one semiconductor layer formed over the substrate, the semiconductor layer having a plurality of channel regions, source and drain regions first impurity regions, and second impurity regions, the first and second impurity regions located between the source and drain regions;
a plurality of gate electrodes adjacent to the semiconductor layer with a gate insulating film interposed therebetween, the gate electrodes comprising a first conductive layer and a second conductive layer; and
a gate bus line electrically connected to the gate electrodes, the gate bus line comprising the first conductive layer and the second conductive layer with a third conductive layer interposed therebetween,
wherein the second impurity regions overlap with the gate electrodes and the first impurity regions do not overlap with the gate electrodes in the semiconductor layer.

68. A cellular phone according to claim 67, wherein the first conductive layer and the second conductive layer comprise at least one element selected from the group consisting of titanium, tantalum, tungsten, molybdenum, and a compound containing the element as its main ingredient, respectively.

69. A cellular phone according to claim 67, wherein the third conductive layer comprises at least one element selected from the group consisting of aluminum, copper, and a compound containing the element as its main ingredient.

70. A cellular phone according to claim 67, wherein the display device is a liquid crystal display device.

71. A cellular phone according to claim 67, wherein the display device is an electro luminescence display device.

72. A cellular phone according to claim 67, wherein the cellular phone comprises an image sensor.

73. A portable information terminal having a display device comprising:
a substrate having an insulating surface;
a semiconductor layer formed over the substrate, the semiconductor layer having at least a channel region, source and drain regions, first impurity regions, and second impurity regions, the first and second impurity regions located between the channel region and the source and drain regions;
a gate electrode adjacent to the semiconductor layer with a gate insulating film interposed therebetween, the gate electrode comprising a first conductive layer and a second conductive layer; and
a gate bus line electrically connected to the gate electrode, the gate bus line comprising the first conductive layer and the second conductive layer with a third conductive layer interposed therebetween,
wherein the second impurity regions overlap with the gate electrode and the first impurity regions do not overlap with the gate electrode.

74. A portable information terminal according to claim 73, wherein the first conductive layer and the second conductive layer comprise at least one element selected from the group consisting of titanium, tantalum, tungsten, molybdenum, and a compound containing the element as its main ingredient, respectively.

75. A portable information terminal according to claim 73, wherein the third conductive layer comprises at least one element selected from the group consisting of aluminum, copper, and a compound containing the element as its main ingredient.

76. A portable information terminal according to claim 73, wherein the display device is a liquid crystal display device.

77. A portable information terminal according to claim 73, wherein the display device is an electro luminescence display device.

78. A portable information terminal according to claim 73, wherein the portable information terminal comprises an image sensor.

79. A portable information terminal having a display device having a pixel region comprising at least one n-channel thin film transistor, the display device comprising:
a substrate having an insulating surface;
a semiconductor layer formed over the substrate, the semiconductor layer having at least a channel region, source and drain regions, first impurity regions, and second impurity regions, the first and second impurity regions located between the channel region and the source and drain regions;
a gate electrode adjacent to the semiconductor layer with a gate insulating film interposed therebetween, the gate electrode comprising a first conductive layer and a second conductive layer; and
a gate bus line electrically connected to the gate electrode, the gate bus line comprising the first conductive layer and the second conductive layer with a third conductive layer interposed therebetween,
wherein the second impurity regions overlap with the gate electrode and the first impurity regions do not overlap with the gate electrode.

80. A portable information terminal according to claim 79, wherein the first conductive layer and the second conductive layer comprise at least one element selected from the group consisting of titanium, tantalum, tungsten, molybdenum, and a compound containing the element as its main ingredient, respectively.

81. A portable information terminal according to claim 79, wherein the third conductive layer comprises at least one element selected from the group consisting of aluminum, copper, and a compound containing the element as its main ingredient.

82. A portable information terminal according to claim 79, wherein the display device comprises a liquid crystal display device.

83. A portable information terminal according to claim 79, wherein the display device comprises an electro luminescence display device.

84. A portable information terminal according to claim 79, wherein the portable information terminal comprises an image sensor.

85. A portable information terminal having a display device having a CMOS circuit comprising an n-channel thin film transistor and a p-channel thin film transistor, comprising:
a substrate having an insulating surface;
semiconductor layers formed over the substrate, each of the semiconductor layers having at least a channel region, and source and drain regions;
gate electrodes adjacent to the semiconductor layers with a gate insulating film interposed therebetween respectively, each of the gate electrodes comprising a first conductive layer and a second conductive layer; and
a gate bus line electrically connected to the gate electrodes, the gate bus line comprising the first conductive layer and the second conductive layer with a third conductive layer interposed therebetween,
wherein the semiconductor layer of the n-channel thin film transistor further comprises first impurity regions and second impurity regions located between the channel region and the source and drain regions, and
wherein in the n-channel thin film transistor, the second impurity regions overlap with the gate electrode and the first impurity regions do not overlap with the gate electrode.

86. A portable information terminal according to claim 85, wherein in the p-channel thin film transistor, edges of the gate electrode are aligned with ends of the channel region.

87. A portable information terminal according to claim 85, wherein in the p-channel thin film transistor, the gate electrode overlaps portions of the source and drain regions.

88. A portable information terminal according to claim 85, wherein the source and drain regions of both the n-channel thin film transistor and the p-channel thin film transistor include phosphorus.

89. A portable information terminal according to claim 85, wherein the first conductive layer and the second conductive layer comprise at least one element selected from the group consisting of titanium, tantalum, tungsten, molybdenum, and a compound containing the element as its main ingredient, respectively.

90. A portable information terminal according to claim 85, wherein the third conductive layer comprises at least one element selected from the group consisting of aluminum, copper, and a compound containing the element as its main ingredient.

91. A portable information terminal according to claim 85, wherein the display device is a liquid crystal display device.

92. A portable information terminal according to claim 85, wherein the display device is an electro luminescence display device.

93. A portable information terminal according to claim 85, wherein the portable information terminal comprises an image sensor.

94. A portable information terminal having a display device having a pixel region having an n-channel thin film transistor and a CMOS circuit having an n-channel thin film transistor and a p-channel thin film transistor, comprising:
a substrate having an insulating surface;
semiconductor layers formed over the substrate, each of the semiconductor layers having at least a channel region, and source and drain regions;
gate electrodes adjacent to the semiconductor layers with a gate insulating film interposed therebetween respectively, each of the gate electrodes comprising a first conductive layer and a second conductive layer; and
a gate bus line electrically connected to the gate electrodes, the gate bus line comprising the first conductive layer and the second conductive layer with a third conductive layer interposed therebetween,
wherein each of the semiconductor layers of the n-channel thin film transistors further comprises first impurity regions and second impurity regions located between the channel region and the source and drain regions, and
wherein in each of the n-channel thin film transistors, the second impurity regions overlap with the gate electrode and the first impurity regions do not overlap with the gate electrode.

95. A portable information terminal according to claim 94, wherein in the p-channel thin film transistor, edges of the gate electrode are aligned with ends of the channel region.

96. A portable information terminal according to claim 94, wherein in the p-channel thin film transistor, the gate electrode overlaps portions of the source and drain regions.

97. A portable information terminal according to claim 94, wherein the source and drain regions of the n-channel and the p-channel thin film transistors include phosphorus.

98. A portable information terminal according to claim 94, wherein the first conductive layer and the second conductive layer comprise at least one element selected from the group consisting of titanium, tantalum, tungsten, molybdenum, and a compound containing the element as its main ingredient, respectively.

99. A portable information terminal according to claim 94, wherein the third conductive layer comprises at least one element selected from the group consisting of aluminum, copper, and a compound containing the element as its main ingredient.

100. A portable information terminal according to claim 94, wherein the display device is a liquid crystal display device.

101. A portable information terminal according to claim 94, wherein the display device is an electro luminescence display device.

102. A portable information terminal according to claim 94, wherein the portable information terminal comprises an image sensor.

103. A portable information terminal having a display device comprising:
   a substrate having an insulating surface;
   at least one semiconductor layer formed over the substrate, the semiconductor layer having a plurality of channel regions, source and drain regions, first impurity regions, and second impurity regions, the first and second impurity regions located between the source and drain regions;
   a plurality of gate electrodes adjacent to the semiconductor layer with a gate insulating film interposed therebetween, the gate electrodes comprising a first conductive layer and a second conductive layer; and
   a gate bus line electrically connected to the gate electrodes, the gate bus line comprising the first conductive layer and the second conductive layer with a third conductive layer interposed therebetween,
   wherein the second impurity regions overlap with the gate electrodes and the first impurity regions do not overlap with the gate electrodes in the semiconductor layer.

104. A portable information terminal according to claim 103, wherein the first conductive layer and the second conductive layer comprise at least one element selected from the group consisting of titanium, tantalum, tungsten, molybdenum, and a compound containing the element as its main ingredient, respectively.

105. A portable information terminal according to claim 103, wherein the third conductive layer comprises at least one element selected from the group consisting of aluminum, copper, and a compound containing the element as its main ingredient.

106. A portable information terminal according to claim 103, wherein the display device is a liquid crystal display device.

107. A portable information terminal according to claim 103, wherein the display device is an electro luminescence display device.

108. A portable information terminal according to claim 103, wherein the portable information terminal comprises an image sensor.

109. A personal computer having a display device comprising:
   a substrate having an insulating surface;
   a semiconductor layer formed over the substrate, the semiconductor layer having at least a channel region, source and drain regions, first impurity regions, and second impurity regions, the first and second impurity regions located between the channel region and the source and drain regions;
   a gate electrode adjacent to the semiconductor layer with a gate insulating film interposed therebetween, the gate electrode comprising a first conductive layer and a second conductive layer; and
   a gate bus line electrically connected to the gate electrode, the gate bus line comprising the first conductive layer and the second conductive layer with a third conductive layer interposed therebetween,
   wherein the second impurity regions overlap with the gate electrode and the first impurity regions do not overlap with the gate electrode.

110. A personal computer according to claim 109, wherein the first conductive layer and the second conductive layer comprise at least one element selected from the group consisting of titanium, tantalum, tungsten, molybdenum, and a compound containing the element as its main ingredient, respectively.

111. A personal computer according to claim 109, wherein the third conductive layer comprises at least one element selected from the group consisting of aluminum, copper, and a compound containing the element as its main ingredient.

112. A personal computer according to claim 109, wherein the display device is a liquid crystal display device.

113. A personal computer according to claim 109, wherein the display device is an electro luminescence display device.

114. A personal computer according to claim 109, wherein the personal computer comprises an image sensor.

115. A personal computer having a display device having a pixel region comprising at least one n-channel thin film transistor, the display device comprising:
   a substrate having an insulating surface;
   a semiconductor layer formed over the substrate, the semiconductor layer having at least a channel region, source and drain regions, first impurity regions, and second impurity regions, the first and second impurity regions located between the channel region and the source and drain regions;
   a gate electrode adjacent to the semiconductor layer with a gate insulating film interposed therebetween, the gate electrode comprising a first conductive layer and a second conductive layer; and
   a gate bus line electrically connected to the gate electrode, the gate bus line comprising the first conductive layer and the second conductive layer with a third conductive layer interposed therebetween,
   wherein the second impurity regions overlap with the gate electrode and the first impurity regions do not overlap with the gate electrode.

116. A personal computer according to claim 115, wherein the first conductive layer and the second conductive layer comprise at least one element selected from the group consisting of titanium, tantalum, tungsten, molybdenum, and a compound containing the element as its main ingredient, respectively.

117. A personal computer according to claim 115, wherein the third conductive layer comprises at least one element selected from the group consisting of aluminum, copper, and a compound containing the element as its main ingredient.

118. A personal computer according to claim 115, wherein the display device comprises a liquid crystal display device.

119. A personal computer according to claim 115, wherein the display device comprises an electro luminescence display device.

120. A personal computer according to claim 115, wherein the personal computer comprises an image sensor.

121. A personal computer having a display device having a CMOS circuit comprising an n-channel thin film transistor and a p-channel thin film transistor, comprising:
- a substrate having an insulating surface;
- semiconductor layers formed over the substrate, each of the semiconductor layers having at least a channel region, and source and drain regions;
- gate electrodes adjacent to the semiconductor layers with a gate insulating film interposed therebetween respectively, each of the gate electrodes comprising a first conductive layer and a second conductive layer; and
- a gate bus line electrically connected to the gate electrodes, the gate bus line comprising the first conductive layer and the second conductive layer with a third conductive layer interposed therebetween,
- wherein the semiconductor layer of the n-channel thin film transistor further comprises first impurity regions and second impurity regions located between the channel region and the source and drain regions, and
- wherein in the n-channel thin film transistor, the second impurity regions overlap with the gate electrode and the first impurity regions do not overlap with the gate electrode.

122. A personal computer according to claim 121, wherein in the p-channel thin film transistor, edges of the gate electrode are aligned with ends of the channel region.

123. A personal computer according to claim 121, wherein in the p-channel thin film transistor, the gate electrode overlaps portions of the source and drain regions.

124. A personal computer according to claim 121, wherein the source and drain regions of both the n-channel thin film transistor and the p-channel thin film transistor include phosphorus.

125. A personal computer according to claim 121, wherein the first conductive layer and the second conductive layer comprise at least one element selected from the group consisting of titanium, tantalum, tungsten, molybdenum, and a compound containing the element as its main ingredient, respectively.

126. A personal computer according to claim 121, wherein the third conductive layer comprises at least one element selected from the group consisting of aluminum, copper, and a compound containing the element as its main ingredient.

127. A personal computer according to claim 121, wherein the display device is a liquid crystal display device.

128. A personal computer according to claim 121, wherein the display device is an electro luminescence display device.

129. A personal computer according to claim 121, wherein the personal computer comprises an image sensor.

130. A personal computer having a display device having a pixel region having an n-channel thin film transistor and a CMOS circuit having an n-channel thin film transistor and a p-channel thin film transistor, comprising:
- a substrate having an insulating surface;
- semiconductor layers formed over the substrate, each of the semiconductor layers having at least a channel region, and source and drain regions;
- gate electrodes adjacent to the semiconductor layers with a gate insulating film interposed therebetween respectively, each of the gate electrodes comprising a first conductive layer and a second conductive layer; and
- a gate bus line electrically connected to the gate electrodes, the gate bus line comprising the first conductive layer and the second conductive layer with a third conductive layer interposed therebetween,
- wherein each of the semiconductor layers of the n-channel thin film transistors further comprises first impurity regions and second impurity regions located between the channel region and the source and drain regions, and
- wherein in each of the n-channel thin film transistors, the second impurity regions overlap with the gate electrode and the first impurity regions do not overlap with the gate electrode.

131. A personal computer according to claim 130, wherein in the p-channel thin film transistor, edges of the gate electrode are aligned with ends of the channel region.

132. A personal computer according to claim 130, wherein in the p-channel thin film transistor, the gate electrode overlaps portions of the source and drain regions.

133. A personal computer according to claim 130, wherein the source and drain regions of the n-channel and the p-channel thin film transistors include phosphorus.

134. A personal computer according to claim 130, wherein the first conductive layer and the second conductive layer comprise at least one element selected from the group consisting of titanium, tantalum, tungsten, molybdenum, and a compound containing the element as its main ingredient, respectively.

135. A personal computer according to claim 130, wherein the third conductive layer comprises at least one element selected from the group consisting of aluminum, copper, and a compound containing the element as its main ingredient.

136. A personal computer according to claim 130, wherein the display device is a liquid crystal display device.

137. A personal computer according to claim 130, wherein the display device is an electro luminescence display device.

138. A personal computer according to claim 130, wherein the personal computer comprises an image sensor.

139. A personal computer having a display device comprising:
- a substrate having an insulating surface;
- at least one semiconductor layer formed over the substrate, the semiconductor layer having a plurality of channel regions, source and drain regions, first impurity regions, and second impurity regions, the first and second impurity regions located between the source and drain regions;
- a plurality of gate electrodes adjacent to the semiconductor layer with a gate insulating film interposed therebetween, the gate electrodes comprising a first conductive layer and a second conductive layer; and
- a gate bus line electrically connected to the gate electrodes, the gate bus line comprising the first conductive layer and the second conductive layer with a third conductive layer interposed therebetween, wherein the second impurity regions overlap with the gate electrodes and the first impurity regions do not overlap with the gate electrodes in the semiconductor layer.

140. A personal computer according to claim 139, wherein the first conductive layer and the second conductive layer comprise at least one element selected from the group consisting of titanium, tantalum, tungsten, molybdenum, and a compound containing the element as its main ingredient, respectively.

141. A personal computer according to claim 139, wherein the third conductive layer comprises at least one element selected from the group consisting of aluminum, copper, and a compound containing the element as its main ingredient.

142. A personal computer according to claim 139, wherein the display device is a liquid crystal display device.

143. A personal computer according to claim 139, wherein the display device is an electro luminescence display device.

144. A personal computer according to claim 139, wherein the personal computer comprises an image sensor.

* * * * *

UNITED STATES PATENT AND TRADEMARK OFFICE
CERTIFICATE OF CORRECTION

| | |
|---|---|
| PATENT NO. | : 6,891,195 B2 |
| APPLICATION NO. | : 10/207822 |
| DATED | : May 10, 2005 |
| INVENTOR(S) | : Shunpei Yamazaki et al. |

Page 1 of 1

It is certified that error appears in the above-identified patent and that said Letters Patent is hereby corrected as shown below:

In the Specifications

At column 2, line 59, "10 Ù" should be -- 10 Ω --;

At column 17, line 60, "á" should be -- α --;

At column 17, line 60, "μÙcm" should be -- μΩcm --;

At column 17, line 62, "â" should be -- α --;

At column 17, line 62, "μÙcm" should be -- μΩcm --;

At column 17, line 64, "á" should be -- α --;

At column 17, line 65, "á" should be -- α --;

At column 18, line 13, "μÙcm" should be -- μΩcm --;

At column 18, lines 20-21, "μÙcm" should be -- μΩcm --;

At column 18, line 29, "μÙcm" should be -- μΩcm --;

At column 19, line 50, "CU" should be -- Cu --;

At column 32, line 16, " ð conjugated" should be -- π conjugated --.

Signed and Sealed this
Twentieth Day of May, 2014

Michelle K. Lee
*Deputy Director of the United States Patent and Trademark Office*